(12) United States Patent
Shin et al.

(10) Patent No.: US 10,847,246 B2
(45) Date of Patent: Nov. 24, 2020

(54) MEMORY SYSTEMS PERFORMING RECONFIGURABLE ERROR CORRECTION OPERATION USING ECC ENGINE WITH FIXED ERROR CORRECTION CAPABILITY

(71) Applicant: SK hynix Inc., Gyeonggi-do (KR)

(72) Inventors: Wongyu Shin, Gyeonggi-do (KR); Jung Hyun Kwon, Seoul (KR); Seunggyu Jeong, Gyeonggi-do (KR); Do Sun Hong, Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 92 days.

(21) Appl. No.: 16/203,362

(22) Filed: Nov. 28, 2018

(65) Prior Publication Data

US 2019/0385693 A1 Dec. 19, 2019

(30) Foreign Application Priority Data

Feb. 26, 2018 (KR) ........................ 10-2018-0023020

(51) Int. Cl.
*G11C 29/00* (2006.01)
*G11C 29/42* (2006.01)
(Continued)

(52) U.S. Cl.
CPC .......... *G11C 29/42* (2013.01); *G06F 11/1032* (2013.01); *G11C 11/1655* (2013.01);
(Continued)

(58) Field of Classification Search
None
See application file for complete search history.

(56) References Cited

U.S. PATENT DOCUMENTS 4,653,051 A * 3/1987 Sugimura ............. H03M 13/29
714/755
10,146,482 B2 * 12/2018 Hashimoto ........... G06F 11/108
(Continued)

FOREIGN PATENT DOCUMENTS

KR 10-2017-0001777 A 1/2017

OTHER PUBLICATIONS

C. Kim, S. Rhee, J. Kim and Y. Jee, "Product Reed-Solomon Codes for Implementing NAND Flash Controller on FPGA Chip," 2010 Second International Conference on Computer Engineering and Applications, Bali Island, 2010, pp. 281-285, doi: 10.1109/ICCEA.2010.63. (Year: 2010).*

*Primary Examiner* — Daniel F. McMahon
(74) *Attorney, Agent, or Firm* — Perkins Coie LLP

(57) ABSTRACT

A memory system includes a memory medium and a memory controller. The memory medium includes data symbols and parity symbols which are respectively disposed at cross points of a plurality rows and a plurality of columns. The memory controller includes an error correction code (ECC) engine that is designed to execute an error correction operation at a fixed error correction level while the memory controller accesses the memory medium. The memory controller performs the error correction operation at the fixed error correction level using the ECC engine in a first error correction mode. The memory controller performs the error correction operation at an error correction level higher than the fixed error correction level using the ECC engine in a second error correction mode.

22 Claims, 65 Drawing Sheets

(51) Int. Cl.
  *G06F 11/10* (2006.01)
  *H03M 13/11* (2006.01)
  *G11C 11/16* (2006.01)
  *G11C 11/409* (2006.01)

(52) U.S. Cl.
  CPC ........ *G11C 11/1657* (2013.01); *G11C 11/409* (2013.01); *H03M 13/1105* (2013.01)

(56) References Cited

U.S. PATENT DOCUMENTS

| | | | |
|---|---|---|---|
| 10,201,026 B1* | 2/2019 | Humblet | H04W 28/20 |
| 10,439,649 B2* | 10/2019 | Kumar | H03M 13/2927 |
| 2013/0318423 A1* | 11/2013 | Jagmohan | H03M 13/1515 |
| | | | 714/785 |
| 2015/0309875 A1* | 10/2015 | Mittelholzer | G06F 11/1076 |
| | | | 714/766 |
| 2016/0329913 A1* | 11/2016 | Cideciyan | G06F 3/0619 |
| 2018/0115325 A1* | 4/2018 | Blaettler | H03M 13/2948 |
| 2018/0343018 A1* | 11/2018 | Chen | H03M 13/07 |

\* cited by examiner

MEMORY SYSTEMS PERFORMING RECONFIGURABLE ERROR CORRECTION OPERATION USING ECC ENGINE WITH FIXED ERROR CORRECTION CAPABILITY

CROSS-REFERENCE TO RELATED APPLICATION

The present application claims priority under 35 U.S.C 119(a) to Korean Application No. 10-2018-0023020, filed on Feb. 26, 2018, which is herein incorporated by references in its entirety.

TECHNICAL FIELD

Various embodiments of the disclosed technology generally relate to memory systems including memory systems performing a reconfigurable error correction operation.

BACKGROUND

Recently, memory systems including semiconductor memory systems have been designed to provide reliable storage media for processors or other components by utilizing error correction bits for error detection and correction. In the memory systems, the error detection and correction may be executed by an error correction code (ECC) engine. The ECC engine was started to be included in memory systems for scientific or financial computing where any data corruption cannot be tolerated under any circumstances and now has been being used in most of memory systems.

In general, a reconfigurable scheme of the ECC engine may be considered to design the memory systems employing the ECC engine. For example, a range of the error correction operation performed by the ECC engine may be determined in advance, and the memory systems may then be designed such that the predetermined range of the error correction operation is reflected in the memory systems. For example, the reconfigurable scheme of the ECC engine may be designed such that the ECC engine performs the error correction operation for a plurality of error correction levels. With the presence of the plurality of error correction levels, error correction capabilities of the ECC engine may be set to be different from one another. For instance, the maximum number of erroneous bits that are correctable using the ECC engine at the lowest error correction level of the plurality of error correction levels may be set to be less than any other maximum number of erroneous bits that are correctable using the ECC engine at another error correction level. As the error correction level becomes higher, the maximum number of erroneous bits that are correctable using the ECC engine may increase. In the event that the memory system employs an ECC engine which is capable of performing the error correction operation for a plurality of error correction levels, the ECC engine may be configured to perform the error correction operation at an appropriate level depending on the number of erroneous bits that are detected.

As the error correction capability of the ECC engine increases, the stability of the memory systems employing the ECC engine can be improved. However, as the error correction capability of the ECC engine becomes higher, a circuit for realizing the ECC becomes more complicated. Thus, if the error correction capability of the ECC engine becomes higher, the integration density of the memory systems may be degraded due to the increase in complexity and size of the circuitry for the ECC engine. Nevertheless, in order to improve the reliability of the memory systems, it may be necessary to design the memory systems with the reconfigurable scheme of the ECC engine in consideration of a worst scenario even when a probability of occurring the data corruption is not high. This is because it is difficult to change the reconfigurable scheme of the ECC engine after the reconfigurable scheme of the ECC engine is included in the memory systems during design of the memory systems. Accordingly, the necessity to prepare for the worst scenario with a low possibility of occurrence causes the area occupied by the ECC engine and the complexity of the ECC engine to inefficiently increase. In addition, since the reconfigurable scheme of the ECC engine cannot be changed after the memory systems employing the ECC engine are fabricated, it may be difficult to provide flexibility in coping with situations that unexpectedly occur during the operation of such a memory system.

SUMMARY

This patent document provides, among others, a memory system includes a memory medium and a memory controller. The memory medium includes data symbols and parity symbols which are respectively disposed at cross points of a plurality of rows and a plurality of columns. The memory controller includes an error correction code (ECC) engine that is designed to execute an error correction operation at a fixed error correction level while the memory controller accesses the memory medium. The memory controller performs the error correction operation at the fixed error correction level using the ECC engine in a first error correction mode. The memory controller performs the error correction operation at an error correction level higher than the fixed error correction level using the ECC engine in a second error correction mode.

In one aspect, a memory system is provided to include: a memory medium including a storage area arranged at rows and columns and configured to include data symbols and parity symbols, each of the data symbols and the parity symbols having a column address and a row address; and a memory controller arranged in communication with the memory medium and configured to include an error correction code (ECC) engine performing an error correction operation at a fixed error correction level, the error correction operation correcting an erroneous data symbol generated during the communication with the memory medium, wherein the memory controller is further configured to generate row product codes and column product codes, each row product code including the data symbol and the parity symbol that have a same row address, and each column product code including the data symbols and the parity symbols that have a same column address, and wherein the memory controller is further configured to perform the error correction operation on the row product code and on the column product code to enable the error correction operation at an error correction level higher than the fixed error correction level.

In some implementations, the plurality of rows includes some rows including data symbols and parity symbols and other rows including only parity symbols without any data symbol, and wherein of the plurality of columns include some columns including data symbols and parity symbols; and other columns including only parity symbols without any data symbol. In some implementations, the memory controller performs the error correction operation in the fixed error correction mode if the number of erroneous data symbols is less than a predetermined value; and wherein the memory controller performs the error correction operation at the higher error correction level if the number of erroneous data symbols is equal to or greater than the predetermined value. In some implementations, the predetermined value is set to be equal to or less than an error correction capability which is fixed by the fixed error correction level. In some implementations, the ECC engine includes: an ECC encoder configured to perform, during a write operation, an ECC encoding operation for write data symbols to be written and output a codeword including the write data symbols; and an ECC decoder configured to perform, during a read operation, an ECC decoding operation for the codeword and output read data symbols. In some implementations, the ECC decoder is structured to correct an error included in the codeword to output the read data symbols and the number of the data symbols correctable during the ECC decoding operation is determined by the fixed error correction level. In some implementations, the memory controller performs the error correction operation at the fixed error correction to generate codewords, each codeword including at least one of the data symbols and the parity symbols that are arranged in a same row.

In some implementations, the number of row product codes and the number of column product codes that are generated by the memory controller are 'M+i' and 'N+j,' respectively (where, 'M', 'N', 'i' and 'j' denote natural numbers); wherein 'M' is the number of row product codes including any data symbol; wherein 'i' is the number of row product codes including parity symbols only without any data symbol; wherein 'N' is the number of column product codes including any data symbol; and wherein 'j' is the number of column product codes including parity symbols only without any data symbol. In some implementations, the memory controller performs a row directional ECC decoding operation and a row directional ECC encoding operation for each of the row product codes to generate row product codewords. In some implementations, the memory controller performs a column directional ECC encoding operation for the data symbols in each of the columns including any data symbol and the parity symbols in each of the columns without any data symbol to generate column product codewords and an additional row product codeword. In some implementations, the memory controller stores the additional row product codewords and the column product codewords in the memory medium. In some implementations, the memory controller stores row product codewords in the memory medium.

In some implementations, the memory controller sequentially performs the row directional error correction operation and the column directional error correction operations. In some implementations, the memory controller performs the error correction operation on the row product code after changing a column address of a particular data symbol. In some implementations, if a read command for reading the data symbols of an $L^{th}$ row product codeword is generated (where, 'L' denotes a natural number), the memory controller performs a row directional ECC decoding operation for each of the row product codewords, performs a column directional ECC decoding operation for each of the column product codewords to generate a column directional ECC decoded codewords, performs a row directional ECC decoding operation for the $L^{th}$ row product codeword in the column directional ECC decoded codewords to generate a row directional ECC decoded codeword, and transmit the row directional ECC decoded codeword for the $L^{th}$ row product codeword to a host. In some implementations, if a write command for storing write data symbols in an $L^{th}$ row product codeword is generated (where, 'L' denotes a natural number), the memory controller performs a first row directional ECC decoding operation for each of the row product codewords, performs a column directional ECC decoding operation for each of the column product codewords, performs a second row directional ECC decoding operation for each of the row product codewords, combines data symbols in an $L^{th}$ row of the second row directional ECC decoded data symbols with the write data symbols. In some implementations, the memory controller includes: a data manager configured to temporarily store data while the memory controller accesses to the memory medium; an ECC encoder configured to perform, during a write operation, an ECC encoding operation for write data symbols to be written and output a codeword including the write data symbols and parity symbols; an ECC decoder configured to perform, during a read operation, an ECC decoding operation for the codeword and output read data symbols; an error log configured to receive and store error information; a microcontroller in communication with the error log and configured to analyze the error information stored in the error log to determine to perform the error correction operation at an error correction level between the fixed error correction level and at the higher error correction level; and a product code controller in communication with the microcontroller and configured to generate control signals for the error correction operation performed at the higher error correction level; a first buffer configured to store data outputted from the ECC encoder in the second error correction mode; and a second buffer configured to store data outputted from the ECC decoder in the second error correction mode. In some implementations, each of the first buffer and the second buffer is configured to be accessible to data in both of a row direction and a column direction.

In some implementations, the memory system further comprises a first multiplexer configured to transmit data outputted from the memory medium or data outputted from the second buffer to the ECC decoder in response to any one of the control signals generated by the product code controller; a first demultiplexer configured to transmit data outputted from the ECC encoder to the first buffer or the memory medium in response to any one of the control signals generated by the product code controller; a second demultiplexer configured to transmit data outputted from the ECC decoder to the second buffer through a first output line or to output the data outputted from the ECC decoder through a second output line, in response to any one of the control signals generated by the product code controller; a third demultiplexer configured to transmit data outputted through the second output line of the second demultiplexer to the data manager through a first output line or to output the data outputted through the second output line of the second demultiplexer through a second output line, in response to any one of the control signals generated by the product code controller; a second multiplexer configured to output data outputted through the second output line of the third demultiplexer or data outputted from the data manager, in response to any one of the control signals generated by the product code controller; and a third multiplexer configured to transmit data outputted from the second multiplexer or data outputted to the first buffer to the ECC encoder, in response to any one of the control signals generated by the product code controller. In some implementations, the ECC encoder is configured to output data inputted to the ECC encoder without executing the ECC encoding operation in response to an encoding disable control signal corresponding to one of the control signals outputted from the product code controller; and the ECC decoder is configured to output data inputted to the ECC decoder without executing the ECC decoding operation in response to a decoding disable control signal corresponding to another one of the control signals outputted from the product code controller.

According to another embodiment, a memory system is provided to include a memory medium and a memory controller. The memory medium includes a storage area arranged at rows and columns and configured to include data symbols and parity symbols, each of the data symbols and the parity symbols having a row address and a column address. The memory controller includes an error correction code (ECC) engine that is designed to execute an error correction operation at a fixed error correction level in a first error correction mode while the memory controller accesses the memory medium. If at least one erroneous data symbol among the data symbols is not corrected by the error correction operation performed in the first error correction mode, the memory controller changes the first error correction mode into a second error correction mode to generate a product codeword including 'M'-number of row product codewords, 'i'-number of row product codewords, 'N'-number of column product codewords and 'j'-number of column product codewords and to perform the error correction operation for the product codeword using the ECC engine (where, 'M', 'N', 'i' and 'j' denote natural numbers). Each of the 'M'-number of row product codewords includes data symbols and parity symbols only without any data symbol, each of the 'i'-number of row product codewords includes parity symbols, each of the 'N'-number of column product codewords includes data symbols and parity symbols, and each of the 'j'-number of column product codewords includes parity symbols only without any data symbol.

In some implementations, the memory controller generates a product code including 'M+i'-number of row product codes and 'N+j'-number of column product codes, the memory controller performs a row directional ECC encoding operation for each of row product codes including at least of one data symbol to generate the 'M'-number of row product codewords, the memory controller performs a column directional ECC encoding operation for each of the 'N+j'-number of column product codes to generate the 'N+j'-number of column product codewords; and the memory controller writes the product codeword including the row product codewords and the column product codewords into the memory medium. In some implementations, if a read command for reading the data symbols of an $L^{th}$ row product codeword is generated (where, 'L' denotes a natural number which is equal to or less than the natural number 'M'), the memory controller performs a first row directional ECC decoding operation for each of the 'M'-number of row product codewords, performs a column directional ECC decoding operation for each of the 'N+j'-number of column product codewords, performs a second row directional ECC decoding operation for the $L^{th}$ row product codeword in the column directional ECC decoded codewords, and transmit the second row directional ECC decoded codeword for the $L^{th}$ row product codeword to a host. In some implementations, if a write command for storing write data symbols in an $L^{th}$ row product codeword is generated (where, 'L' denotes a natural number which is equal to or less than the natural number 'M'), the memory controller performs a first row directional ECC decoding operation for each of the 'M'-number of row product codewords, performs a column directional ECC decoding operation for each of the 'N+j'-number of column product codewords, performs a second row directional ECC decoding operation for each of the 'M'-number of row product codewords, and combines data symbols in an $L^{th}$ row of the second row directional ECC decoded data symbols with the write data symbols.

According to yet another embodiment, a memory system is provided to include a memory medium and a memory controller. The memory medium includes a storage area arranged at rows and columns and configured to include data symbols and parity symbols, each of the data symbols and the parity symbols having a row address and a column address. The memory controller is arranged in communication with the memory medium and configured to include an error correction code (ECC) engine that is designed to execute an error correction operation at a fixed error correction level while the memory controller accesses the memory medium. The memory controller performs a row directional error correction operation using the ECC engine for data symbols and parity symbols sharing one row address and performs a column directional error correction operation using the ECC engine in units of data symbols and parity symbols sharing one column address.

In some implementations, if at least one erroneous data symbol among the data symbols is not corrected by the row and column directional error correction operations, the memory controller changes a sequence of the row and column directional error correction operations to sequentially perform the column directional error correction operation and the row directional error correction operation.

BRIEF DESCRIPTION OF THE DRAWINGS

Certain features of the disclosed technology are illustrated by various embodiments with reference to the attached drawings, in which.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments are directed to memory systems performing a reconfigurable error correction operation using an error correction code (ECC) engine with fixed error correction capability.

Figure 1:
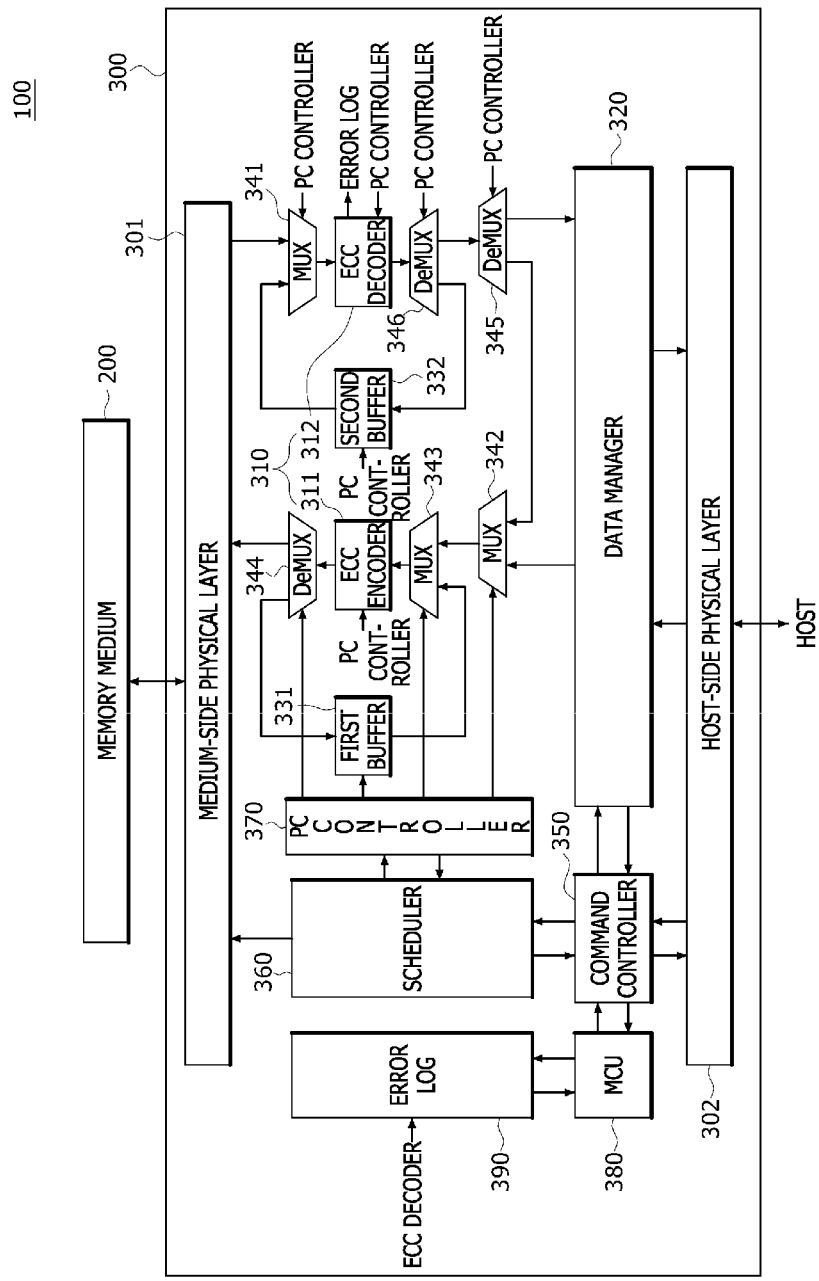
FIG. 1 is a block diagram illustrating an exemplary memory system according to an embodiment of the present disclosure.
Figure 2:
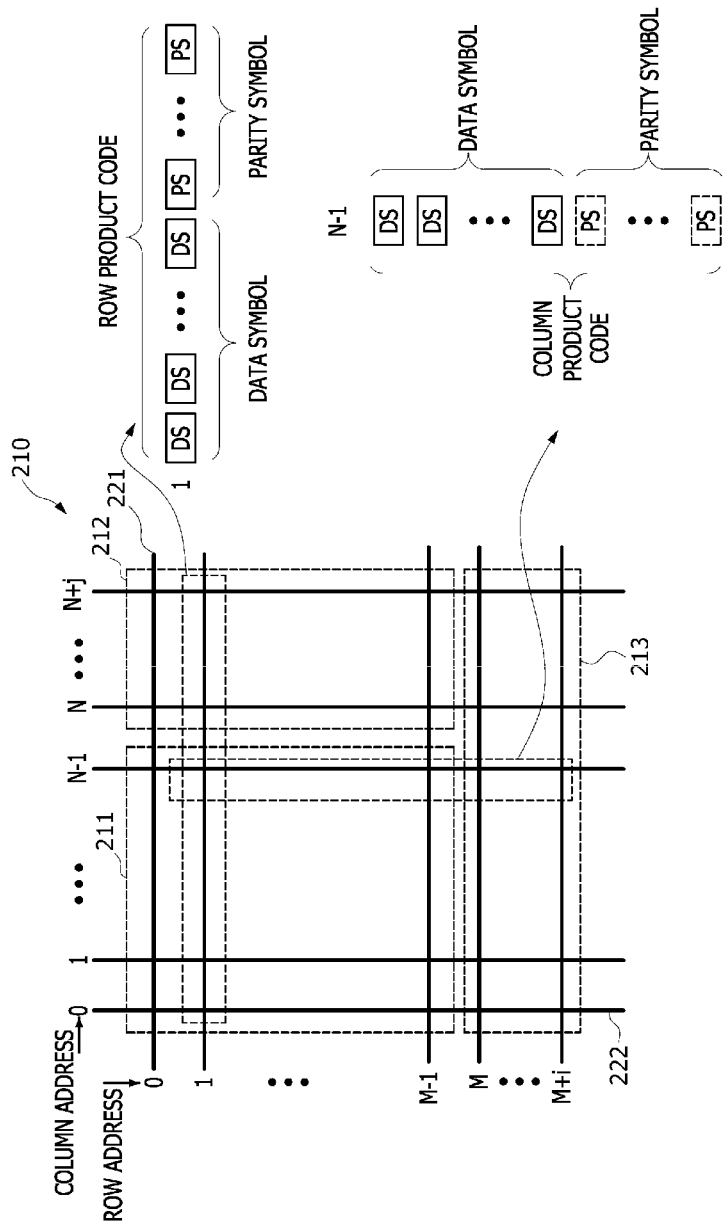
FIG. 2 is a schematic view illustrating examples of a row product code and a column product code included in a memory cell array.

FIG. 1 is a block diagram illustrating a memory system according to an embodiment of the disclosed technology, and FIG. 2 is a schematic view illustrating an example of a memory cell array 210 included in a memory medium 200 of the memory system 100 shown in FIG. 2 and illustrating examples of a row product code and a column product code included in a memory cell array 210.

Referring to FIG. 1, the memory system 100 may be configured to include a memory medium 200 and a memory controller 300. In an embodiment, the memory medium 200 may include at least one of a phase change random access memory (PCRAM) device, a magnetic random access memory (MRAM) device, a resistive random access memory (ReRAM) device or a flash memory device. The memory medium 200 may include the memory cell array 210 (also, referred to as a cell array).

As illustrated in FIG. 2, the cell array 210 may be configured to include unit cells which are respectively located at cross points of a plurality of rows 221 and a plurality of columns 222. The plurality of rows 221 may have row addresses 0, 1, . . . , M−1, M, . . . , and M+i, respectively (where, "M" and "i" denote natural numbers). The plurality of columns 222 may have column addresses 0, 1, . . . , N−1, N, . . . , and N+j (where, "N" and "j" denote natural numbers). Unit cells having the row addresses of 0, 1, . . . , and M−1 and the column addresses of 0, 1, . . . , and N−1 may be disposed in a data region 211. Data bit of '0' or '1' may be stored in each of the unit cells of the data region 211, respectively. Unit cells having the row addresses of 0, 1, . . . , and M−1 and the column addresses of N, . . . , and N+j may be disposed in a row-direction parity region 212. Row-direction parity bit of '0' or '1' may be stored in each of the unit cells of the row directional parity region 212. Unit cells having the row addresses of M, . . . , and M+i and the column addresses of 0, 1, . . . , and N+j may be disposed in a column-direction parity region 213. Column-direction parity bit of '0' or '1' may be stored in each of the unit cells of the column directional parity region 213.

An error correction operation may be performed for each of symbols, and a size of each symbol may depend on an algorithm used in the error correction operation. If the error correction operation employs an ECC algorithm using a binary unit code, for example, a Bose-Chaudhuri-Hocquenghem (BCH) code, each of data symbols may be configured to have one binary data bit and each of parity symbols may be configured to have one binary parity bit. Alternatively, if the error correction operation employs an ECC algorithm using a Reed-Solomon (RS) code, each of the data symbols may be configured to have a plurality of data bits and each of the parity symbols may be configured to have a plurality of parity bits.

In the present embodiment, it may be assumed that the error correction operation employs an ECC algorithm using a suitable error correction code, e.g., the Reed-Solomon (RS) code. Thus, each of the data symbols may be configured to have a plurality of data bits, for example, four or eight bits, and each of the parity symbols may be configured to have a plurality of parity bits, for example, four or eight bits. Accordingly, row addresses and column addresses of a data symbol, which is subject to the error correction operation and referred to as a target data symbol may be inconsistent with a row address and a column address of each of data bits in the target data symbol, and a row address and a column address of a parity symbol, which is subject to the error correction operation and referred to as a target parity symbol may be inconsistent with a row address and a column address of each of parity bits in the target parity symbol. In the following embodiments, it may be assumed that data symbols and parity symbols instead of data bits and parity bits may be stored in the cell array 210 of the memory medium 200. The embodiments as described in this patent document can also be applicable to the memory system employing the ECC algorithm using the binary unit code or another suitable code instead of the RS code. In the case of using the binary unit code, a row address and a column address of the target data symbol may be consistent with a row address and a column address of a data bit in the target data symbol, and a row address and a column address of the target parity symbol may be consistent with a row address and a column address of a parity bit in the target parity symbol.

In an embodiment, accessing to data stored in the cell array 210 of the memory medium 200 may be achieved in the respective pages, each page being a data region sharing one row address. Thus, the error correction operation performed during the access to the data stored in the cell array 210 may also be executed for data symbols and parity symbols that share one row address with each other. If the number of erroneous data symbols is greater than an error correction capability of an ECC engine, the erroneous data symbols cannot be corrected even though the error correction operation is performed. In case of the memory system 100 according to an embodiment, the column-directional parity region 213 which is capable of storing column-directional parity bit values may be allocated into the cell array region 210 such that the erroneous data symbols are all corrected even though the number of erroneous data symbols is greater than an error correction capability of an ECC engine.

The error correction operation of the memory system 100 may be performed in either a first error correction mode or a second error correction mode. In the first error correction mode, the error correction operation may be performed in units of data symbols and parity symbols that share one row address with each other. In the second error correction mode, the error correction operation may be performed in units of data symbols and parity symbols that share one column address with each other. In order to perform the error correction operation in the second error correction mode, a product code comprised of or including a row product code and a column product code may be generated first before the error correction operation. The row product code may be configured to include all of data symbols (DS) and all of parity symbols (PS) that share one row address with each other. The column product code may be configured to include some of data symbols DS sharing a certain column address and all of parity symbols PS sharing the certain column address. The parity symbols PS of the row product code may have parity bit values and are illustrated by dotted lines in FIG. 2. The parity symbols PS included in the column product code may not have any parity bit values before a product codeword is generated by the error correction operation in the second error correction mode.

Referring again to FIG. 1, the memory controller 300 may be coupled to the memory medium 200 through a medium-side physical layer 301. The memory controller 300 may also be coupled to a host through a host-side physical layer 302. The memory controller 300 may control accessing to the memory medium 200. For example, the memory controller 300 may control a write operation for storing write data into the memory medium 200 in response to a write command outputted from the host. In addition, the memory controller 300 may control a read operation for transmitting read data stored in the memory medium 200 to the host in response to a read command outputted from the host. The memory controller 300 may detect erroneous data which are generated during the write operation and the read operation and may perform the error correction operation for correcting the erroneous data if an error occurs to cause erroneous data to be generated.

The memory controller 300 may include an ECC engine 310 performing the error correction operation. The ECC engine 310 may include an ECC encoder 311 and an ECC decoder 312. The ECC encoder 311 may perform an ECC encoding operation of the write data while the memory controller 300 controls the write operation. For example, the ECC encoder 311 may receive the write data outputted from the host in the form of data symbols. The ECC encoder 311 may perform the ECC encoding operation of the data symbols corresponding to the write data to generate and output a codeword. The codeword may be generated to include data symbols and parity symbols. The codeword outputted from the ECC encoder 311 may be stored into the memory medium 200. The ECC decoder 312 may perform an ECC decoding operation while the memory controller 300 controls the read operation. For example, the ECC decoder 312 may receive the read data outputted from the memory medium 200 in the form of the codeword. The ECC decoder 312 may perform the ECC decoding operation of the codeword corresponding to the read data to generate and output data symbols for ECC operation. The data symbols outputted from the ECC decoder 312 may be transmitted to the host. The error correction during the ECC decoding operation executed by the ECC decoder 312 may be performed using parity symbols included in the codeword.

In general, an ECC engine may be designed to have a reconfigurable ECC scheme in order to improve an error correction capability in various implementations. The reconfigurable ECC scheme may provide multiple error correction levels for the error correction operation. For example, if the ECC engine is designed to have the reconfigurable ECC scheme, the error correction operation can proceed at different error correction levels based on a degree of an error occurrence. If configuring the ECC engine to have the reconfigurable ECC scheme, even though the error correction capability is improved, an area occupied by the ECC engine may increase and a circuit of the ECC engine may become more complicated. In recognition of the disadvantages, some implementations of the disclosed technology provide designs for the memory system 100 in which the ECC engine 310 of the memory system 100 includes the ECC encoder 311 and the ECC decoder 312 that perform non-reconfigurable ECC scheme. Unlike the configurable ECC scheme, the non-reconfigurable ECC scheme provides a fixed error correction level for the error correction operation and the error correction operation is performed at the same error correction level. Thus, the ECC engine 310 employed in the memory system 100 according to an embodiment of the disclosed technology can be realized using a relatively simple logic circuit, thereby reducing an area which is occupied by the logic circuit of the ECC engine 310.

As the ECC engine 310 of the memory system 100 is configured to have the non-reconfigurable ECC scheme, the number of parity symbols added to data symbols by the ECC encoder 311 during the write operation may be fixed. In addition, the number of data symbols which are correctable during the ECC decoding operation performed by the ECC decoder 312 may also be fixed. Nevertheless, the memory controller 300 of the memory system 100 according to the present embodiment may be configured to more accurately and efficiently perform the error correction operation using the ECC engine 310. Depending on the commands from the command controller, the memory controller 300 may perform the error correction operation in either the first error correction mode or the second error correction mode. In some implementations, the memory controller 300 may perform a control operation of the first error correction mode in which the error correction operation is executed by the ECC engine 310 according to an error correction level. In some implementations, the memory controller 300 may also perform a control operation of the second error correction mode in which the error correction operation is more accurately and efficiently executed by the ECC engine 310 at a higher error correction level when there is a need for a stricter error correction operation.

The memory controller 300 may include a data manager 320. The data manager 320 may include a buffer memory. The data manager 320 may temporarily store the write data outputted from the host. The buffer memory of the data manager 320 may temporarily store the read data outputted from the memory medium 200. The write data outputted from the host may be transmitted to the data manager 320 through the host-side physical layer 302. The read data outputted from the memory medium 200 may be transmitted to the host through the data manager 320 and the host-side physical layer 302. The data manager 320 may be configured to combine a write data symbol with the product codeword in response to the write command in the second error correction mode.

The memory controller 300 may include a first buffer 331, a second buffer 332, first to third multiplexers 341 to 343, and first to third demultiplexers 344 to 346. The first buffer 331 may act as a memory that temporarily stores data while the ECC encoding operation is performed in the second error correction mode. The first buffer 331 may receive and store ECC encoded data outputted from the first demultiplexer 344 or may output the data stored therein to the third multiplexer 343 according to a control signal while the ECC encoding operation is performed in the second error correction mode. The second buffer 332 may act as a memory that temporarily stores data while the ECC decoding operation is performed in the second error correction mode. The second buffer 332 may output the data stored therein to the first multiplexer 341 or may receive and store ECC decoded data outputted from the third demultiplexer 346 according to a control signal while the ECC decoding operation is performed in the second error correction mode. To enable the first buffer 331 and the second buffer 332 to operate in the second error correction mode of the error correction operation, each of the first buffer 331 and the second buffer 332 may be configured to be accessible to data in both of a row direction and a column direction.

The first multiplexer 341 may be in communication with the medium-side physical layer 301, the second buffer 332, and the ECC encoder. The first multiplexer 341 may selectively output any one of a datum outputted from the memory medium 200 through the medium-side physical layer 301 and a datum outputted from the second buffer 332, in response to a control signal received from the PC controller 370. A datum outputted from the first multiplexer 341 may be inputted to the ECC decoder 312. The second multiplexer 342 may be in communication with the second demultiplexer 345 and the data manager 320 to receive the signals therefrom and to output an output signal as one of the two inputs to the third multiplexer 343 which receives another input from the first buffer 331. The second multiplexer 342 may selectively output any one of a datum outputted from the second demultiplexer 345 and a datum outputted from the data manager 320, in response to a control signal received from the PC controller 370. The third multiplexer 343, while being configured to be in communication with the second multiplexer 342 and the first buffer 331 as two inputs, is coupled to the ECC encoder 312 to supply an output to the ECC encoder 312. The third multiplexer 343 may selectively output any one of a datum outputted from the second multiplexer 342 and a datum outputted from the first buffer 331, in response to a control signal received from the PC controller 370. A datum outputted from the third multiplexer 343 may be inputted to the ECC encoder 311.

The first demultiplexer 344 may be in communication with the ECC encoder 311, the first buffer 331, and the memory medium. The first demultiplexer 344 may transmit the received output datum of the ECC encoder 311 to the first buffer 331 or the memory medium 200, in response to a control signal received from the PC controller 370. The second demultiplexer 345 may be in communication with the second multiplexer 342, the data manager 320, and the second multiplexer 346, and transmit the received output datum of the third demultiplexer 346 to the data manager 320 or the second multiplexer 342, in response to a control signal received from the PC controller 370. The third demultiplexer 346 may be in communication with the ECC decoder 312, the second buffer 332, and the second demultiplexer 345, and transmit an out datum of the ECC decoder 312 to the second demultiplexer 345 or the second buffer 332, in response to a control signal.

The memory controller 300 may include a command controller 350, a scheduler 360, a product code (PC) controller 370, a microcontroller (MCU) 380 and an error log 390. The command controller 350 may receive commands from the host through the host-side physical layer 302. For example, the command controller 350 may receive the read command and the write command from the host through the host-side physical layer 302. In an embodiment, the command controller 350 may include a command queue storing a series of commands in sequence. The commands inputted to the command controller 350 may be transmitted to the data manager 320 and the scheduler 360. The command controller 350 may receive signals informing the process results of the commands from the data manager 320 and the scheduler 360 and may transmit the signals informing the process results of the commands to the host through the host-side physical layer 302. With regard to the error correction operation, if the error correction mode of the memory system 100 is changed from the first error correction mode into the second error correction mode, the command controller 350 may transmit the commands relating to the second error correction mode of the error correction operation to the scheduler 360.

The scheduler 360 may determine a sequence of the commands processed by the memory controller 300 based on the commands received from the command controller 350. The scheduler 360 may determine the sequence of the commands processed by the memory controller 300 under a certain programmed scheduling rule. The commands whose process sequence is determined by the scheduler 360 may be transmitted to the memory medium 200 through the medium-side physical layer 301 as well as to the PC controller 370. The scheduler 360 may receive the signal informing the process results of the commands from the PC controller 370. While the memory controller 300 performs the error correction operation in the second error correction mode, the scheduler 360 may delay processing of other commands than the commands relating to the error correction operation performed in the second error correction mode.

The PC controller 370 may output the plurality of controls in response to the commands outputted from the scheduler 360. While the ECC encoding operation is performed in the first error correction mode, the PC controller 370 may output the control signals to the second multiplexer 342 and the third multiplexer 343, respectively, which enable to input the write data outputted from the data manager 320 into the ECC encoder 311. After the ECC encoding operation is performed by the ECC encoder 311, the PC controller 370 may output the control signal for transmitting data outputted from the ECC encoder 311 to the medium-side physical layer 301 to the first demultiplexer 344. While the ECC encoding operation is performed in the first error correction mode, the write data outputted from the data manager 320 may be inputted into the ECC encoder 311 without any changes by the control signals outputted from the PC controller 370. In addition, the ECC encoded data generated by the ECC encoder 311 may be transmitted to the medium-side physical layer 301 without any changes.

While the ECC decoding operation is performed in the first error correction mode, the PC controller 370 may output the control signal to the first multiplexer 341, which enables to input the read data outputted from the medium-side physical layer 301 into the ECC decoder 312. After the ECC decoding operation is performed by the ECC decoder 312, the PC controller 370 may respectively output the control signals to the second demultiplexer 345 and the third demultiplexer 346, which enable to transmit data outputted from the ECC decoder 312 to the data manager 320. While the ECC decoding operation is performed in the first error correction mode, the read data outputted from the medium-side physical layer 301 may be inputted into the ECC decoder 312 without any changes by the control signals outputted from the PC controller 370. In addition, the ECC decoded data generated by the ECC decoder 312 may be transmitted to the data manager 320 without any changes.

With respect to the ECC encoding operation and the ECC decoding operation in the second error correction mode, the PC controller 370 may respectively output the control signals to the first, second and third multiplexers 341, 342 and 343 such that each of the first, second and third multiplexers 341, 342 and 343 selectively output any one of two input data inputted thereto. In addition, the PC controller 370 may respectively output the control signals to the first, second and third demultiplexers 344, 345 and 346 such that each of the first, second and third demultiplexers 344, 345 and 346 outputs one input datum inputted thereto as any one of two output data thereof. Moreover, the PC controller 370 may respectively output the control signals to the first buffer 331 and the second buffer, which respectively enable the data input and output operations, respectively. In some embodiments, the PC controller 370 may respectively output an encoding disable control signal and a decoding disable control signal to the ECC encoder 311 and the ECC decoder 312. The encoding disable control signal allows the ECC encoder 311 to output its input data inputted thereto as they are without any execution of the ECC encoding operation and the decoding disable control signal allows the ECC decoder 312 to output its input data inputted thereto as they are without any execution of the ECC decoding operation.

The microcontroller 380 may determine an error correction mode of the error correction operation between the first error correction mode and the second error correction mode. In order to make the determination between the first error correction mode and the second error correction mode, the microcontroller 380 may be configured to include an algorithm for selecting any one of the first and second error correction modes and a firmware having an algorithm for a control operation of the second error correction mode. The firmware may be stored in a memory (e.g., a read only memory (ROM) device) of the microcontroller 380 and may be directly executed without any help of random access memory (RAM) devices. If the error correction operation is performed in the first error correction mode, the microcontroller 380 may transmit commands relating to the first error correction mode of the error correction operation to the command controller 350. If the error correction operation is performed in the second error correction mode, the microcontroller 380 may transmit commands for the second error correction mode of the error correction operation to the command controller 350.

The error log 390 may receive and store error information from the ECC decoder 312. In an embodiment, the error information may include the number of errors in one page, locations of the errors, and correctability of the errors in the memory medium 200, which are obtained by the ECC decoding operation. The microcontroller 380 may request the access to the error log 390 to determine the error correction mode. The error log 390 may transmit the error information stored in the error log 390 to the microcontroller 380 in response to the access request from the microcontroller 380. The microcontroller 380 may determine the error correction mode based on the error information outputted from the error log 390.

Figure 3:
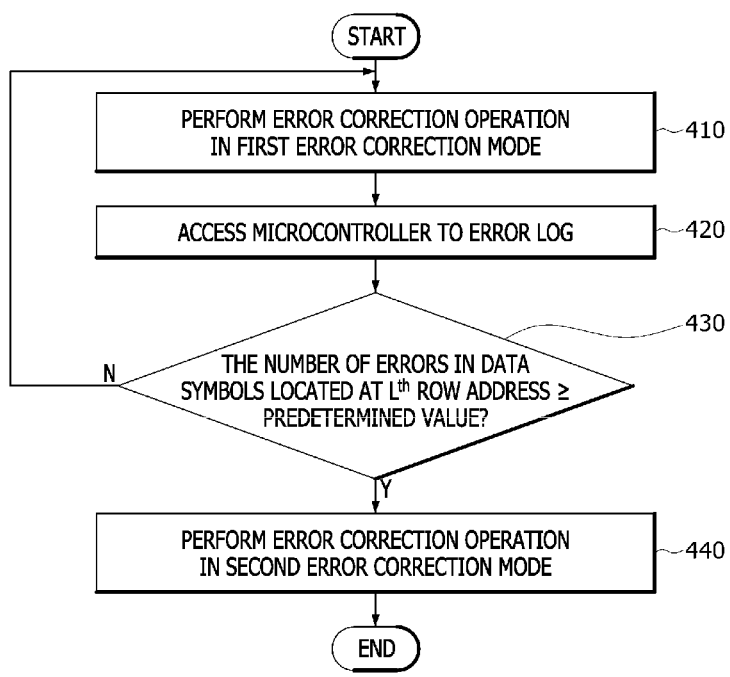
FIG. 3 is a flowchart illustrating an example of a process for changing an error correction mode performed in a memory system.

FIG. 3 is an example of a flowchart illustrating a process for changing an error correction mode of a memory system 100. Referring to FIGS. 1 and 3, at a step 410, the error correction operation may be performed in the first error correction mode during the read operation and the write operation of the memory medium 200. The first error correction mode continues until the microcontroller 380 of the memory controller 300 generates a switching command for changing the error correction mode from the first error correction mode into the second error correction mode. In some implementations, write data outputted from the host may be inputted to the ECC encoder 311 in the form of data symbols. The ECC encoder 311 may perform the ECC encoding operation to output a codeword including the data symbols inputted to the ECC encoder 311 and parity symbols added to the data symbols. The codeword outputted from the ECC encoder 311 may be written into the memory medium 200. Read data outputted from the memory medium 200 may be inputted to the ECC decoder 312 in the form of the codeword. The ECC decoder 312 may perform the ECC decoding operation to detect errors in the read data in the form of the codeword. If the read data has at least one erroneous bit, the ECC decoder 312 may correct the erroneous data and output corrected read data. The corrected data outputted from the ECC decoder 312 may be transmitted to the host in the form of the data symbols. While the corrected data is transmitted from the ECC decoder 312 to the host, the ECC decoder 312 may transmit error information on the corrected data to the error log 390 according to the result of the ECC decoding operation.

At a step 420, the microcontroller 380 may access to the error log 390. In an embodiment, the microcontroller 380 may be configured to periodically access the error log 390. The microcontroller 380 may analyze the error information stored in the error log 390 to determine whether the error correction mode needs to be changed. This determination may be made on the basis of one or plurality parts of the error information. In the present embodiment, the determination of the microcontroller 380 may be based on information about the number of errors in the data symbols. At a step 430, the microcontroller 380 may determine whether the number of errors in the data symbols located at an $L^{th}$ row address is equal to or greater than a predetermined value. The predetermined value may be set to be equal to an error correction capability of the ECC engine 310 or less than but close to the error correction capability of the ECC engine 310. In an embodiment, if the ECC engine 310 has an error correction level that enables to correct five data symbols, the predetermined value may be set to be five or four which is less than five but close to five.

If it is determined at the step 430 that the number of errors in the data symbols located at the $L^{th}$ row address is less than the predetermined value, the error correction operation goes back to the step 410 and continues performing the error correction operation in the first error correction mode. If it is determined at the step 430 that the number of errors in the data symbols located at the $L^{th}$ row address is equal to or greater than the predetermined value, the error correction operation proceeds to the step 440 in which the first error correction mode may be changed into the second error correction mode such that the error correction operation is performed in the second error correction mode having a relatively higher error correction level as compared with the first error correction mode.

If the error correction operation is performed in the second error correction mode as illustrated in the step 440, the microcontroller 380 may transmit commands for the second error correction mode of the error correction operation to the command controller 350. The command controller 350 may receive the commands from the microcontroller 380 and may transmit the commands to the scheduler 360 such that the error correction operation executed during the read operation and the write operation is performed in the second error correction mode. The scheduler 360 may determine a process sequence of the commands and may transmit the determined process sequence of the commands to the PC controller 370 such that the error correction operation is performed in the second error correction mode. The PC controller 370 may generate the plurality of control signals for the commands such that the error correction operation executed by the ECC engine 310 is performed in the second error correction mode.

Figure 4:
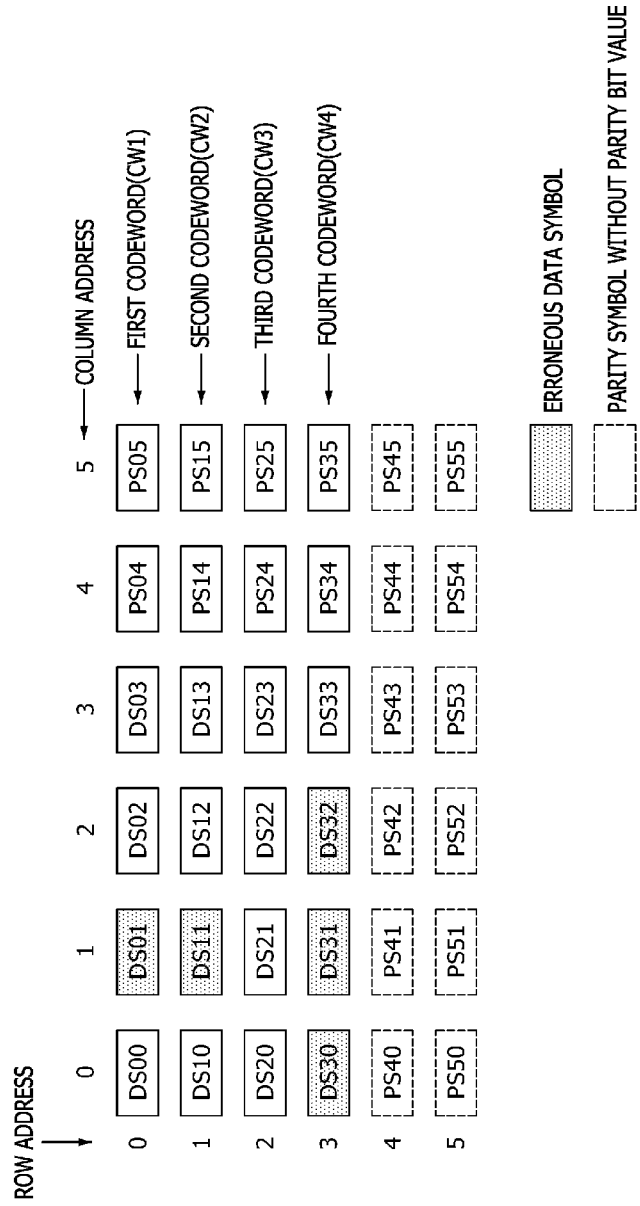
FIG. 4 illustrates an example of a plurality of codewords for explaining a first error correction mode of an error correction operation performed in a memory system.

FIG. 4 is an example of a schematic view illustrating a plurality of codewords for explaining an error correction operation performed in a first error correction mode. In the present embodiment, it may be assumed that four codewords (e.g., first to fourth codewords CW1~CW4), each of which include data symbols sharing one row address, are stored in the memory medium 200. FIG. 4 illustrates a specific example of the plurality of codewords, the number of the plurality of codewords is not limited to four. That is, the number of the plurality of codewords may be less than or greater than four according to a storage capacity of the memory medium 200. Referring to FIG. 4, the first codeword CW1 may be arranged at a first row and configured to include data symbols DS00, DS01, DS02 and DS03 and parity symbols PS04 and PS05. The data symbols DS00, DS01, DS02 and DS03 and the parity symbols PS04 and PS05 may share a first row address of '0' with each other to form a first page. The second codeword CW2 may be arranged at a second row and configured to include data symbols DS10, DS11, DS12 and DS13 and parity symbols PS14 and PS15. The data symbols DS10, DS11, DS12 and DS13 and the parity symbols PS14 and PS15 may share a second row address of '1' to form a second page. The third codeword CW3 may be arranged at a third row and configured to include data symbols DS20, DS21, DS22 and DS23 and parity symbols PS24 and PS25. The data symbols DS20, DS21, DS22 and DS23 and the parity symbols PS24 and PS25 may share a third row address of '2' to form a third page. The fourth codeword CW4 may be arranged at a forth row and configured to include data symbols DS30, DS31, DS32 and DS33 and parity symbols PS34 and PS35. The data symbols DS30, DS31, DS32 and DS33 and the parity symbols PS34 and PS35 may share a fourth row address of '3' to form a fourth page.

Although parity symbols PS40, PS41, PS42, PS43, PS44, PS45 do not constitute the first to fourth codewords CW1~CW4, the parity symbols PS40, PS41, PS42, PS43, PS44, PS45 may be disposed in a fifth row. In addition, parity symbols PS50, PS51, PS52, PS53, PS54, PS55 may be disposed in a sixth row. The fifth and sixth rows may be used in the error correction operation performed in the second error correction mode, but not used in the error correction operation performed in the first error correction mode. Although FIG. 4 illustrates an example in which each of the codewords is configured to include four data symbols and two parity symbols, the disclosed technology is not limited to the example illustrated in FIG. 4 and other implementations are also possible. For example, the number of the data symbols and the parity symbols included in each of the codewords may be set to be different from four and have various values.

Each of the codewords CW1 to CW4 may be generated by the ECC encoding operation performed in the first error correction mode during the write operation. In addition, one of more errors in each of the codewords CW1~CW4 may be corrected by the ECC decoding operation performed in the first error correction mode during the read operation. The ECC encoding operation performed in the first error correction mode during the write operation may be executed for write data symbols outputted from the host. The write data symbols may share one row address with each other. The ECC encoding operation may add parity symbols to the write data symbols to generate the codeword CW1~CW4. The codeword generated by the ECC encoding operation may be stored into the memory medium 200. The ECC decoding operation performed during the read operation may be executed for a codeword having one row address. Errors in the data symbols may be corrected using the parity symbols during the ECC decoding operation. The corrected data symbols may be transmitted to the host.

As illustrated in FIG. 4, the error correction operation performed in the first error correction mode will be described in conjunction with an example in which each of the first, second and fourth codewords CW1, CW2 and CW4 includes at least one erroneous data symbol. More specifically, it may be assumed that the first codeword CW1 has one data symbol (i.e., the data symbol DS01) as its erroneous data symbol, the second codeword CW2 has one data symbol (i.e., the data symbol DS11) as its erroneous data symbol, and the fourth codeword CW4 has three data symbols (i.e., the data symbols DS30, DS31 and DS32) as its erroneous data symbols. In addition, it may be assumed that the ECC engine 310 has an error correction capability of '3' and the predetermined value at the step 430 of FIG. 3 is set to be '2'. If the read command for the data symbols DS00 to DS03 having the row address of '0' issues, the data symbols DS00 to DS03 and the parity symbols PS04 and PS05, which are included in the first codeword CW1 stored in the memory medium 200, may be inputted to the ECC decoder 312 through the medium-side physical layer 301 and the first multiplexer 341 included in the memory controller 300. The ECC decoder 312 may receive the first codeword CW1 to execute the ECC decoding operation of the first codeword CW1. During the ECC decoding operation, the second data symbol DS01 among the data symbols DS00 to DS03 may be detected as an erroneous data symbol using the parity symbols PS04 and PS05. Since the number of the erroneous data symbols in the first codeword CW1 is one which is less than two which is set as the predetermined value mentioned in the step 430, the ECC decoder 312 may correct the erroneous data symbol DS01 and may output the corrected data symbol together with the non-erroneous data symbols. The data symbols DS00 to DS03 including the corrected data symbol DS01 may be transmitted from the ECC decoder 312 to the host through the third demultiplexer 346, the second demultiplexer 345, the data manager 320 and the host-side physical layer 302. When the read command for the data symbols DS10 to DS13 having the row address of '1' issues, the erroneous data symbol DS11 can be corrected in the same manner as the data symbol DS01 and the data symbols DS10 to DS13 including the corrected data symbol DS11 can be transmitted from the ECC decoder 312 to the host If the read command for the data symbols DS30 to DS33 having the row address of '3' issues, the data symbols DS30 to DS33 and the parity symbols PS34 and PS35, which are included in the fourth codeword CW4, may be transmitted from the memory medium 200 to the ECC decoder 312 through the medium-side physical layer 301 and the first multiplexer 341 included in the memory controller 300. The ECC decoder 312 may receive the fourth codeword CW4 to execute the ECC decoding operation of the fourth codeword CW4. During the ECC decoding operation, the data symbols DS30, DS31 and DS32 among the data symbols DS30 to DS33 may be detected as erroneous data symbols using the parity symbols PS34 and PS35. Since the number of the erroneous data symbols in the fourth codeword CW4 is three which is greater than two which is set as the predetermined value mentioned in the step 430, the erroneous data symbols DS30, DS31 and DS32 cannot be corrected in the first error correction mode.

As previously discussed, the ECC decoder 312 may be in communication with the error log 390 to provide information on the error correction operation. During the read operation of the data symbols DS00 to DS03 of the first codeword CW1, the data symbols DS10 to DS13 of the second codeword CW2, and the data symbols DS30 to DS33 of the fourth codeword CW4, the ECC decoder 312 may transmit information on the error correction to the error log 390. During the ECC decoding operation for the data symbols DS00 to DS03 of the first codeword CW1 and the data symbols DS10 to DS13 of the second codeword CW2, the error correction information outputted from the ECC decoder 312 may include the number of erroneous data symbols in each of the first and second codewords CW1 and CW2 and locations of the erroneous data symbols. As described with reference to the steps 420 and 430 of FIG. 3, the microcontroller 380 may access the error correction information stored in the error log 390 and make a comparison between the error correction information, for example, the number of errors, and the predetermined value. For the data symbols DS00 to DS03 of the first codeword CW1 and the data symbols DS10 to DS13 of the second codeword CW2, the microcontroller 380 may continue the first error correction mode without making any changes on the error correction mode because the number of the erroneous data symbols in each of the first and second codewords CW1 and CW2 is one which is less than two that is the predetermined value for the error correction capability.

The error correction information outputted from the ECC decoder 312 during the ECC decoding operation for the data symbols DS30 to DS33 of the fourth codewords CW4 may include the number of erroneous data symbols in the fourth codeword CW4 and locations of the erroneous data symbols. As described with reference to the steps 420 and 430 of FIG. 3, the microcontroller 380 may access the error correction information stored in the error log 390 and make a comparison between the error correction information, for example, the number of errors, and the predetermined value. For the data symbols DS30 to DS33 of the fourth codeword CW4, the microcontroller 380 may change the first error correction mode into the second error correction mode to perform the error correction operation of the fourth codeword CW4 in the second error correction mode because the number of the erroneous data symbols in the fourth codeword CW4 is three which is greater than two that is the predetermined value for the error correction capability. If it is determined that the first error correction mode is changed into the second error correction mode, the microcontroller 380 may transmit commands to the command controller for execution of the second error correction mode in the error correction operation.

Figure 5:
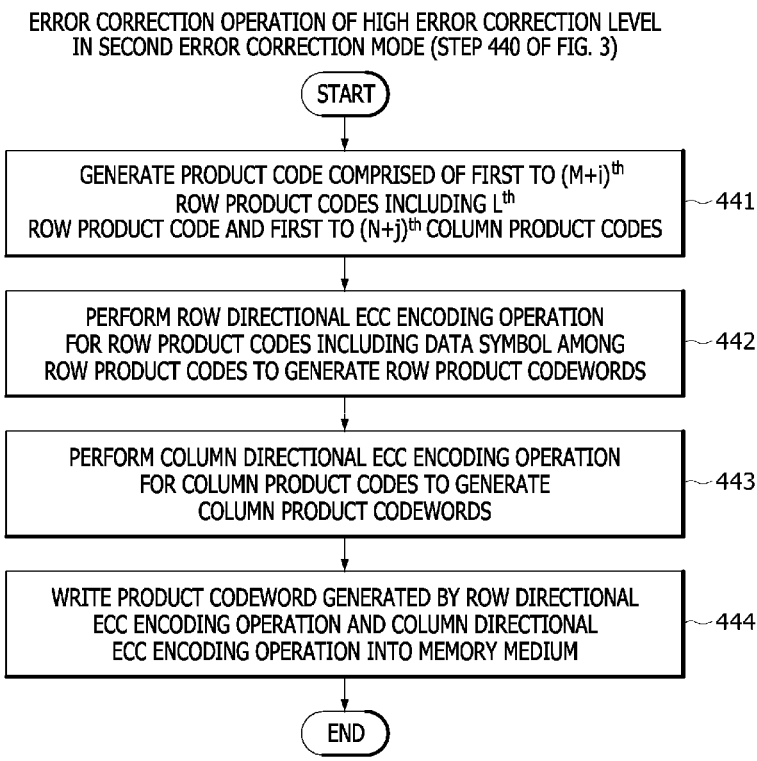
FIG. 5 is an example of a flowchart illustrating a second error correction mode of an error correction operation performed in a memory system.
Figure 6:
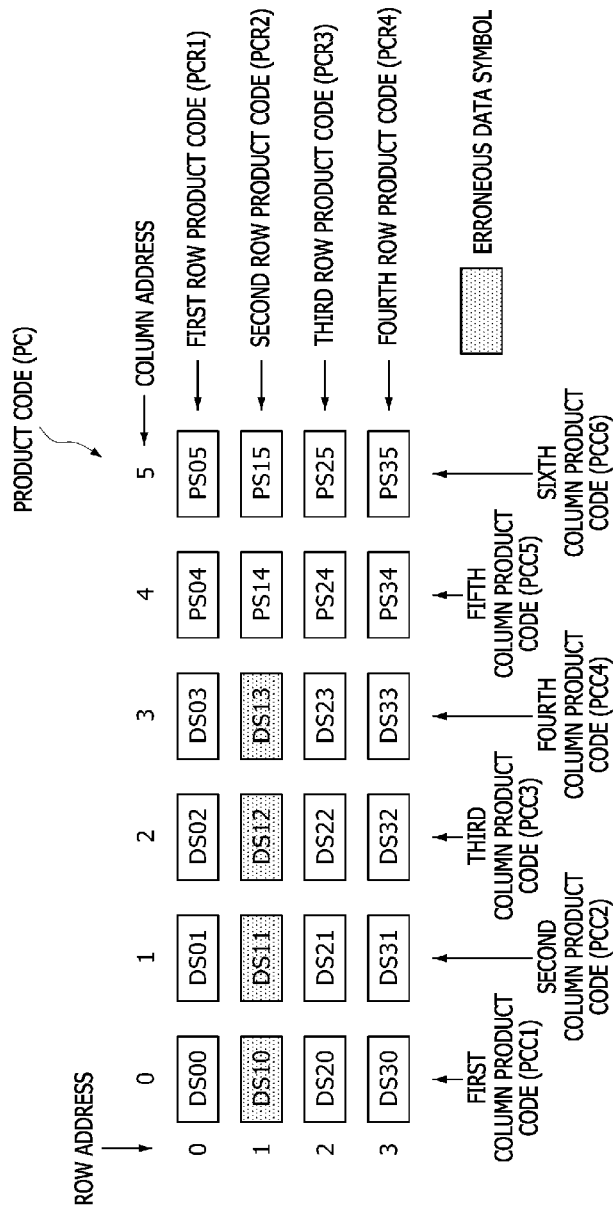
FIG. 6 illustrates an example of a product code generated for a second error correction of an error correction operation performed in a memory system.

FIG. 5 is an example of a flowchart illustrating a second error correction mode of an error correction operation. Referring to FIG. 5, if the microprocessor 380 changes the error correction mode for the $L^{th}$ page (including the data symbols sharing the $L^{th}$ row address described with reference to FIG. 3) from the first error correction mode into the second error correction mode, a product code including the data symbols sharing the $L^{th}$ row address may be generated (see a step 441). The product code may include row product codes and column product codes. Each of the row product codes includes data which have a same row address and each of the column produced codes includes data which have a same column address. Referring to FIG. 6, each of the first to fourth row product codes PCR1 to PCR4 include data symbols and parity symbols having a same row address and each of the first to six column product codes PCC1 to PCC6 include data symbols or parity symbols having a same column address. Thus, each of the data symbols and the parity symbols may be included in a particular row product code as well as a particular column product code.

As illustrated in FIG. 4, there are certain rows, for example, $(M+1)^{th}$ to $(M+i)^{th}$ rows, which include the parity symbols only without any data symbols. In this case, the number 'M' is the number of row product codes including a data symbol(s). Thus, each of a plurality of row product codes, for example, first to $(M+i)^{th}$ row product codes may be configured to include data symbols and parity symbols sharing any one of the first to $M^{th}$ row addresses or to include only parity symbols sharing any one of the $(M+1)^{th}$ to $(M+i)^{th}$ row addresses. The $L^{th}$ row may be any one of the first to $M^{th}$ rows. The parity symbols sharing any one of the $(M+1)^{th}$ to $(M+i)^{th}$ row addresses may have bit values which are determined by a column directional ECC encoding operation that proceeds after a row directional ECC encoding operation. Thus, before the column directional ECC encoding operation, the parity symbols sharing any one of the $(M+1)^{th}$ to $(M+i)^{th}$ row addresses may not have any bit values. Since there are certain columns which include the parity symbols only, each of a plurality of column product codes, for example, first to $N^{th}$ column product codes may be configured to include data symbols and parity symbols sharing any one of the first to $N^{th}$ column addresses or to include only parity symbols sharing any one of the $(N+1)^{th}$ to $(N+j)^{th}$ column addresses. The parity symbols sharing any one of the first to $N^{th}$ column addresses does not have any bit values. In this case, the number 'N' is the number of the column address including both data symbols having bit value and parity symbols not having bit value. Thus, each of the data symbols may be included in any one of the row product codes as well as any one of the column product codes. For example, a data symbol designated by a row address of 'M-1' and a column address of 'N-1' may be included in a row product code having a row address of 'M-1' as well as a column product code having a column address of 'N-1'.

After the product code is generated, a row directional ECC encoding operation for each of the first to $M^{th}$ row product codes among the row product codes may be performed to generate row product codewords (see a step 442). Since the parity symbols in each of the $(M+1)^{th}$ to $(M+i)^{th}$ row product codes do not have any bit values, no ECC encoding operation is applied to the $(M+1)^{th}$ to $(M+i)^{th}$ row product codes at the step 442. Subsequently, a column directional ECC encoding operation for the column product codes may be performed to generate column product codewords (see a step 443). Bit values of the parity symbols included in each of the $(M+1)^{th}$ to $(M+i)^{th}$ row product codes may be determined by the column directional ECC encoding operation performed at the step 443. Next, a product codeword generated by the row directional ECC encoding operation performed at the step 442 and the column directional ECC encoding operation performed at the step 443 may be written into the memory medium (200 of FIG. 1) (see a step 444).

FIG. 6 is an example of a schematic view illustrating an example of a product code (PC) generated for a second error correction mode of an error correction operation. In the present embodiment, it may be assumed that the product code (PC) includes six row product codes (e.g., first to sixth row product codes) and six column product codes (e.g., first to sixth column product codes PCC1 to PCC6), although the fifth and sixth row product codes PCC5 and PCC6 are not shown in FIG. 6. In FIG. 6, only the first to fourth row product codes PCR1 to PCR4 including both the data symbols and the parity symbols are illustrated. In FIG. 6, the fifth and sixth row product codes including the parity symbols only and not having any parity bit values are not shown. Referring to FIG. 6, among the data symbols stored in the memory medium 200, four data symbols DS10 to DS13 having a row address of '1' are erroneous data symbols, and thus, the number of the erroneous data symbols DS10 to DS13 become four. Thus, the number of the erroneous data symbols may be greater than an error correction capability (e.g., 3) of the ECC engine 310. If the error correction operation is performed in the first error correction mode, all of the erroneous data symbols DS10~DS13 cannot be corrected because the number (i.e., four) of the erroneous data symbols DS10 to DS13 is greater than the predetermined value (i.e., two) as mentioned in the step 430 of FIG. 3. In this case, the error correction mode for the error correction operation of the data symbols DS10 to DS13 may be changed from the first error correction mode into the second error correction mode. If the error correction mode for the data symbols DS10 to DS13 is changed into the second error correction mode, the product code PC may be generated by the step 441. The error correction operation for the product code PC may be performed in the second error correction mode to correct all of the erroneous data symbols DS10 to DS13. The error correction operation for the product code PC will be described in detail hereinafter with reference to the drawings.

In some implementations, the product code PC may include four row product codes (e.g., first to fourth row product codes PCR1 to PCR4) including both data and parity symbols and two row product codes (not shown) including only parity symbols. The product code PC may include a plurality of column product codes, for example, first to sixth column product codes PCC1 to PCC6. Among the first to fourth row product codes PCR1 to PCR4 included in the product code PC, the second row product code PCR2 may have the erroneous data symbols DS10 to DS13, the number of which is equal to or greater than the predetermined value. The first to fourth row product codes PCR1 to PCR4 may have row addresses which are adjacent to each other. Each of the first to fourth row product codes PCR1 to PCR4 may include both data symbols and parity symbols. The first row product code PCR1 may be configured to include data symbols DS00 to DS03 and parity symbols PS04 and PS05 that share a row address of '0.'. The second row product code PCR2 may be configured to include data symbols DS10 to DS13 and parity symbols PS14 and PS15 that share a row address of '1'. The third row product code PCR3 may be configured to include data symbols DS20 to DS23 and parity symbols PS24 and PS25 that share a row address of '2.' The fourth row product code PCR4 may be configured to include data symbols DS30 to DS33 and parity symbols PS34 and PS35 that share a row address of '3.'.

The first column product code PCC1 may be configured to include the data symbols DS00 to DS30 and parity symbols (not shown) not having parity bit values, which share a column address of '0' with each other. The second column product code PCC2 may be configured to include the data symbols DS01 to DS31 and parity symbols (not shown) not having parity bit values, which share a column address of '1' with each other. The third column product code PCC3 may be configured to include the data symbols DS02 to DS32 and parity symbols (not shown) not having parity bit values, which share a column address of '2' with each other. The fourth column product code PCC4 may be configured to include the data symbols DS03 to DS33 and parity symbols (not shown) not having parity bit values, which share a column address of '3' with each other. The fifth column product code PCC5 may be configured to include the data symbols DS04 to DS34 and parity symbols (not shown) not having parity bit values, which share a column address of '4' with each other. The sixth column product code PCC6 may be configured to include the data symbols DS05 to DS35 and parity symbols (not shown) not having parity bit values, which share a column address of '5' with each other.

Figure 7:
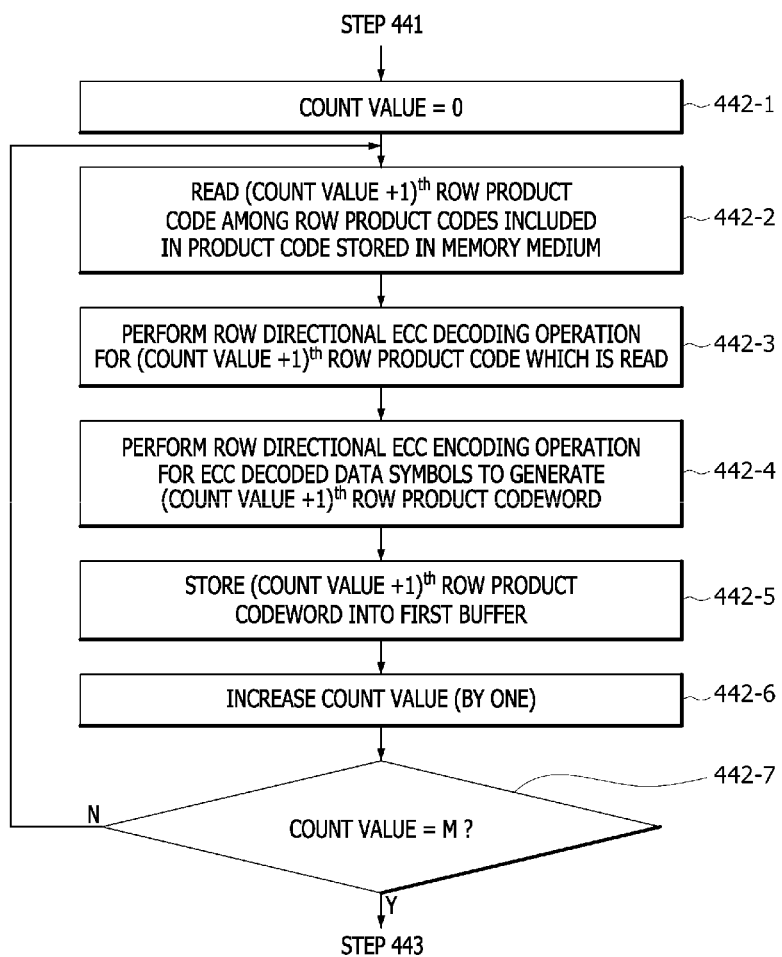
FIG. 7 is an example of a flowchart illustrating a process of generating row product codeword.
Figure 8:
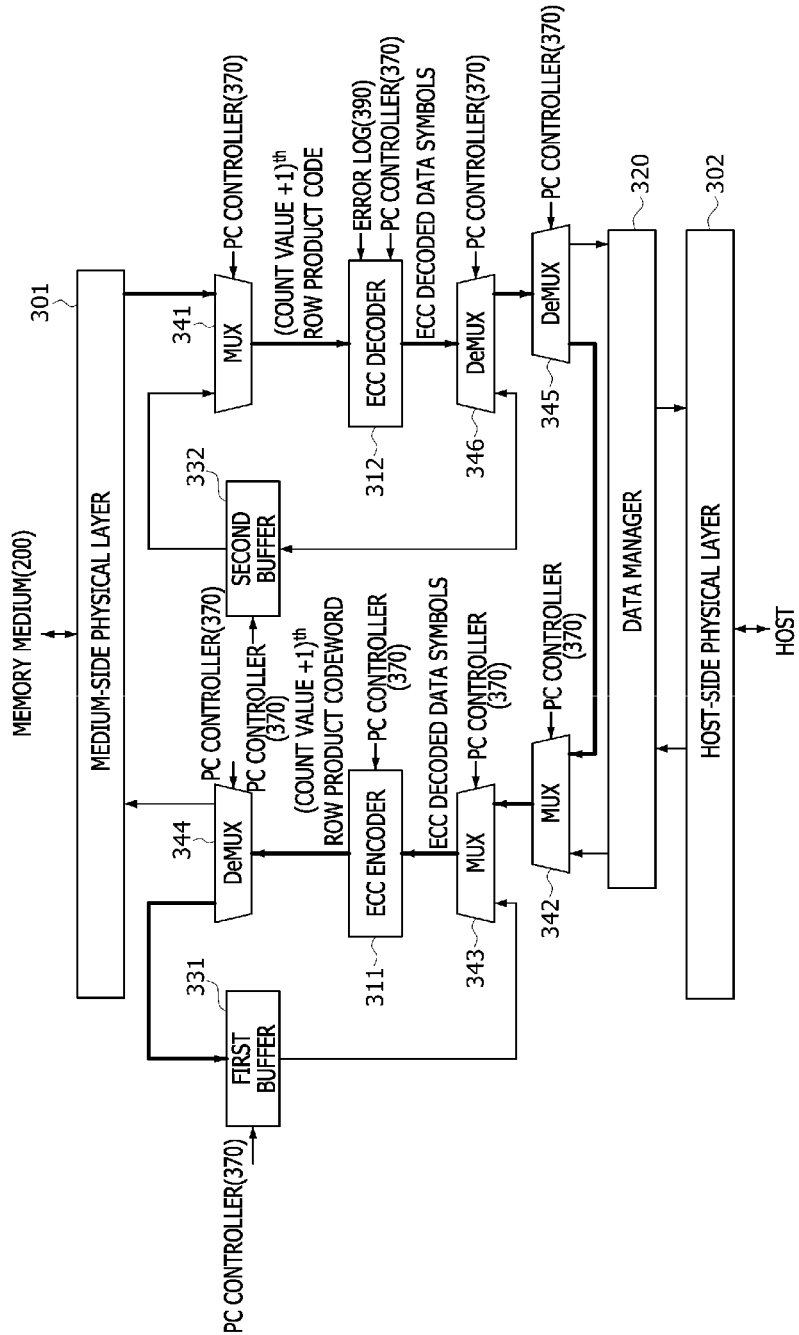
FIG. 8 illustrates data exchange paths in a memory controller of a memory system.
Figure 9:
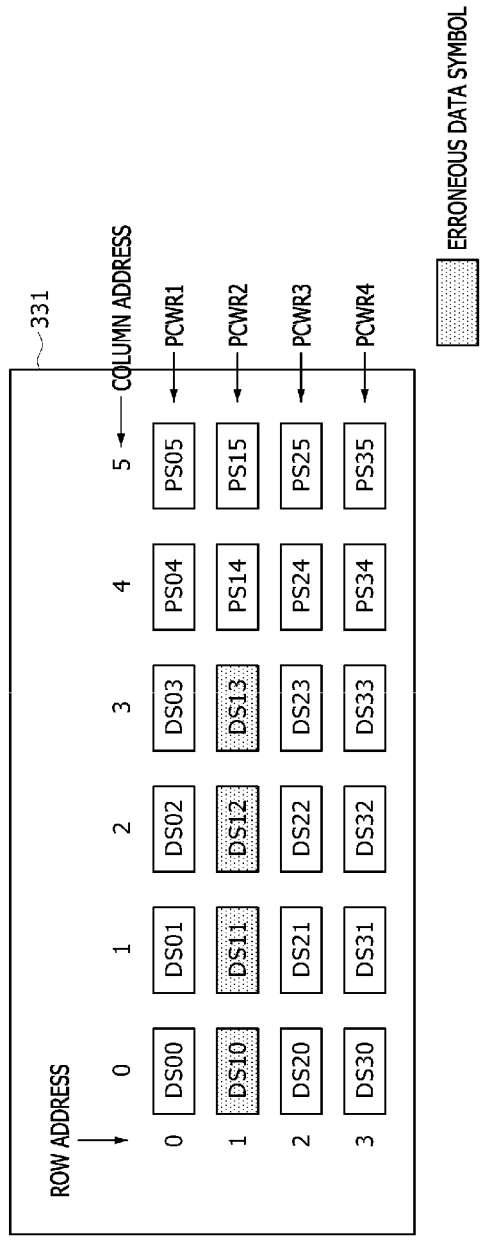
FIG. 9 illustrates an example of row product codewords stored in a first buffer included in a memory controller of a memory system.

FIG. 7 is an example of a flowchart illustrating a process of generating row product codewords during a second error correction mode of an error correction operation. FIG. 8 illustrates exemplary data exchange paths in the memory controller 300 of the memory system 100 shown in FIG. 1 while steps 442-2 to 442-5 of FIG. 7 are performed. FIG. 9 illustrates an example of row product codewords stored in the first buffer 331 included in the memory controller 300 of the memory system 100 shown in FIG. 1 after steps of generating the row product codewords shown in FIG. 7 are performed. In FIG. 8, the data exchange paths are denoted by bold arrows. Referring to FIGS. 7, 8 and 9, if the product code PC illustrated in FIG. 6 is generated as the error correction mode is changed from the first error correction mode into the second error correction mode, a count value of a counter may be reset to be zero '0' (see a step 442-1). In an embodiment, the counter may be included in the PC controller 370 of the memory controller 300. Alternatively, the counter may be included in the scheduler 360 of the memory controller 300. Among the row product codes included in the product code, the first row product code (PCR1 of FIG. 6) corresponds to a (count value+1)$^{th}$ row product code when the count value is zero and may be read out of the memory medium 200 (see a step 442-2). As illustrated in FIG. 8, the first row product code (PCR1 of FIG. 6) read out from the memory medium 200 may be inputted to the ECC decoder 312 through the medium-side physical layer 301 and the first multiplexer 341. The ECC decoder 312 may receive the first row product code (PCR1 of FIG. 6) from the memory medium 200 to perform a row directional ECC decoding operation on the first row product code (PCR1 of FIG. 6) (see a step 442-3). The data symbols DS00 to DS03 included in the first row may be decoded by the row directional ECC decoding operation and may be transmitted to the ECC encoder 311 through the third demultiplexer 346, the second demultiplexer 345, the second multiplexer 342 and the third multiplexer 343.

The ECC encoder 311 may perform a row directional ECC encoding operation on the decoded data symbols DS00 to DS03 to generate a (count value+1)$^{th}$ row product codeword, that is, a first row product codeword PCWR1 (see a step 442-4). The first row product codeword PCWR1 generated by the row directional ECC encoding operation performed at the step 442-4 may be stored in the first buffer 331 through the first demultiplexer 344 (see a step 442-5). After the step 442-5, the first row product codeword PCWR1 including the data symbols DS00 to DS03 and the parity symbols PS04 and PS05 may be stored in the first buffer 331, as illustrated in FIG. 9. Subsequently, the count value may be increased by one (see a step 442-6). Thus, the count value may be changed from zero into one. Next, whether the count value is equal to a number 'M' may be determined (see a step 442-7). The number 'M' may be defined as the number of the row product codes including the data symbol. Thus, in the present embodiment as shown in FIG. 6, the number 'M' may be set to be four. In this case, since it is determined at the step 442-7 that the count value is not equal to the number 'M' which is four corresponding to the number of the row product codes including any data symbols, the process goes back to the step 442-2. Since the count value has been increased to one from zero at the step 442-6, the (count value+1)$^{th}$ row product code becomes the second row product code PCR2 and thus, the steps 442-2 to 442-7 may be repeated for the second row product code PCR2. Similarly, the steps 442-2 to 442-7 may be repeated for each of the third and fourth row product codes PCR3 and PCR4 until the count value equals to the number 'M' that is four in the example shown in FIG. 6.

After the steps 442-2 to 442-5 are performed for each of the first to fourth row product codes PCR1 to PCR4, the first row product codeword PCWR1 having the data symbols DS00 to DS03 and the parity symbols PS04 and PS05, a second row product codeword PCWR2 having the data symbols DS10 to DS13 and the parity symbols PS14 and PS15, a third row product codeword PCWR3 having the data symbols DS20~DS23 and the parity symbols PS24 and PS25, and a fourth row product codeword PCWR4 having the data symbols DS30~DS33 and the parity symbols PS34 and PS35 may be stored in the first buffer 331 as illustrated in FIG. 9.

Figure 10:
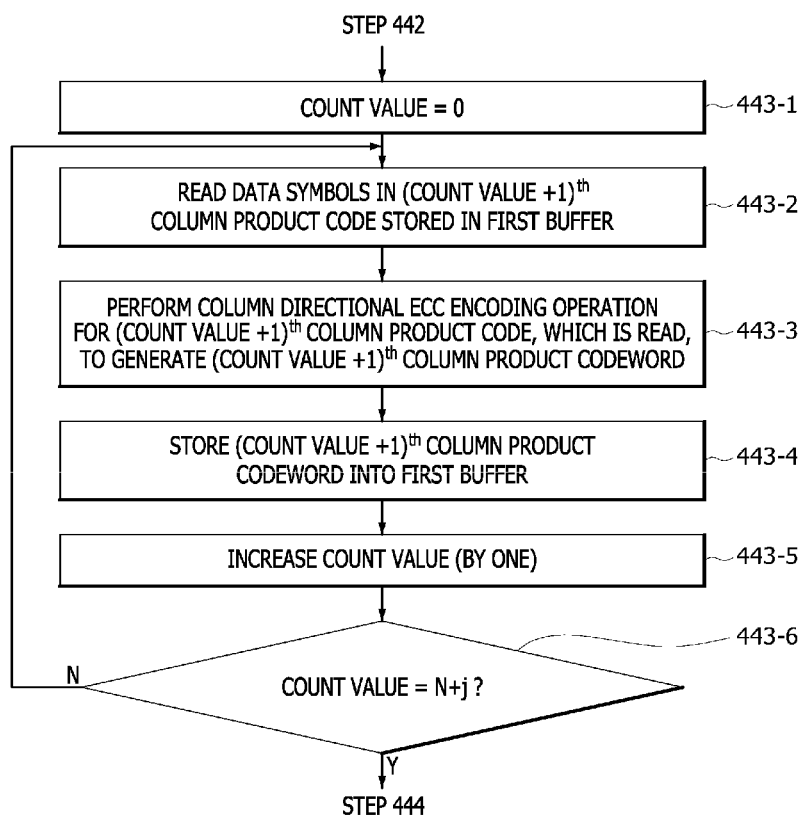
FIG. 10 is an example of a flowchart illustrating a process of generating column product codewords.
Figure 11:
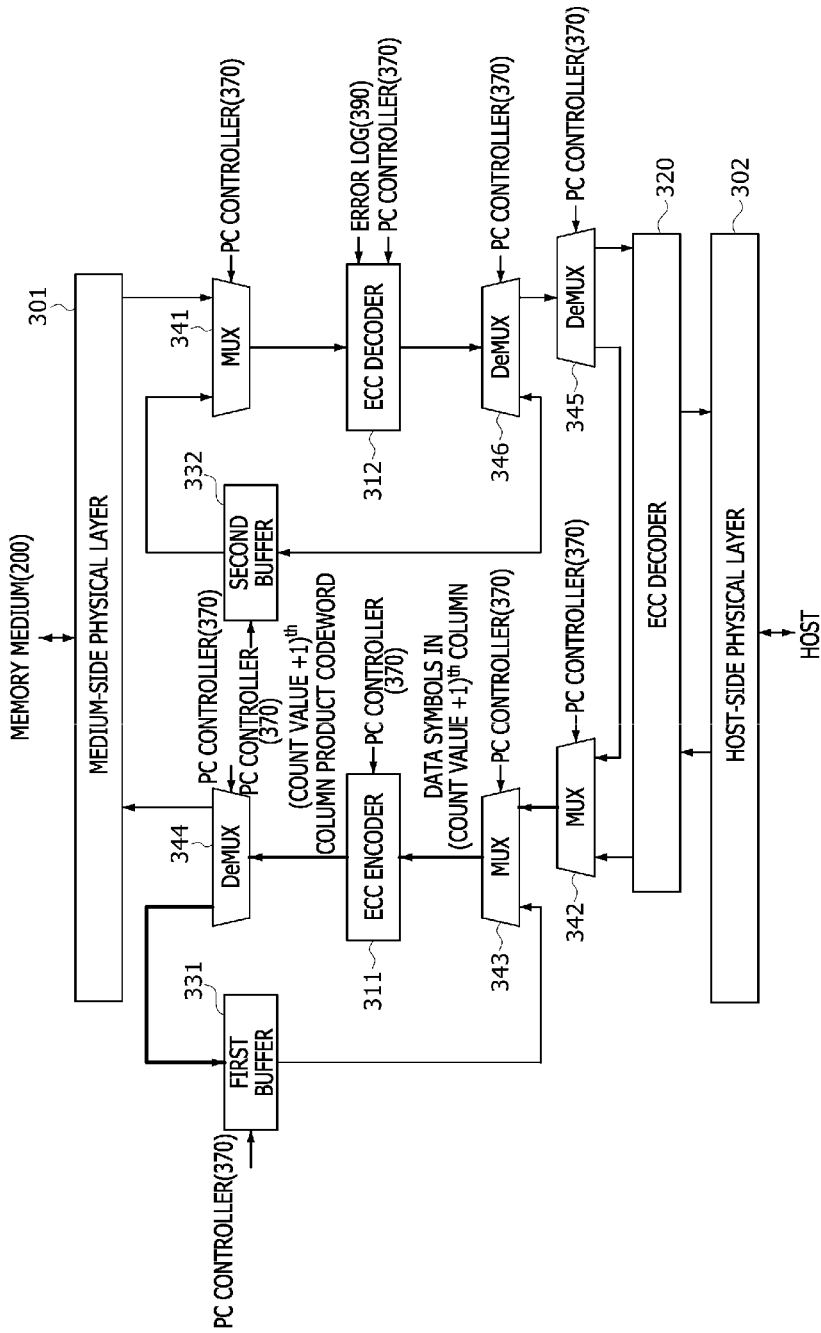
FIG. 11 illustrates data exchange paths in a memory controller of a memory system.
Figure 12:
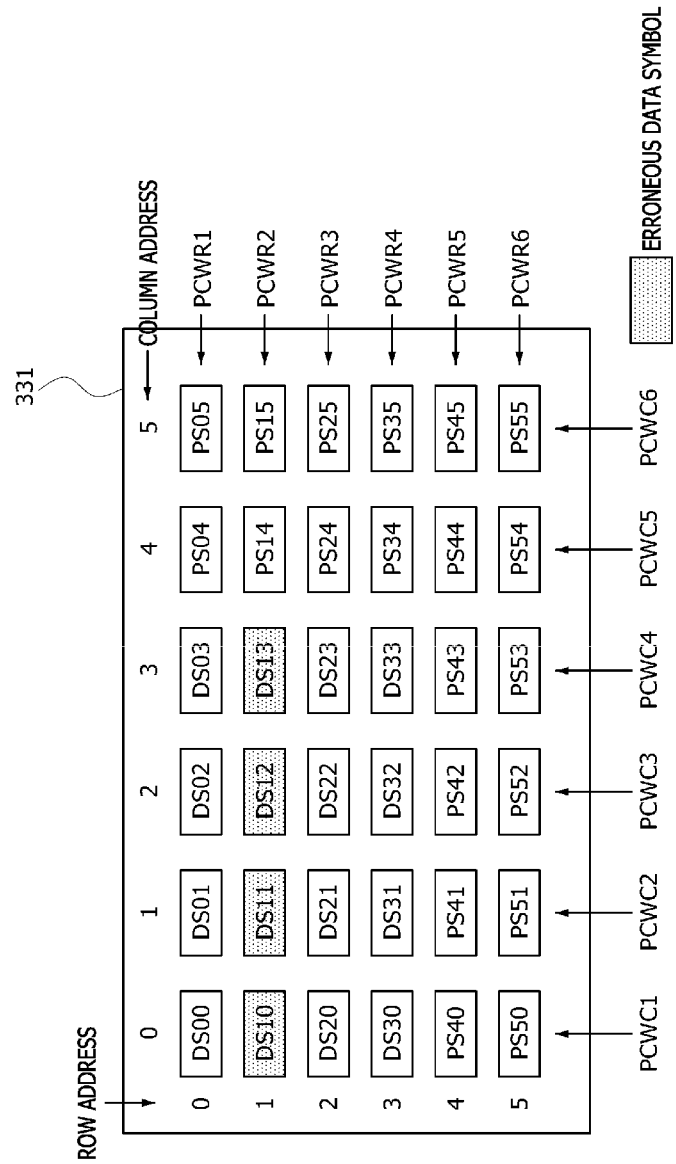
FIG. 12 illustrates an example of row product codewords and column product codewords stored in a first buffer included in a memory controller of a memory system.

FIG. 10 is an example of a flowchart illustrating a process of generating the column product codewords during a second error correction mode of an error correction operation. FIG. 11 illustrates exemplary data exchange paths in the memory controller 300 of the memory system 100 shown in FIG. 1 while steps 443-2 to 443-4 of FIG. 10 are performed. FIG. 12 illustrates an example of row product codewords and column product codewords stored in the first buffer 331 included in the memory controller 300 of the memory system 100 shown in FIG. 1 after the steps of generating the column product codewords in FIG. 10 are performed. In FIG. 11, the data exchange paths are denoted by bold arrows. Referring to FIGS. 5, 7 and 10, the step 442 of FIG. 5 terminates when the count value equals to the number 'M' and the process proceeds to the step 443-1 in which the count value of the counter may be reset to be zero '0'. The data symbols DS00 to DS30 of the first column product code corresponding to a (count value+1)$^{th}$ column product code stored in the first buffer 331 may be read out of the first buffer 331 (see a step 443-2). As illustrated in FIG. 11, the data symbols DS00 to DS30 of the first column product code, which is read out of the first buffer 331, may be inputted to the ECC encoder 311 through the third multiplexer 343. The ECC encoder 311 may perform a column directional ECC encoding operation for data symbols DS00 to DS30 of the first column product code and may output the ECC encoded data symbols as a first column product codeword PCWC1 (see a step 443-3). The first column product codeword PCWC1 outputted from the ECC encoder 311 may be stored into the first buffer 331 through the first demultiplexer 344 (see a step 443-4).

Subsequently, the count value may be increased by one (see a step 443-5). Therefore, the count value may be changed from zero into one. Next, whether the count value is equal to a number 'N+j' may be determined (see a step 443-6). The number 'N+j' may be defined as the number of all of the column product codes included in the product code (PC of FIG. 6). Thus, in the present embodiment as shown in FIG. 6, the number 'N+j' may be set to be six. Since it is determined at the step of 443-6 that the count value is not equal to the number 'N+j', e.g., six corresponding to the number of all of the column product codes included in the product code (PC of FIG. 6), the process goes back to the step 443-2. Since the count value has been increased by one and become to one from zero at the previous step 443-5, the (count value+1)$^{th}$ column becomes the second and thus, the steps 443-2 to 443-5 may be repeated for the second column product code PCC2. Similarly, the steps 443-2 to 443-5 may be repeated for each of the third to sixth column product codes PCC3 to PCC6 until the count value equals to 'N+J' that is six in the example shown in FIG. 6.

After the steps 443-2 to 443-5 for all of the first to sixth column product codes PCC1 to PCC6 included in the product code (PC of FIG. 6) are performed, the first to sixth column product codewords PCWC1 to PCWC6 may be stored in the first buffer 331 as illustrated in FIG. 12 together with the first to sixth row product codewords PCWC1 to PCWC6. The first to fourth row product codewords PCWR1 to PCWR4 may be generated during the row directional encoding operations on the first to fourth row product codes (PCR1 to PCR4 of FIG. 6), which are performed at the step 442-4 of FIG. 7. The fifth and sixth row product codewords PCWR5 and PCWR6 and the first to sixth column product codewords PCWC1 to PCWC6 may be generated during the column directional ECC encoding operations on the first to sixth column product codes (PCC1 to PCC6 of FIG. 6), which are performed at the step 443-3 of FIG. 10.

The fifth row product codeword PCWR5 may be configured to include parity symbols PS40 to PS45 sharing a row address of '4' with each other. The sixth row product codeword PCWR6 may be configured to include parity symbols PS50 to PS55 sharing a row address of '5' with each other. The first column product codeword PCWC1 may be configured to include data symbols DS00 to DS30 and parity symbols PS40 and PS50 that share a column address of '0' with each other. The second column product codeword PCWC2 may be configured to include data symbols DS01 to DS31 and parity symbols PS41 and PS51 that share a column address of '1' with each other. The third column product codeword PCWC3 may be configured to include data symbols DS02 to DS32 and parity symbols PS42 and PS52 that share a column address of '2' with each other. The fourth column product codeword PCWC4 may be configured to include data symbols DS03 to DS33 and parity symbols PS43 and PS53 that share a column address of '3' with each other. The fifth column product codeword PCWC5 may be configured to include parity symbols PS04 and PS54 that share a column address of '4' with each other. The sixth column product codeword PCWC6 may be configured to include parity symbols PS05 and PS55 that share a column address of '5' with each other.

Figure 13:
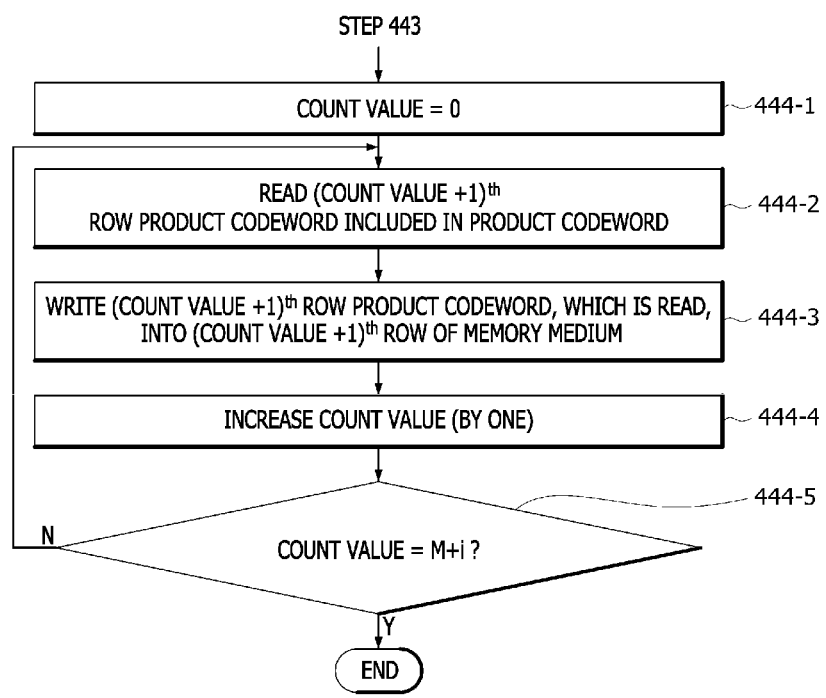
FIG. 13 is an example of a flowchart illustrating a process of the error correction operation shown in FIG. 5.
Figure 14:
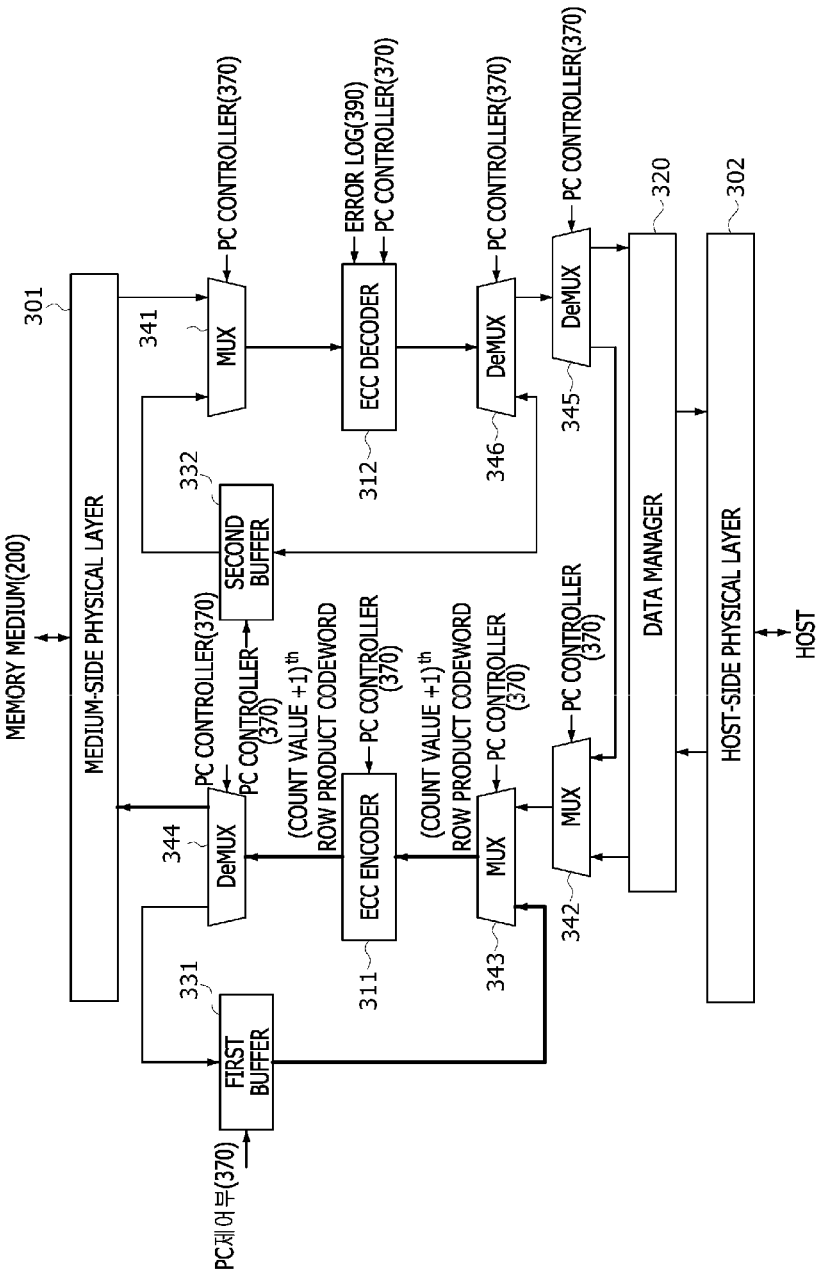
FIG. 14 illustrates data exchange paths occurring in a memory controller of a memory system.
Figure 15:
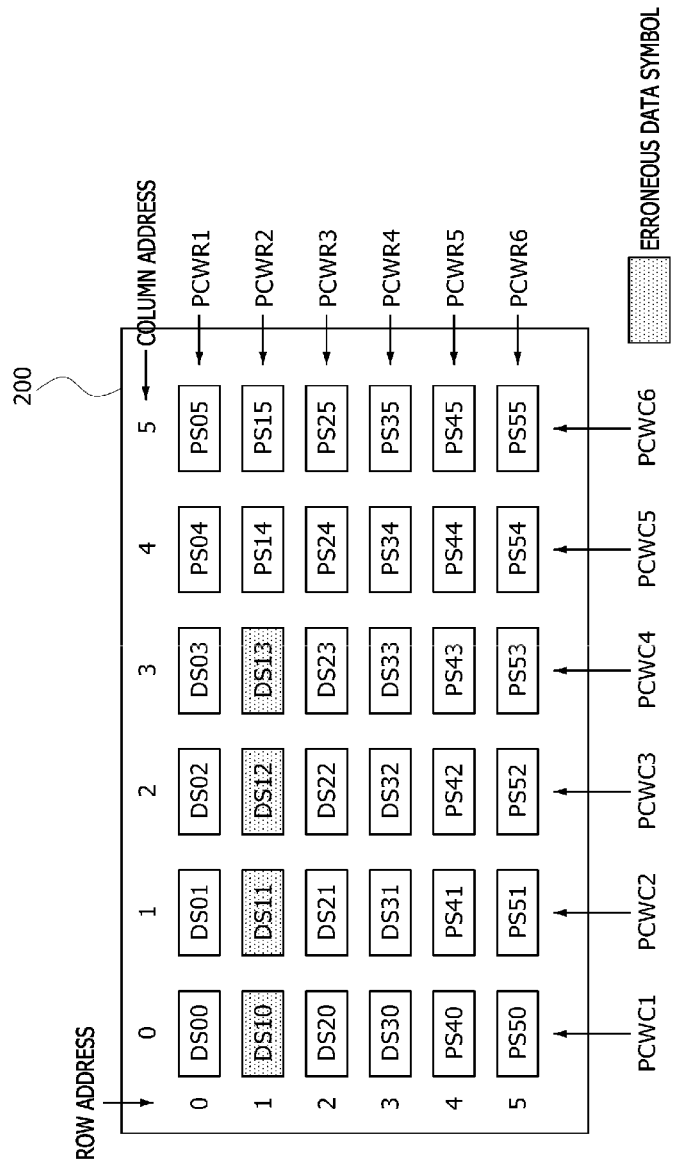
FIG. 15 illustrates an example of row product codewords and column product codewords stored in a memory medium included in a memory system.

FIG. 13 is an example of a flowchart illustrating a process of writing a product codeword generated during a second error correction of an error correction operation to a memory medium. FIG. 14 illustrates data exchange paths in the memory controller 300 of the memory system 100 shown in FIG. 1 while steps 444-2 and 444-3 of FIG. 13 are performed. FIG. 15 illustrates an example of row product codewords and column product codewords stored in the memory medium 200 included in the memory system 1 shown in FIG. 1 after the step 444 of FIG. 13 is performed. In FIG. 14, the data exchange paths are denoted by bold arrows. Referring to FIGS. 13, 14 and 15, the count value of the counter may be reset to be zero '0' (see a step 444-1). The first row product codeword PCWR1 corresponding to a (count value+1)$^{th}$ row product codeword stored in the first buffer 331 may be read out from the first buffer 331 (see a step 444-2). The data symbols DS00 to DS03 and the parity symbols PS04 and PS05 in the first row product codeword PCWR1 which is read out from the first buffer 331 may be written into a (count value+1)$^{th}$ row address (i.e., a first row address) of the memory medium 200 (see a step 444-3). Specifically, as illustrated in FIG. 14, the data symbols DS00 to DS03 and the parity symbols PS04 and PS05 of the first row product codeword PCWR1, which is outputted from the first buffer 331, may be inputted to the ECC encoder 311 through the third multiplexer 343. The PC controller 370 may apply a control signal for disabling an operation of the ECC encoder 311 and letting the ECC encoder 311 act as a transfer gate transferring the data symbols DS00 to DS03 and the parity symbols PS04 and PS05 to the ECC encoder 311. The data symbols DS00 to DS03 and the parity symbols PS04 and PS05 outputted from the ECC encoder 311 may be written into the memory medium 200 through the first demultiplexer 344 and the medium-side physical layer 301.

Subsequently, the count value may be increased by one (see a step 444-4). Therefore, the count value may be changed from zero into one. Next, whether the count value is equal to a number 'M+i' may be determined (see a step 444-5). The number 'M+i' may be defined as the number of all of the row product codewords. Thus, in the present embodiment as shown in FIG. 12, the number 'M+i' may be set to be six. Since it is determined at the step 444-5 that the count value is not equal to the number 'M+i,' which is six corresponding to the number of all of the row product codewords, the process proceeds to the step 444-2. Thus, the steps 444-2 to 444-5 may be repeated for the second row product codeword PCWR2. Similarly, the steps 444-2 to 444-5 may be repeated for each of the third to sixth row product codewords PCWR3 to PCWR6 until the count value equals to the number 'M+i' that is six in the example. After the steps 444-2 to 444-5 are performed for each of the first to sixth row product codewords PCWR1 to PCWR6 included in the product codeword, the product codeword including the first to sixth row product codewords PCWC1 to PCWC6 and the first to sixth row product codewords PCWR1 to PCWR6 may be stored in the memory medium 200 as illustrated in FIG. 15. Referring to FIG. 15, the product codeword stored in the memory medium 200 may have a same form as stored in the first buffer 331.

Figure 16:
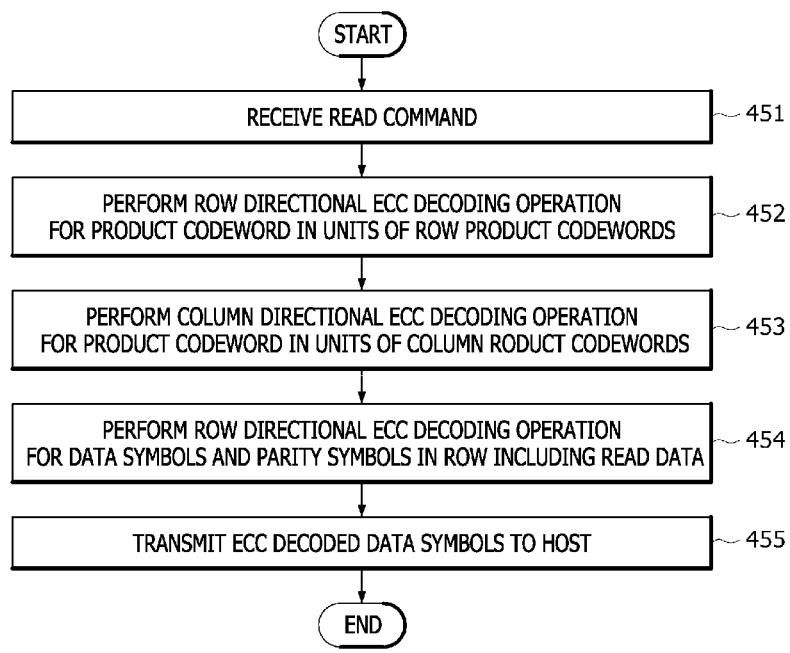
FIG. 16 is an example of a flowchart illustrating a read operation performed in a second error correction mode in response to a read command for data included in a product codeword.

FIG. 16 is an example of a flowchart illustrating a read operation performed in a second error correction mode in response to a read command for data included in a product codeword in the memory system 100 shown in FIG. 1. Referring to FIG. 16, at step 451, a read command for reading data included in a product codeword may be received. The read command may be outputted from the host. At step 452, the memory system 100 may perform a row directional ECC decoding operation for the product codeword. The row directional ECC decoding operation may be performed for each row product codeword included in the product codeword. Subsequently, at step 453, the memory system 100 may perform a column directional ECC decoding operation for the product codeword. The column directional ECC decoding operation may be performed for each column product codeword included in the product codeword. At step 454, the memory system 100 may perform the row directional ECC decoding operation for the row product codeword having a row address of the read data (see a step 454). Subsequently, the row directional ECC decoded data symbols generated at the step 454 may be transmitted to the host (see a step 455).

Figure 17:
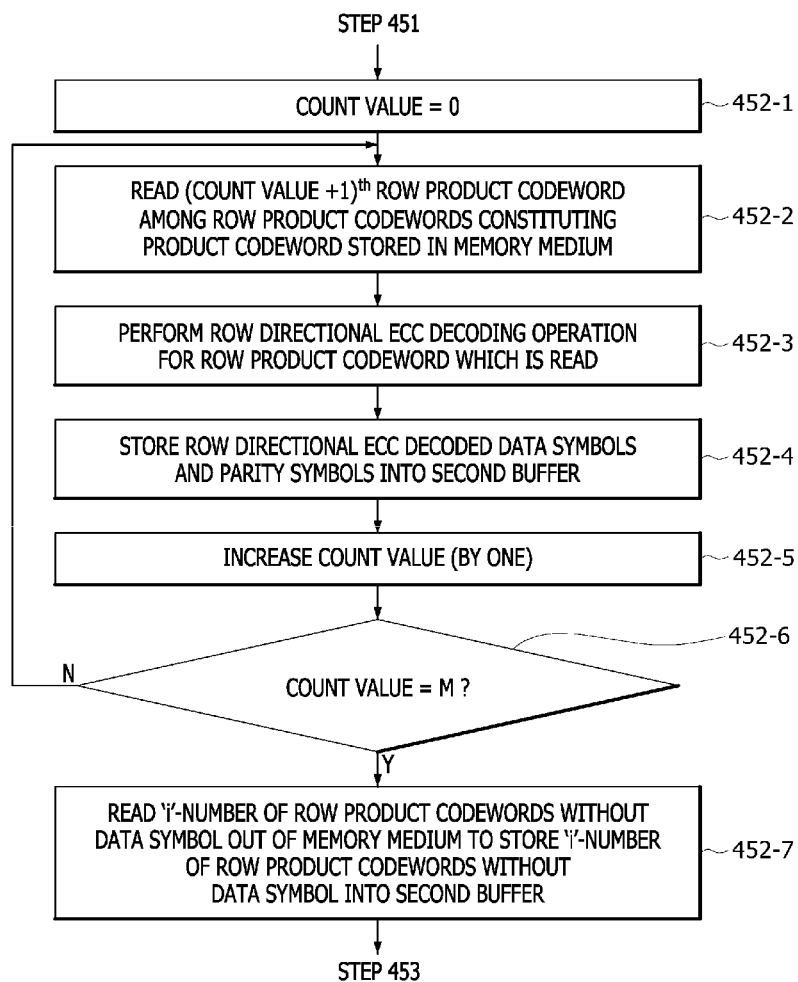
FIG. 17 is an example of a flowchart illustrating a step of performing a row directional ECC decoding operation during a read operation of FIG. 16.
Figure 18:
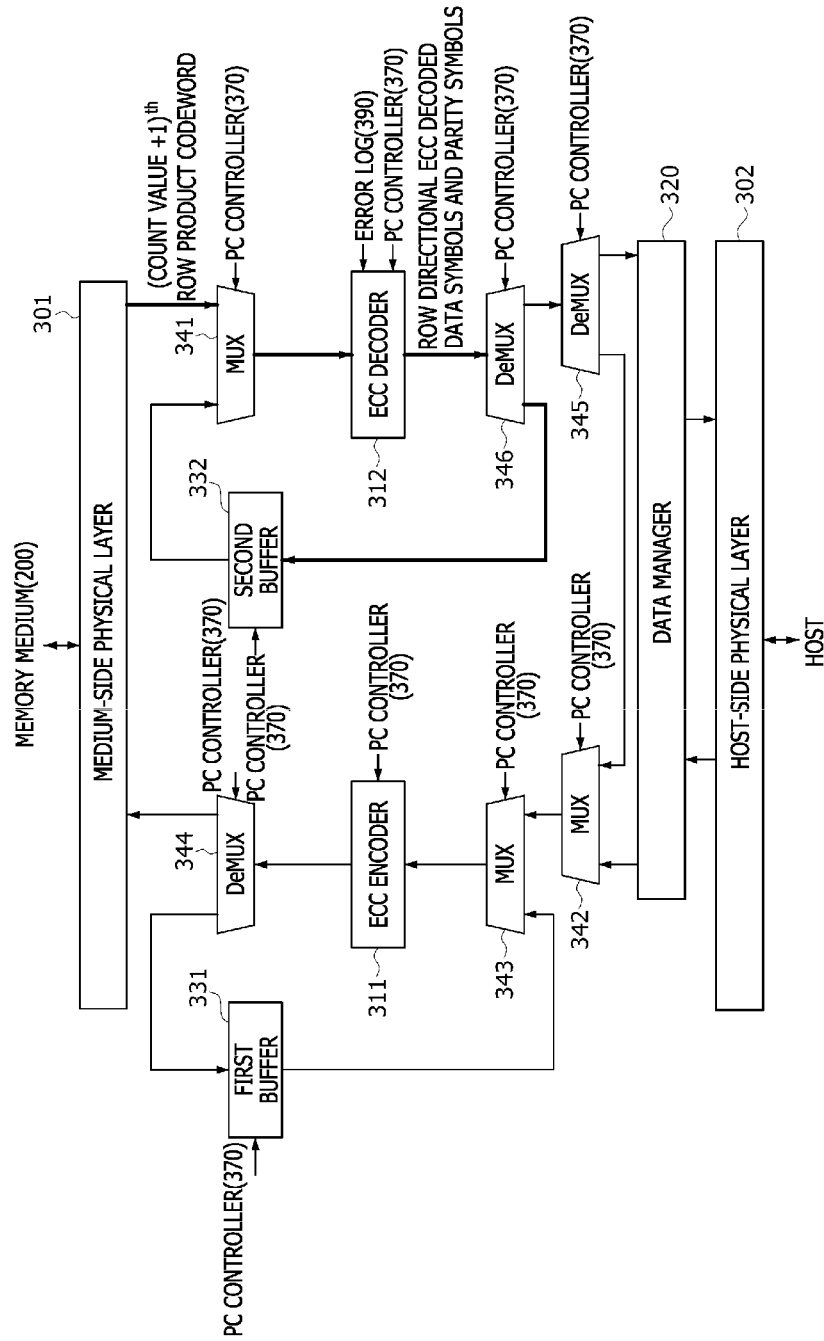
FIG. 18 illustrates exemplary data exchange paths of data in a memory system while steps 452-2 to 452-6 of FIG. 17 are performed.
Figure 19:
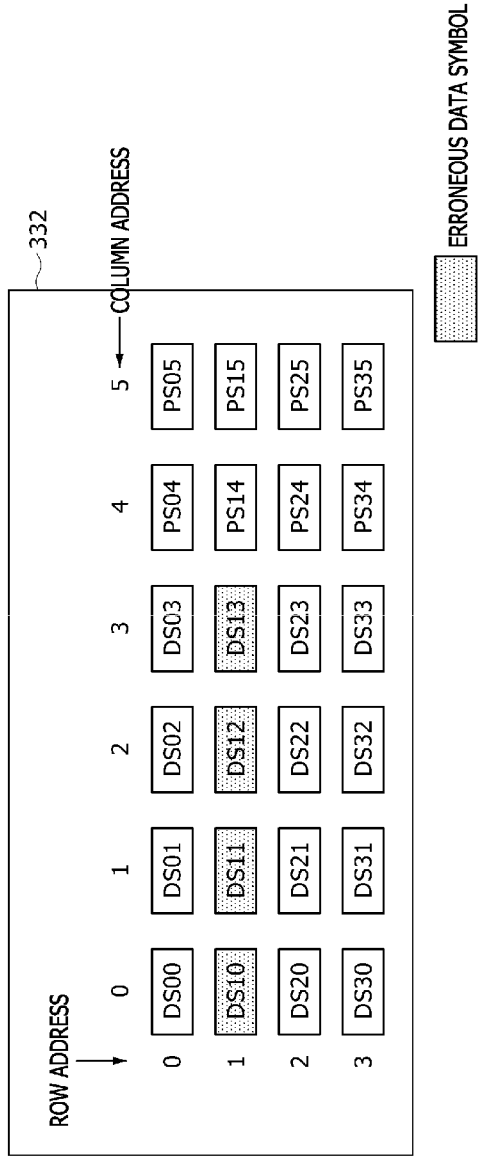
FIG. 19 illustrates an example of data symbols and parity symbols stored in a second buffer included in a memory system shown after steps 452-2 to 452-6 of FIG. 17 are performed.
Figure 20:
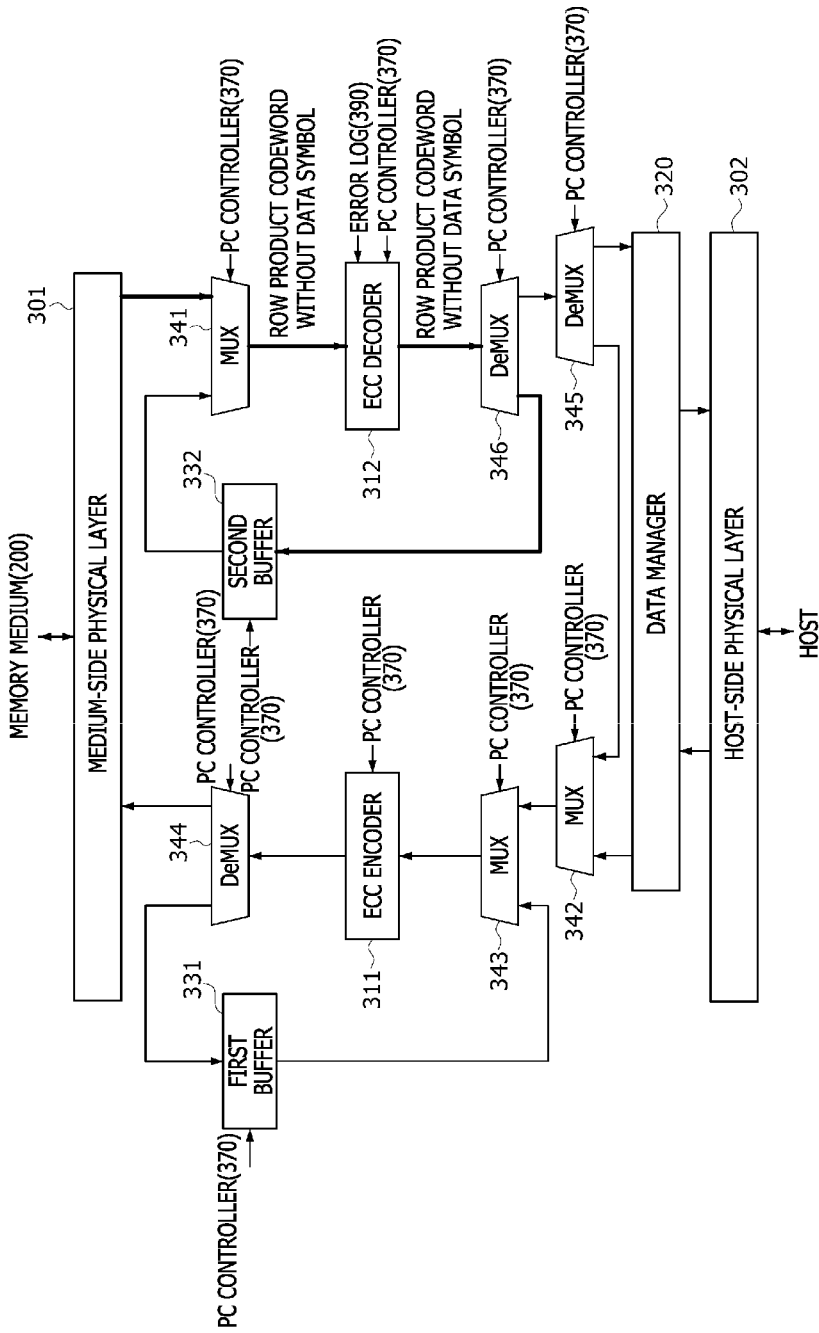
FIG. 20 illustrates exemplary data exchange paths of data in a memory system while a step 452-7 of FIG. 17 is performed.
Figure 21:
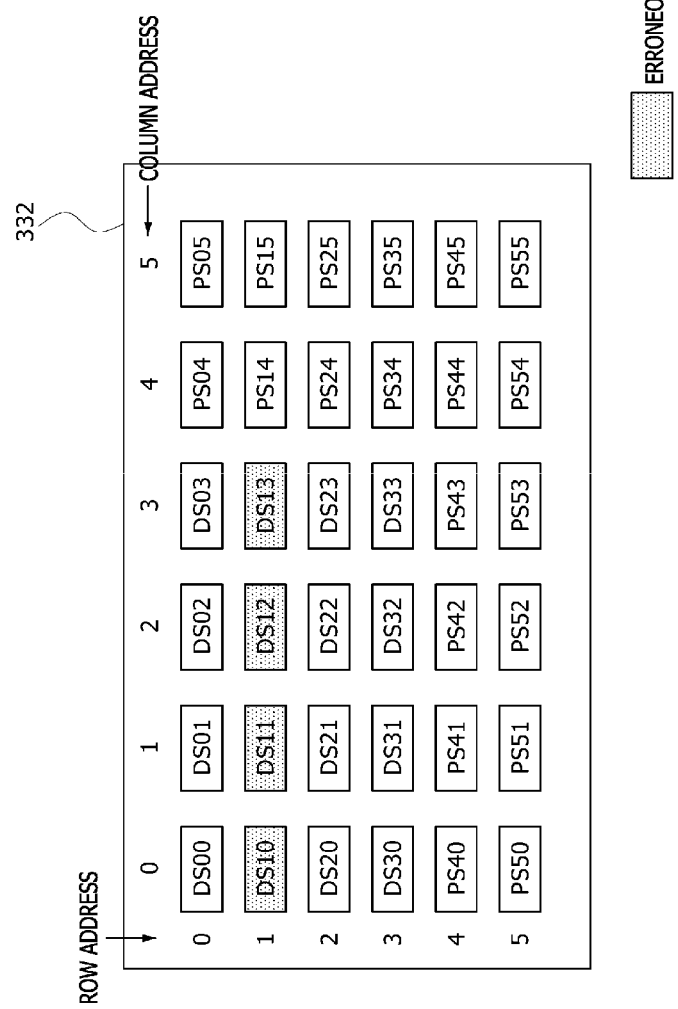
FIG. 21 illustrates an example of data symbols and parity symbols stored in a second buffer included in a memory system after a step 452-7 of FIG. 17 are performed.

FIG. 17 is an example of a flowchart illustrating a process of performing a row directional ECC decoding operation included in the read operation of FIG. 16. FIG. 18 illustrates data exchange paths in the memory controller 300 of the memory system 100 shown in FIG. 1 while steps 452-2 to 452-6 of FIG. 17 are performed. FIG. 19 illustrates an example of data symbols and parity symbols stored in the second buffer 332 included in the memory controller 300 after the steps 452-2 to 452-6 of FIG. 17 are performed. FIG. 20 illustrates data exchange paths in the memory controller 300 of the memory system 100 shown in FIG. 1 while a step 452-7 of FIG. 17 is performed. FIG. 21 illustrates an example of data symbols and parity symbols stored in the second buffer 332 included in the memory controller 300 after the step 452-7 of FIG. 17 is performed. In FIGS. 18 and 20, the data exchange paths are denoted by bold arrows. A read operation according to the present embodiment will be described in conjunction with a case that the read command for a second page having a row address of '1' is generated.

Referring to FIG. 17, after the read command is received at step 451, the count value may be reset to be zero '0' at step 452-1. At step 452-2, the memory controller 300 may read a (count value+1)$^{th}$ row product codeword among the product codeword stored in the memory medium 200. As illustrated in FIG. 18, the first row product codeword PCWR1, which is read out from the memory medium 200, may be inputted to the ECC decoder 312 through the medium-side physical layer 301 and the first multiplexer 341. At step 452-3, the ECC decoder 312 may perform a row directional ECC decoding operation for the first row product codeword PCWR1. Data symbols DS00 to DS03 and parity symbols PS04 and PS05 having a row address of '0' may be outputted from the ECC decoder 312 by the row directional ECC decoding operation performed at the step 452-3. The parity symbols PS04 and PS05 may not be removed for the error correction operation which is performed during a subsequent column directional ECC decoding operation. At step 452-4, the data symbols DS00 to DS03 and the parity symbols PS04 and PS05 outputted from the ECC decoder 312 may be stored into the second buffer 332 through the third demultiplexer 346.

Subsequently, the count value may be increased by one (see step 452-5). Therefore, the count value may be changed from zero into one. Next, it is determined at step 452-6 whether the count value is equal to a number 'M.'. As discussed, the number 'M' may be defined as the number of the row product codewords including the data symbol. The number 'M' may be set to be equal to the number of the row product codes including the data symbol. For the specific example of FIG. 12, the number 'M' may be set to be four. In this case, since it is determined at step 452-6 that the count value is not equal to 'M' which is four, the process goes back to step 452-2. Since the count value has been increased by one at the previous step 452-5, the (count value+1)$^{th}$ becomes two and the steps 452-2 to 452-6 may be performed for the second row product codeword PCWR2. Similarly, the steps 452-2 to 452-6 may be repeated for each of the third and fourth row product codewords PCWR3 and PCWR4 until the count value becomes to be equal to 'M.'

After the steps 452-2 to 452-6 are performed for each of the first to fourth row product codewords PCWR1 to PCWR4 that include the data symbols, the second buffer 332 may store the data symbols DS00 to DS03 and the parity symbols PS04 and PS05 that have a row address of '0', the data symbols DS10 to DS13 and the parity symbols PS14 and PS15 that have a row address of '1', the data symbols DS20 to DS23 and the parity symbols PS24 and PS25 that have a row address of '2', and the data symbols DS30 to DS33 and the parity symbols PS34 and PS35 that have a row address of '3' as illustrated in FIG. 19. Even though the row directional ECC decoding operation for the second row product codeword (PCWR2 of FIG. 15) is performed at the step 452-3 of FIG. 17, the second row product codeword PCWR2 may still have an uncorrected erroneous data because the number (i.e., '4') of the erroneous data symbols in the second row product codeword PCWR2 is greater than three that is an error correction capability of the ECC engine (310 of FIG. 1).

If it is determined at step 452-6 that the count value is equal to the number 'M' which is the number of row product codewords including the data symbol, which is four in the specific example of FIG. 12, it means that the ECC decoding operation has been completed for all of the row product codewords including at least one data symbol. In such a case, the row product codewords including the parity symbols only without the data symbol may be read from the memory medium 200 and may be stored into the second buffer 332 (see step 452-7). As illustrated in FIG. 20, the fifth row product codeword PCWR5 including only the parity symbols PS40 to PS45 may be read from the memory medium 200 through the medium-side physical layer 301 and the first multiplexer 341 and may be inputted to the ECC decoder 312. The ECC decoder 312 may be operated to skip the ECC decoding operation for the fifth row product codeword PCWR5 and may output the fifth row product codeword PCWR5 to the third demultiplexer 346. In order to prevent the ECC decoder 312 from performing the ECC decoding operation on the fifth row product codeword PCWR5, the PC controller 370 may output a control signal for disabling the ECC decoding operation of the ECC decoder 312 to the ECC decoder 312. The third demultiplexer 346 may transmit the fifth row product codeword PCWR5 to the second buffer 332, and the fifth row product codeword PCWR5 may be stored into the second buffer 332. The sixth row product codeword PCWR6 in the memory medium 200 may also be stored into the second buffer 332 by the same way as described in conjunction with the fifth row product codeword PCWR5. As a result, after the step 452-7 of FIG. 17 is performed, the parity symbols PS40 to PS45 having a row address of '4' and the parity symbols PS50 to PS55 having a row address of '5' may be additionally stored into the second buffer 332 as illustrated in FIG. 21.

Figure 22:
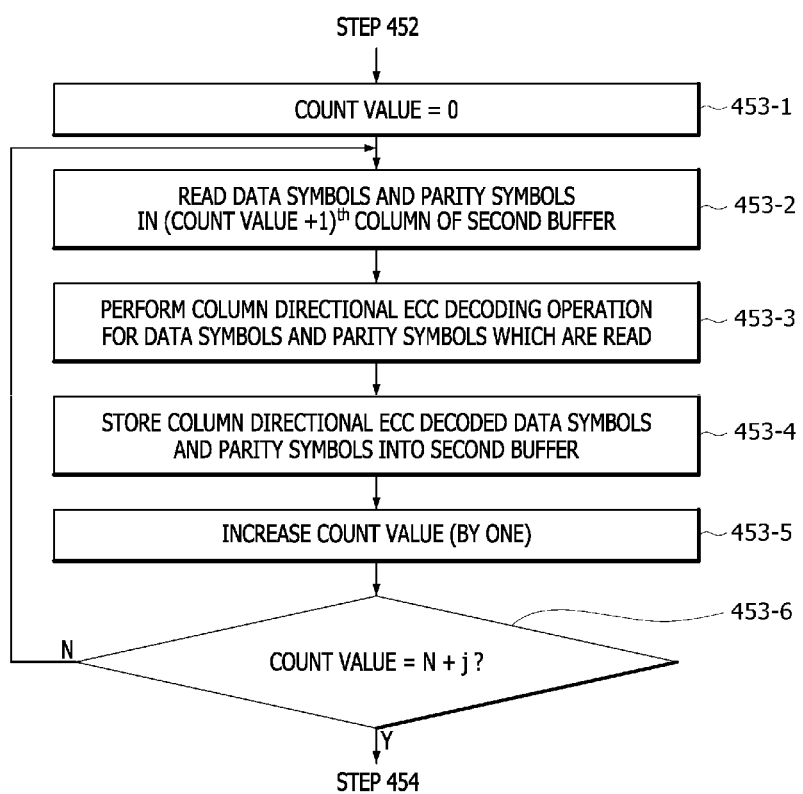
FIG. 22 is an example of a flowchart illustrating a step 453 of FIG. 16.
Figure 23:
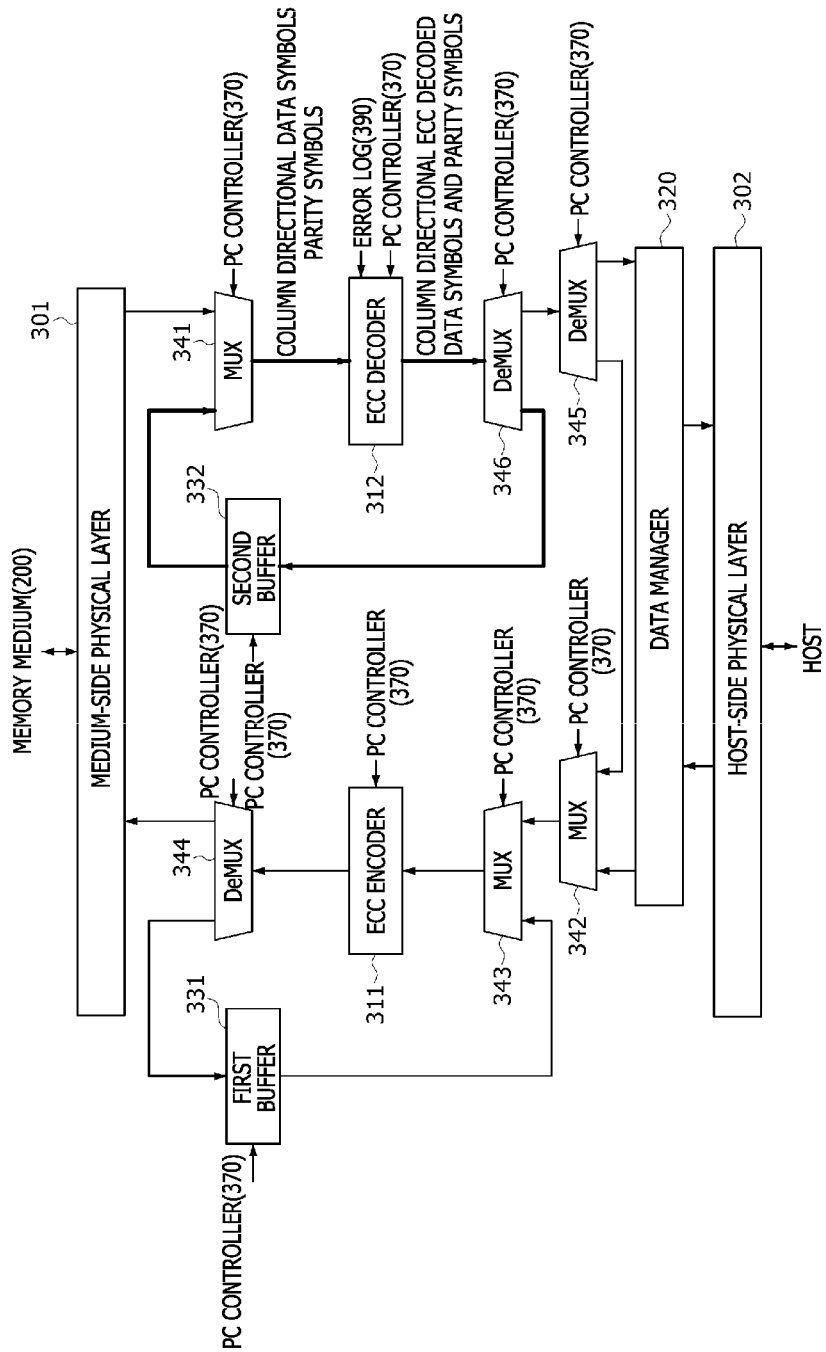
FIGS. 23 and 24 illustrate exemplary data exchange paths in a memory controller of a memory system while steps 453-2 to 453-6 of FIG. 22 are performed.
Figure 24:
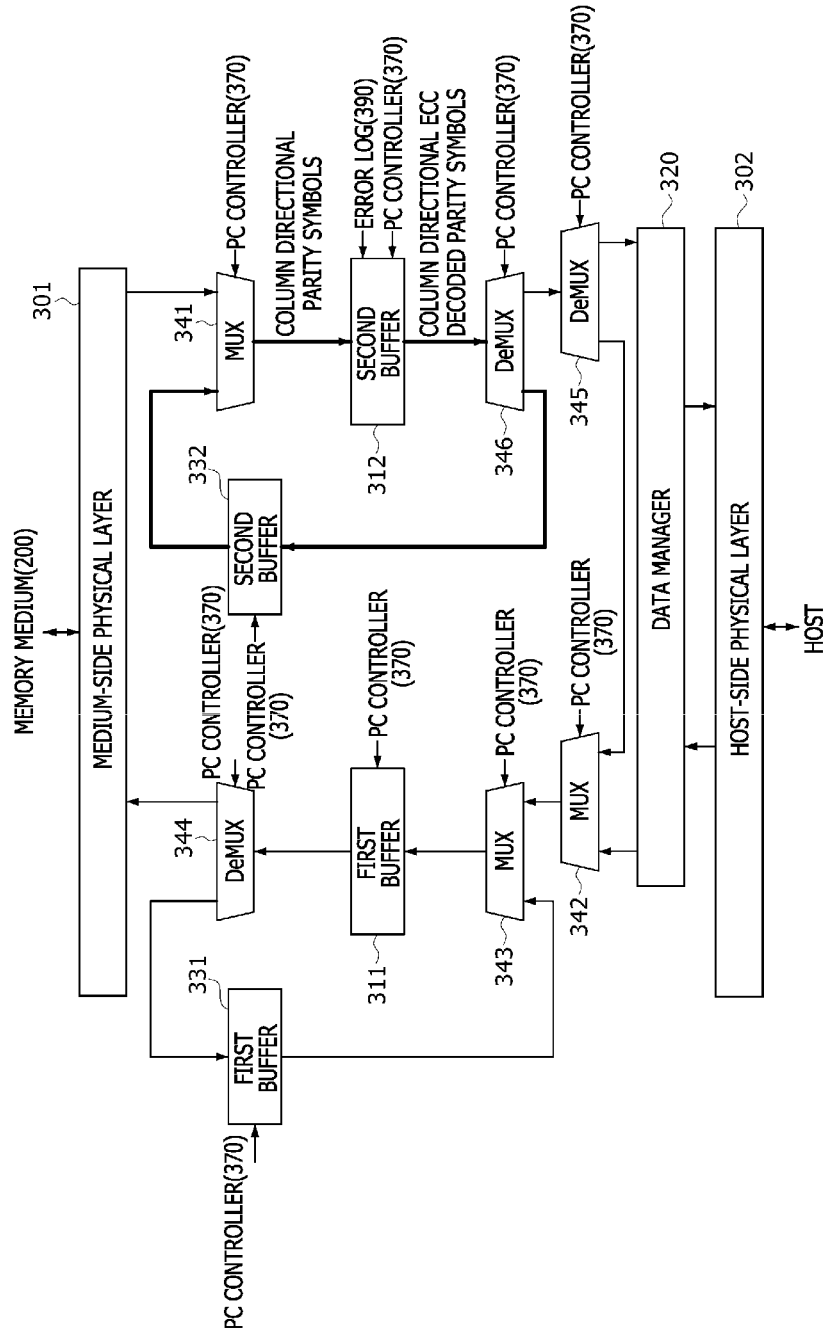

FIG. 22 is an example of a flowchart illustrating a process of performing a column directional ECC decoding operation in the read operation of FIG. 16. FIGS. 23 and 24 illustrate data exchange paths in the memory controller 300 of the memory system 100 shown in FIG. 1 while steps 453-2 to 453-6 of FIG. 22 are performed. FIGS. 25 to 30 illustrate data symbols and parity symbols stored in the second buffer 332 included in the memory system 100 of FIG. 1 after the steps 452-2 to 452-6 of FIG. 17 are performed. In FIGS. 23 and 24, the data exchange paths are denoted by bold arrows. Referring to FIG. 22, after the step 452 of FIG. 16 is performed, the count value may be reset to be zero at step 453-1. The memory controller 300 may read the data symbols DS00 to DS30 and the parity symbols PS40 and PS50 of the first column product codeword corresponding to a (count value+1)$^{th}$ column product codeword stored in the second buffer 332 (see a step 453-2).

Figure 25:
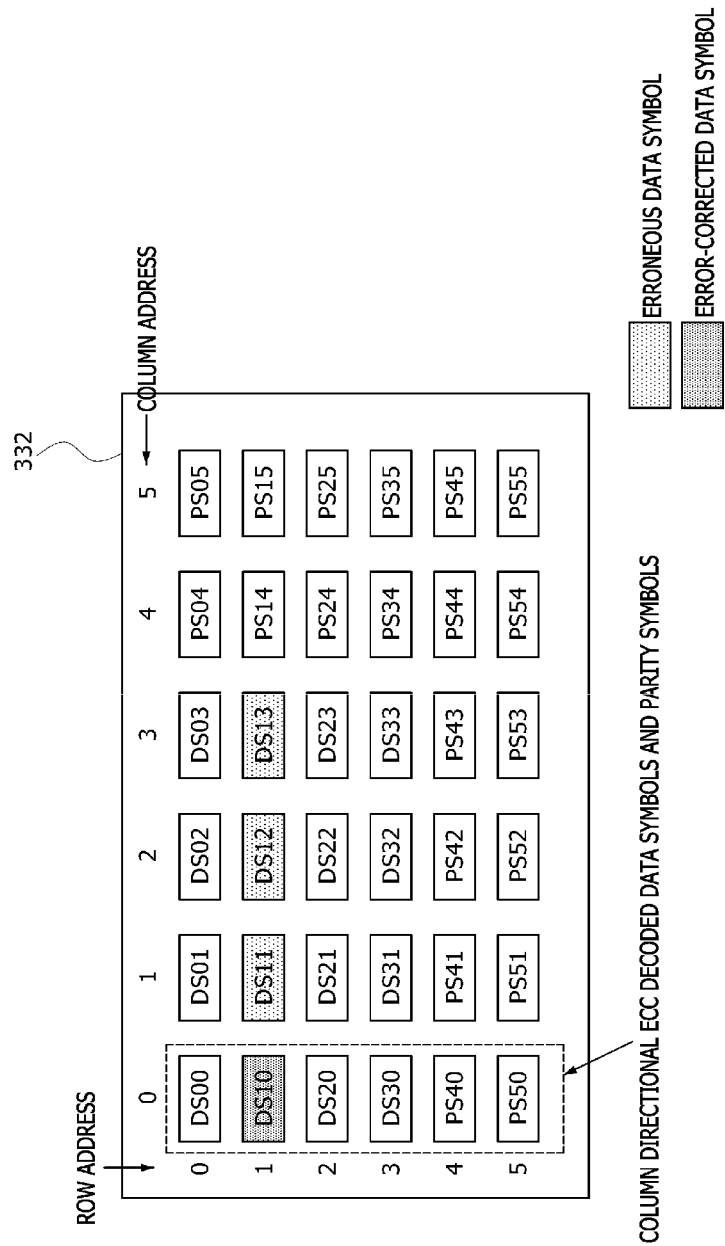
FIGS. 25 to 30 illustrate examples of data symbols and parity symbols stored in a second buffer included in a memory system after steps 452-2 to 452-6 of FIG. 17 are performed.

As illustrated in FIG. 23, the data symbols DS00 to DS30 and the parity symbols PS40 and PS50, which are read out from the second buffer 332, may be inputted to the ECC decoder 312 through the first multiplexer 341. The ECC decoder 312 may perform a column directional ECC decoding operation for the data symbols DS00 to DS30 and the parity symbols PS40 and PS50 to output column directional ECC decoded data symbols and parity symbols (see step 453-3). The column directional ECC decoded data symbols and parity symbols outputted from the ECC decoder 312 may be stored into the second buffer 332 through the third demultiplexer 346 (see step 453-4). As illustrated in FIG. 25, the column directional ECC decoded data symbols DS00 to DS30 and parity symbols PS40 and PS50 may be stored into the second buffer 332. As shown in FIG. 25, there exists one erroneous data symbol DS10 among the data symbols DS00 to DS30, and thus, the number of erroneous data symbols decoded by the column directional ECC decoding operation may be one which is less than the error correction capability of the ECC engine (310 of FIG. 1). Thus, during the column directional ECC decoding operation performed at the step 453-3 of FIG. 22, the data symbol DS10 corresponding to the erroneous data symbol may be corrected using the parity symbols PS40 and PS50 and the corrected data symbol DS10 may be stored in the second buffer 332. This is different from the row direction ECC decoding operation in which the erroneous data symbol, DS10, included in the second row product codeword is not corrected.

Figure 26:
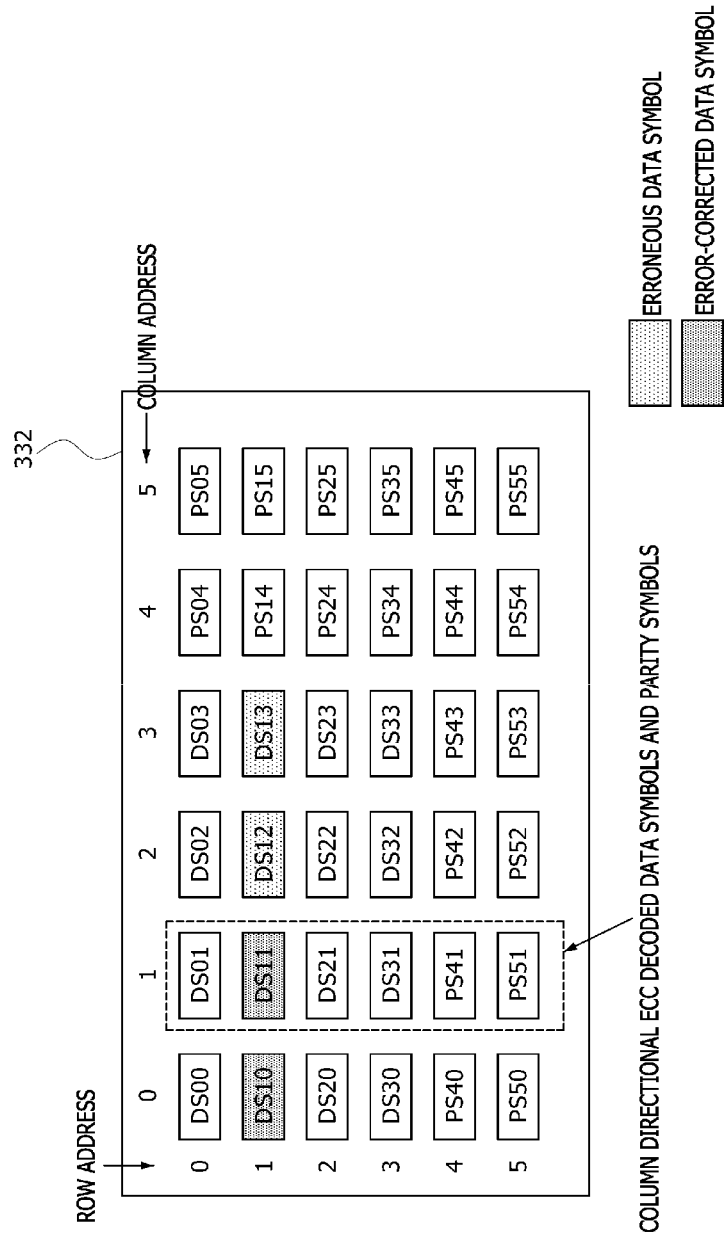

Subsequently, the count value may be increased by one at step 453-5. Therefore, the count value may be changed from zero into one. Next, it is determined at step 453-6 whether the count value is equal to a number 'N+j.' The number 'N+j' may be defined as the number of all of the column product codewords included in the product codeword. The number 'N+j' may be equal to the number of all of the column product codes included in the product code PC. Accordingly, the number 'N+j' may be set to be six. Since it is determined at step 453-6 that the count value is not equal to the number 'N+j,' for example, six in this specific example, the process goes back to step 453-2. Since the count value has been increased by one at the previous step 453-5, the (count value+1)$^{th}$ becomes 2. Thus, the data symbols DS01 to DS31 and the parity symbols PS41 and PS51 in the second column may be read out from the second buffer 332 (see step 453-2). As illustrated in FIG. 23, the data symbols DS01 to DS31 and the parity symbols PS41 and PS51, which are read out from the second buffer 332, may be inputted to the ECC decoder 312 through the first multiplexer 341. The ECC decoder 312 may perform a column directional ECC decoding operation for the data symbols DS01 to DS31 and the parity symbols PS41 and PS51 to output column directional ECC decoded data symbols and parity symbols (see step 453-3). The column directional ECC decoded data symbols and parity symbols outputted from the ECC decoder 312 may be stored into the second buffer 332 through the third demultiplexer 346 (see step 453-4). As illustrated in FIG. 26, the column directional ECC decoded data symbols DS01 to DS31 and parity symbols PS41 and PS51 may be stored into the second buffer 332. As shown in FIG. 26, there exists one erroneous data symbol DS11 among the data symbols DS01 to DS51, and thus, the number of erroneous data symbols to be decoded by the column directional ECC decoding operation may be one which is less than the error correction capability of the ECC engine (310 of FIG. 1). Thus, during the column directional ECC decoding operation performed at the step 453-3 of FIG. 22, the data symbol DS11 corresponding to the erroneous data symbol may be corrected using the parity symbols PS41 and PS51 and the corrected data symbol DS11 may be stored in the second buffer 332.

Figure 27:
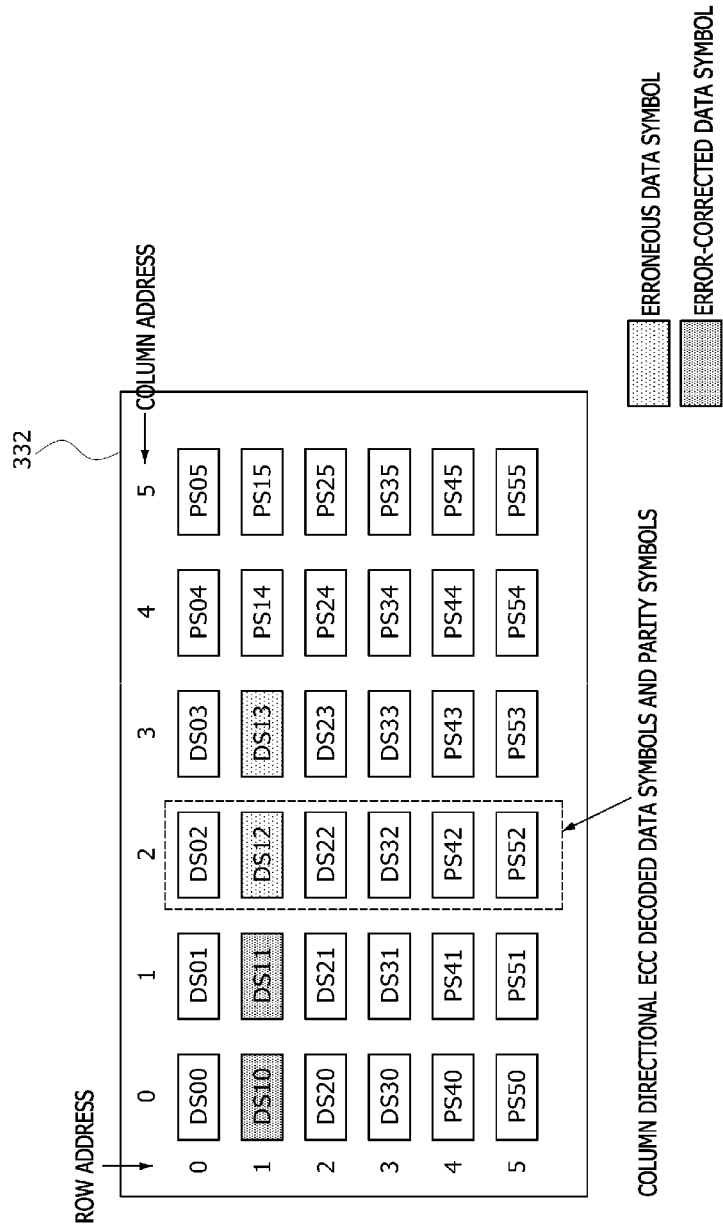

Subsequently, the count value may be increased by one (see the step 453-5). Therefore, the count value may be changed from one into two. Next, it is determined at step 453-6 whether the count value is equal to the number 'N+j,' which is six in this specific example. Since it is determined at step 453-6 that the count value is not equal to six corresponding to the number 'N+j,' the process proceeds to step 453-2. Since the count value has been increased by one at the previous step 453-5, the (count value+1)$^{th}$ becomes three. Thus, the data symbols DS02 to DS32 and the parity symbols PS42 and PS52 in the third column corresponding to the (count value+1)$^{th}$ column may be read out from the second buffer 332 (see step 453-2). As illustrated in FIG. 23, the data symbols DS02 to DS32 and the parity symbols PS42 and PS52, which are read out from the second buffer 332, may be inputted to the ECC decoder 312 through the first multiplexer 341. The ECC decoder 312 may perform a column directional ECC decoding operation for the data symbols DS02 to DS32 and the parity symbols PS42 and PS52 to output column directional ECC decoded data symbols and parity symbols (see step 453-3). The column directional ECC decoded data symbols and parity symbols outputted from the ECC decoder 312 may be stored into the second buffer 332 through the third demultiplexer 346 (see step 453-4). As illustrated in FIG. 27, the column directional ECC decoded data symbols DS02 to DS32 and parity symbols PS42 and PS52 may be stored into the second buffer 332. As shown in FIG. 27, there exists one erroneous data symbol DS12 among the data symbols DS02 to DS52, and thus, the number of erroneous data symbols to be decoded by the column directional ECC decoding operation may be one which is less than the error correction capability of the ECC engine (310 of FIG. 1). Thus, during the column directional ECC decoding operation performed at the step 453-3 of FIG. 22, the data symbol DS12 corresponding to the erroneous data symbol may be corrected using the parity symbols PS42 and PS52 and the corrected data symbol DS12 may be stored in the second buffer 332.

Figure 28:
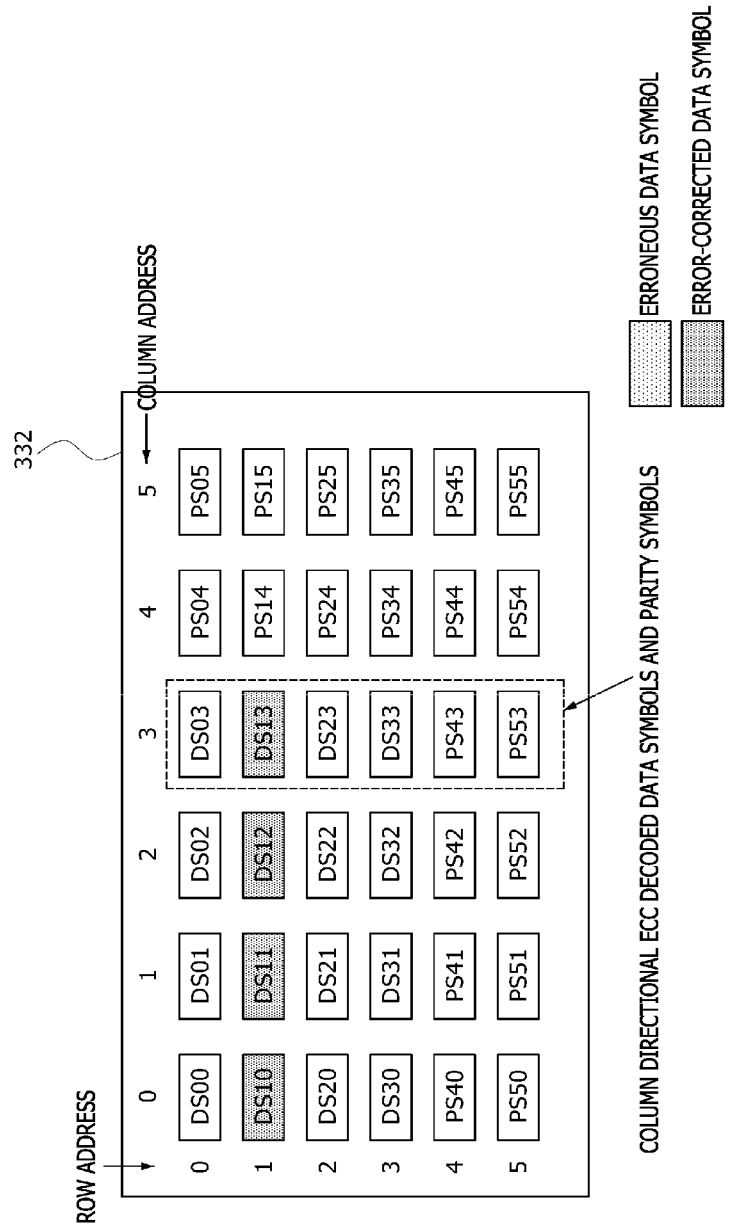

Subsequently, the count value may be increased by one (see the step 453-5). Therefore, the count value may be changed from two into three. Next, it is determined at step 435-6 whether the count value is equal to the number 'N+j,' which is six in this specific example. Since it is determined at step 453-6 that the count value is not equal to six corresponding to the number 'N+j,' the process proceeds to step 453-2. The count value has been increased by one at the previous step 453-5 such that the (count value+1)$^{th}$ becomes four. Thus, the data symbols DS03 to DS33 and the parity symbols PS43 and PS53 in the fourth column corresponding to the (count value+1)$^{th}$ column may be read out from the second buffer 332 (see step 453-2). As illustrated in FIG. 23, the data symbols DS03~DS33 and the parity symbols PS43 and PS53, which are read out from the second buffer 332, may be inputted to the ECC decoder 312 through the first multiplexer 341. The ECC decoder 312 may perform a column directional ECC decoding operation for the data symbols DS03 to DS33 and the parity symbols PS43 and PS53 to output column directional ECC decoded data symbols and parity symbols (see step 453-3). The column directional ECC decoded data symbols and parity symbols outputted from the ECC decoder 312 may be stored into the second buffer 332 through the third demultiplexer 346 (see the step 453-4). As illustrated in FIG. 28, the column directional ECC decoded data symbols DS03 to DS33 and parity symbols PS43 and PS53 may be stored into the second buffer 332. As shown in FIG. 28, there exists one erroneous data symbol DS12 among the data symbols DS03 to DS53, and thus, the number of erroneous data symbols to be decoded by the column directional ECC decoding operation may be one which is less than the error correction capability of the ECC engine (310 of FIG. 1). Thus, during the column directional ECC decoding operation performed at the step 453-3 of FIG. 22, the data symbol DS13 corresponding to the erroneous data symbol may be corrected using the parity symbols PS43 and PS53 and the corrected data symbol DS13 may be stored in the second buffer 332.

Figure 29:
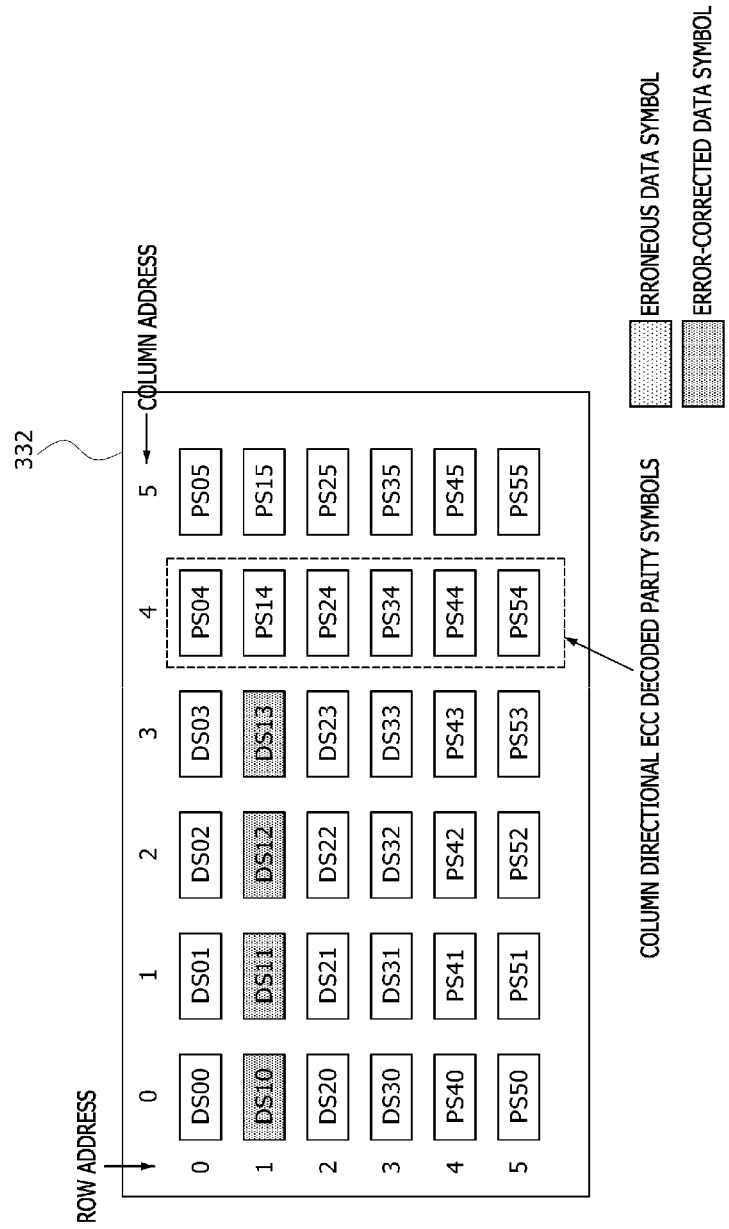

Subsequently, the count value may be increased by one (see the step 453-5). Therefore, the count value may be changed from three into four. Next, it is determined at step 435-6 whether the count value is equal to the number 'N+j,' which is six in this specific example. Since it is determined at step 453-6 that the count value is not equal to six corresponding to the number 'N+j,' the process proceeds to step 453-2. Since the count value has been increased by one at the previous step 453-5, the (count value+1)$^{th}$ becomes five. Thus, the parity symbols PS04 to PS54 in the fifth column corresponding to the (count value+1)$^{th}$ column may be read out from the second buffer 332 (see step 453-2). As illustrated in FIG. 24, the parity symbols PS04 to PS54, which are read out from the second buffer 332, may be inputted to the ECC decoder 312 through the first multiplexer 341. The ECC decoder 312 may perform a column directional ECC decoding operation for the parity symbols PS04 to PS54 to output column directional ECC decoded parity symbols (see step 453-3). The column directional ECC decoded parity symbols outputted from the ECC decoder 312 may be stored into the second buffer 332 through the third demultiplexer 346 (see step 453-4). As illustrated in FIG. 29, the column directional ECC decoded parity symbols PS04 to PS54 may be stored into the second buffer 332. FIG. 29 shows that there exists no erroneous parity symbol in the fifth column. Even when errors are generated in some of the parity symbols PS04 to PS34 before the count value is changed into four, as long as the number of the erroneous parity symbols among the parity symbols PS04 to PS34 is less than the error correction capability of the ECC engine (310 of FIG. 1), the erroneous parity symbols may be corrected using the parity symbols PS44 and PS54 during the column directional ECC decoding operation step 453-3.

Figure 30:
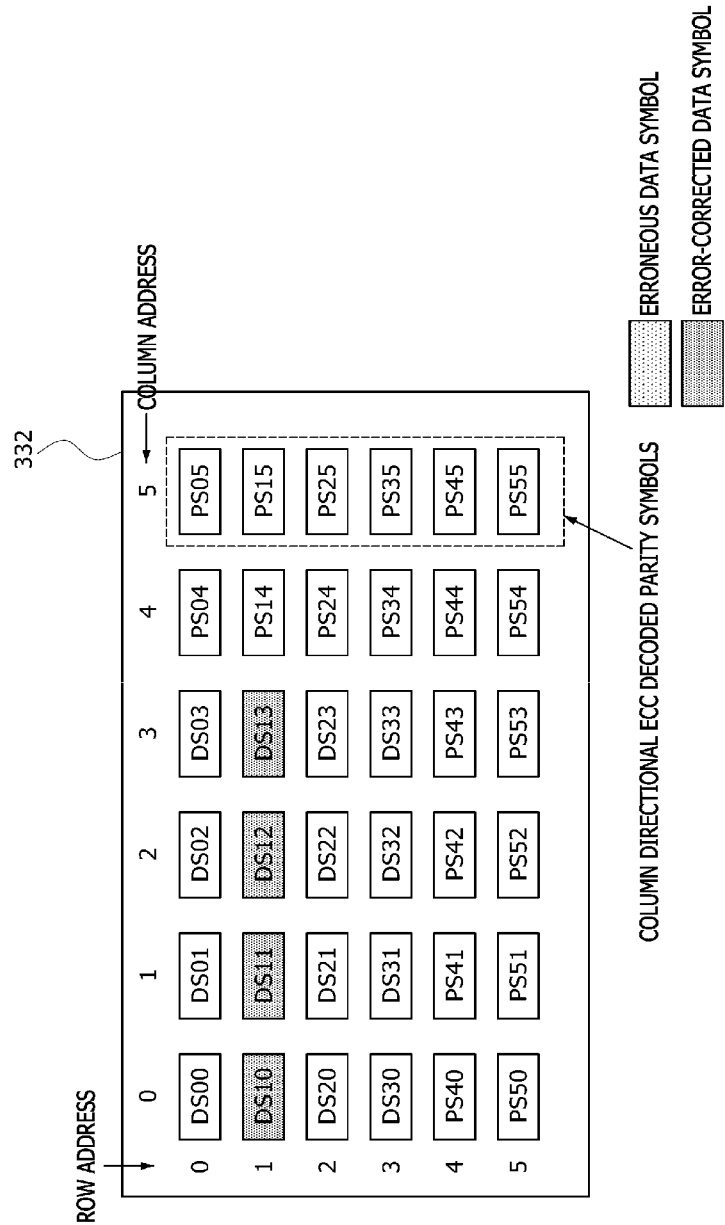

Subsequently, the count value may be increased by one (see the step 453-5). Therefore, the count value may be changed from four into five. Next, it is determined at step 453-6 whether the count value is equal to the number 'N+j,' which is six in this specific example. Since it is determined at step 453-6 that the count value is not equal to six corresponding to the number 'N+j,' the process proceeds to the step 453-2. The count value has been increased by one at the previous step 453-5 such that the (count value+1)$^{th}$ becomes six. Thus, the parity symbols PS05~PS55 in the sixth column corresponding to the (count value+1)$^{th}$ column may be read out from the second buffer 332 (see step 453-2). As illustrated in FIG. 24, the parity symbols PS05 to PS55, which are read out from the second buffer 332, may be inputted to the ECC decoder 312 through the first multiplexer 341. The ECC decoder 312 may perform a column directional ECC decoding operation for the parity symbols PS05 to PS55 to output column directional ECC decoded parity symbols (see step 453-3). The column directional ECC decoded parity symbols outputted from the ECC decoder 312 may be stored into the second buffer 332 through the third demultiplexer 346 (see step 453-4). As illustrated in FIG. 30, the column directional ECC decoded parity symbols PS05 to PS55 may be stored into the second buffer 332. FIG. 30 shows that there exists no erroneous parity symbol in the fifth column. Even when errors are generated in some of the parity symbols PS05 to PS35 before the count value is changed into five, the erroneous parity symbols can be corrected using the parity symbols PS45 and PS55 during the column directional ECC decoding operation performed at the step 453-3 if the number of the erroneous parity symbols among the parity symbols PS05 to PS35 is less than the error correction capability of the ECC engine (310 of FIG. 1). Next, the count value may be increased by one (see step 453-5). Therefore, the count value may be changed from five into six. Subsequently, it is determined at step 453-6 whether the count value is equal to the number 'N+j' which is six in this specific example. Since it is determined at step 453-6 that the count value is equal to six corresponding to the number 'N+j,', the process proceeds to step 454 of FIG. 16.

Figure 31:
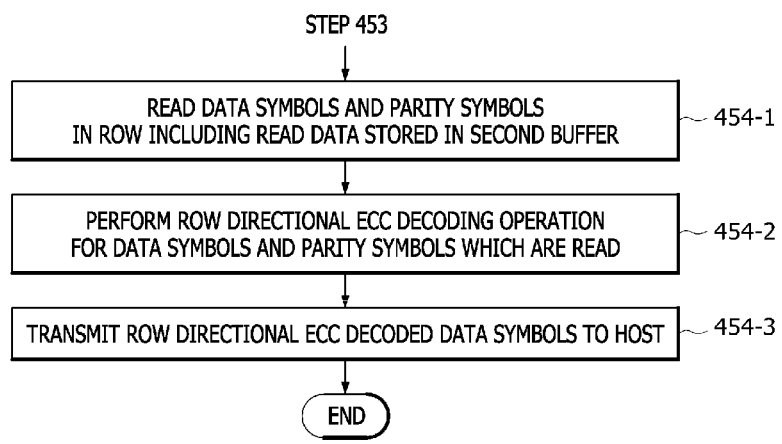
FIG. 31 is an example of a flowchart illustrating a step 454 of FIG. 16.
Figure 32:
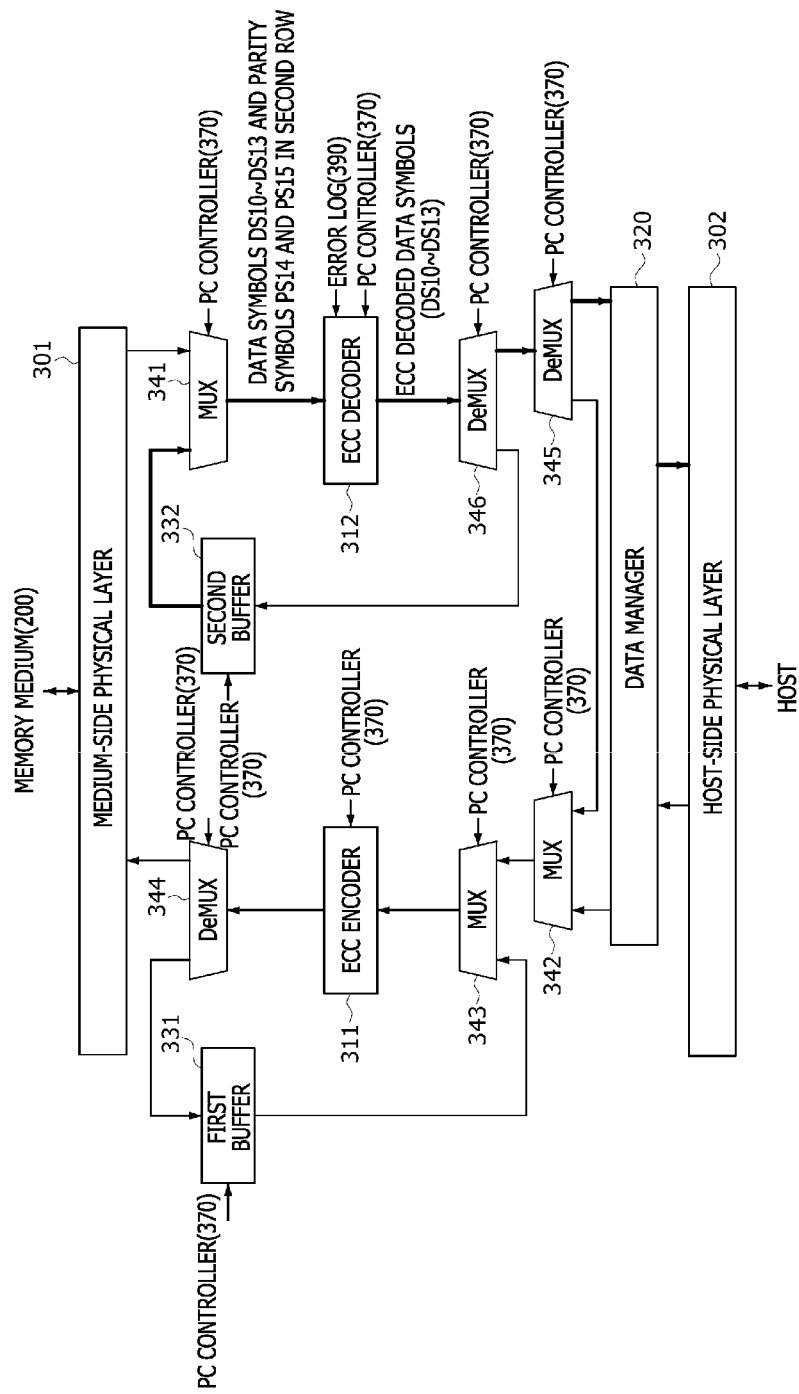
FIG. 32 illustrates exemplary data exchange paths in a memory controller of a memory system while steps 454-1 to 454-3 of FIG. 31 are performed.

FIG. 31 is an example of a flowchart illustrating a process of performing a column directional ECC decoding operation for a product codeword in the read operation shown in FIG. 16, and FIG. 32 illustrates data exchange paths in the memory controller 300 of the memory system 100 shown in FIG. 1 while steps 454-1 to 454-3 of FIG. 31 are performed. In FIG. 32, the data exchange paths are denoted by bold arrows. Referring to FIGS. 31 and 32, the memory controller 300 may read at step 454-1, from the second buffer 332, the data symbols and the parity symbols which have a row address. As an example, the descriptions are provided for a case that the memory controller 300 reads the data symbols DS10 to DS13 and the parity symbols PS14 and PS15 having a row address of '1.'. As illustrated in FIG. 32, the data symbols DS10 to DS13 and the parity symbols PS14 and PS15, which are read out from the second buffer 332, may be inputted to the ECC decoder 312 through the first multiplexer 341. The ECC decoder 312 may perform a row directional ECC decoding operation for the data symbols DS10 to DS13 and the parity symbols PS14 and PS15 (see step 454-2). As discussed with regard to FIGS. 22 to 30, the data symbols DS10 to DS130 stored in the second buffer have been error-corrected data symbols through the column directional ECC decoding operation. In addition, even though an error is generated in at least one of the parity symbols PS14 and PS15 before the step 454, the erroneous parity symbol PS14 or PS15 may be also corrected by the column directional ECC decoding operation performed at the step 453-3 of FIG. 22. Thus, all of the row directional ECC decoded data symbols DS10 to DS13 outputted from the ECC decoder 312 at the step 454-2 may have been error-corrected. The ECC decoded data symbols DS10 to DS13 outputted from the ECC decoder 312 may be transmitted to the host (see step 454-3). Specifically, the ECC decoded data symbols DS10 to DS13 outputted from the ECC decoder 312 may be transmitted to the data manager 320 through the third demultiplexer 346 and the second demultiplexer 345, and the data manager 320 may transmit the ECC decoded data symbols DS10 to DS13 to the host through the host-side physical layer 302.

Figure 33:
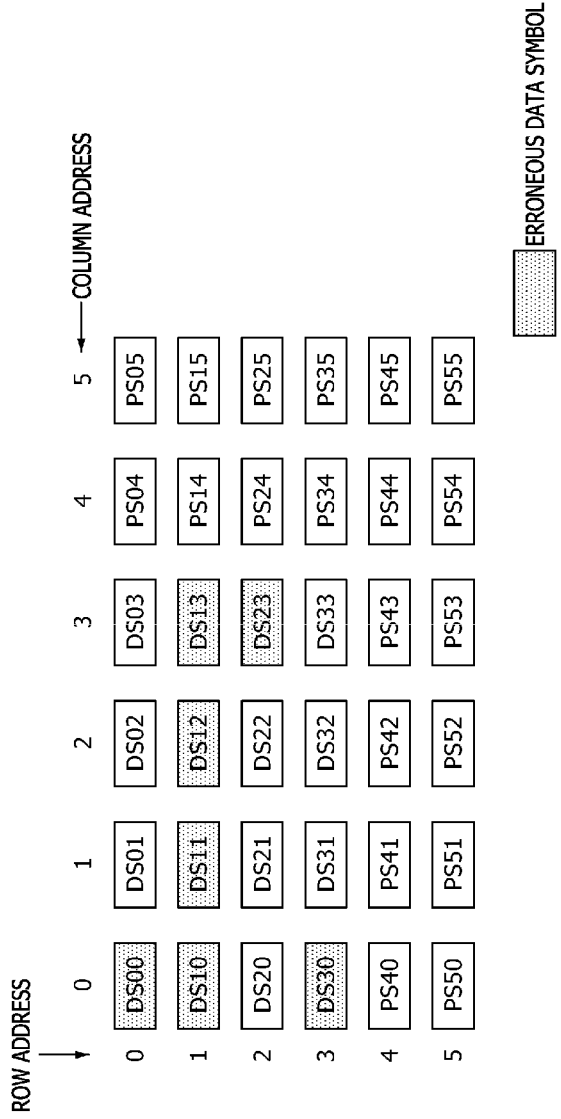
FIGS. 33 to 35 are exemplary schematic views illustrating processes for correcting errors using a fixed ECC engine of a memory system based on an embodiment of the disclosed technology.
Figure 34:
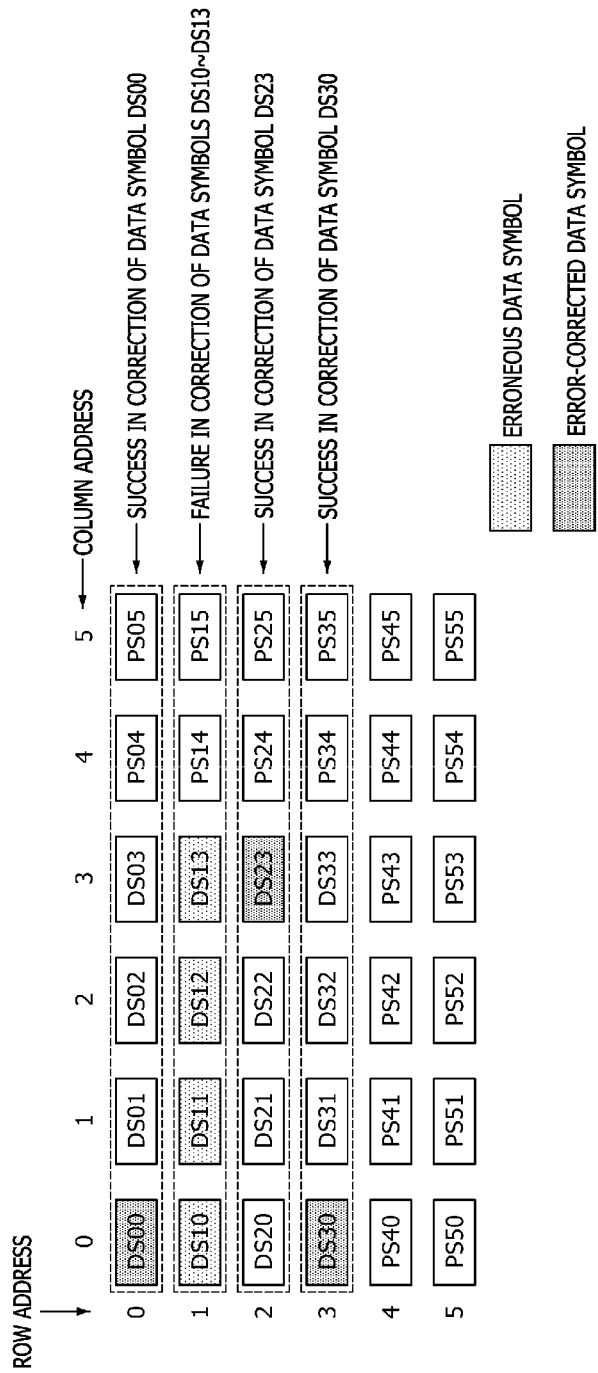
Figure 35:
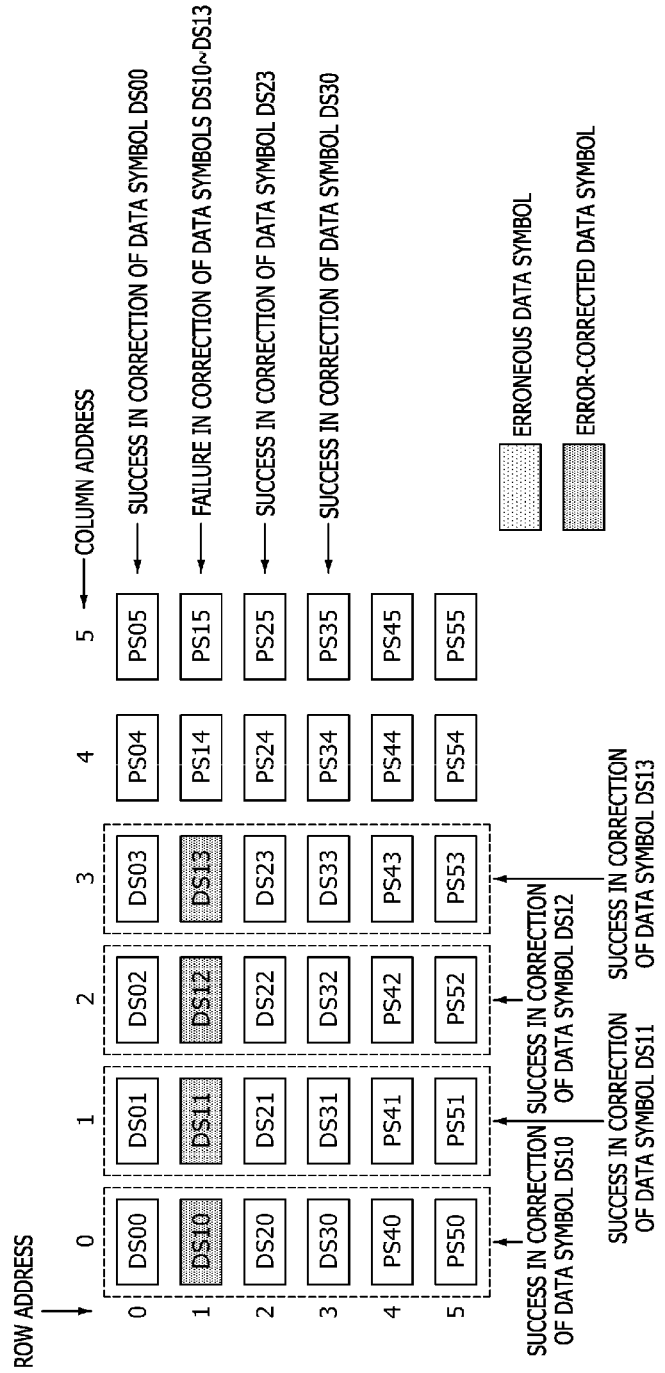

FIGS. 33 to 35 are schematic views illustrating processes for correcting errors when the number of errors is more than an error correction capability of an ECC engine in a memory system. To correct the errors, a fixed ECC engine of a memory system according to an embodiment of the disclosed technology is used. As illustrated in FIG. 33, in the present embodiment, it may be assumed that the data symbol DS00 among the data symbols DS00 to DS03 having a row address of '0' is an erroneous data symbol, all of the data symbols DS10 to DS13 having a row address of '1' are erroneous data symbols, the data symbol DS23 among the data symbols DS20 to DS23 having a row address of '2' is an erroneous data symbol, and the data symbol DS30 among the data symbols DS30 to DS33 having a row address of '3' is an erroneous data symbol. If the ECC encoder 311 and the ECC decoder 312 have a fixed error correction capability of '2', the number of the erroneous data symbols having a row address '1' is four greater than '2' and thus, the erroneous data symbols DS10 to DS13 having the row address of '1' cannot be corrected using a general error correction operation. However, the disclosed technology provides implementations that even when the number of the erroneous data symbols is greater than the fixed error correction capability of the ECC encoder 311 and the ECC decoder 312, for example, '2' in this specific example, all of the erroneous data symbols can be corrected.

FIG. 34 explains an example of a row directional ECC decoding operation. As illustrated in FIG. 34, a row directional ECC decoding operation proceeds for each row. The row directional ECC decoding operation for data having a first row address '0' corrects the erroneous data symbol DS00 since the number of the erroneous data symbols is '1' less than '2.'. Unlike the first row address '0,' the row directional ECC decoding operation cannot correct the erroneous data symbols DS10 to DS13 because the number of the erroneous data symbols DS10 to DS13 is '4' greater than the fixed error correction capability of the ECC encoder 311 and the ECC decoder 312. The erroneous data symbol DS23 having a third row address of '2' can be corrected by executing the row directional ECC decoding operation for data having the third row address. Similarly, the erroneous data symbol DS30 having a fourth row address of '3' can be corrected by executing the row directional ECC decoding operation for data having the fourth row address.

FIG. 35 explains an example of a column directional ECC decoding operation. As illustrated in FIG. 35, a column directional ECC decoding operation proceeds for each column. As discussed with regard to FIG. 34, all of the erroneous data symbols other than the erroneous data symbols DS10 to DS13 having the row address of '1' have been corrected using the row directional ECC decoding operation. If the column directional ECC decoding operation for the data symbols DS00 to DS30 having a column address of '0' is performed, the erroneous data symbol DS10 can be corrected. If the column directional ECC decoding operation for the data symbols DS01 to DS31 having a column address of '1' is performed, the erroneous data symbol DS11 can be corrected. If the column directional ECC decoding operation for the data symbols DS02 to DS32 having a column address of '2' is performed, the erroneous data symbol DS12 can be corrected. If the column directional ECC decoding operation for the data symbols DS03 to DS33 having a column address of '3' is performed, the erroneous data symbol DS13 can be corrected. In the above, it has been explained that the row directional decoding operation and the column directional decoding operation are performed on the data symbols. The disclosed technology is not limited thereto and other implementations are also possible such that the row directional decoding operation and the column directional decoding operation are performed on the parity symbols as well as the data symbols. For example, although not shown in the drawings, if some erroneous parity symbols are included in the parity symbols PS04 to PS34 having a column address of '4' and the parity symbols PS05 to PS35 having a column address of '5', the erroneous parity symbols in the column addresses of '4' and '5' can be corrected by executing the column directional ECC decoding operation for the parity symbols PS04 to PS34 having a column address of '4' and the parity symbols PS05~PS35 having the column address of '5'.

Figure 36:
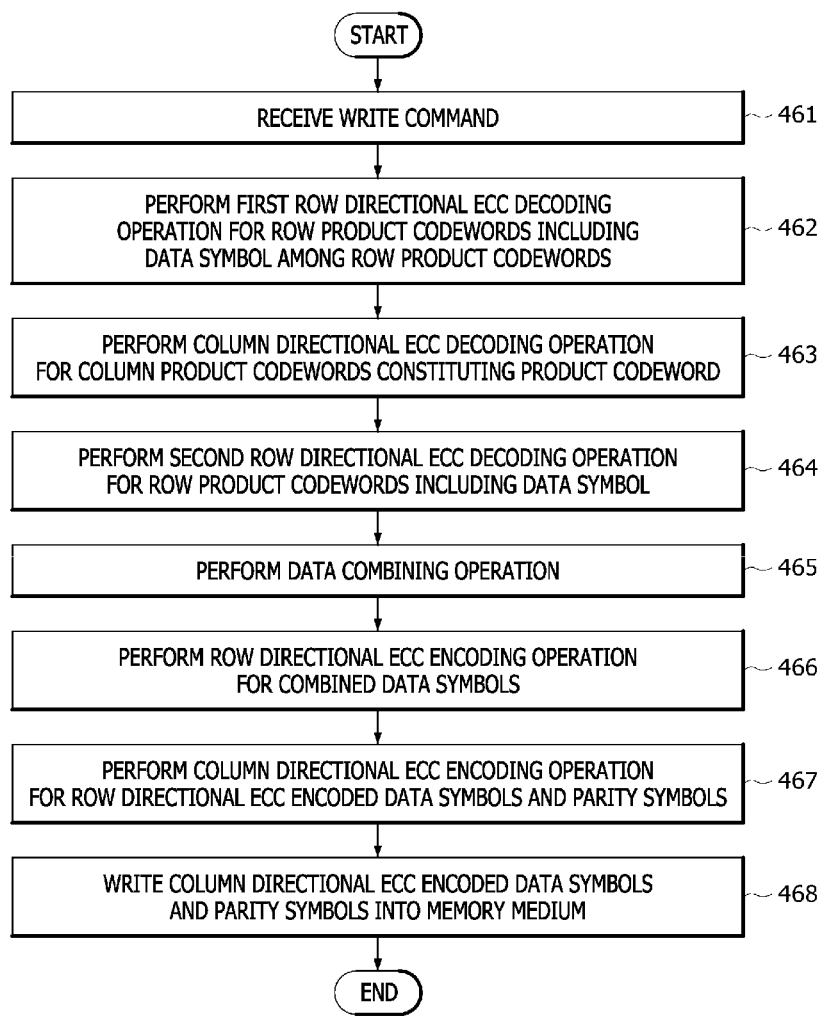
FIG. 36 is an example of a flowchart illustrating a write operation performed in a second error correction mode in response to a write command for storing data included in a product codeword into a storage area in a memory system.

FIG. 36 is an example of a flowchart illustrating a write operation performed in a second error correction mode in response to a write command for storing data included in a product codeword into a storage area in the memory system 100 shown in FIG. 1. Referring to FIG. 36, at step 461, the memory controller 300 may receive the write command for storing the product codeword into the memory medium 200. In response to the write command, the memory controller 300 may sequentially perform an ECC decoding operation in the second error correction mode, a data combining operation, an ECC encoding operation in the second error correction mode, and a write operation. In order to perform the ECC decoding operation in the second error correction mode, the memory controller 300 may perform a first row directional ECC decoding operation for row product codewords including at least one data symbol (see step 462). Next, the memory controller 300 may perform a column directional ECC decoding operation for column product codewords (see step 463). The row product codewords and the column product codewords, which are subject to the row directional ECC decoding operation and the column directional ECC decoding operation, may be stored in the memory medium 200. Subsequently, the memory controller 300 may perform a second row directional ECC decoding operation for the row product codewords including the data symbol (see step 464). After the ECC decoding operations are performed at the steps 462 to 464, a data combining operation may be performed (see step 465). The data combining operation may be performed by replacing the data symbols having the same row address among the data symbols generated by the ECC decoding operations of the steps 462 to 464 with data symbols having a specific row address in which write data are located. Next, the memory controller 300 may perform a row directional ECC encoding operation for the combined data symbols generated by the step 465 (see step 466). After step 466, the memory controller 300 may perform a column directional ECC encoding operation for the row directional ECC encoded data symbols and parity symbols (see step 467). The column directional ECC encoded data symbols and parity symbols may be written into the memory medium 200 (see step 468).

Figure 37:
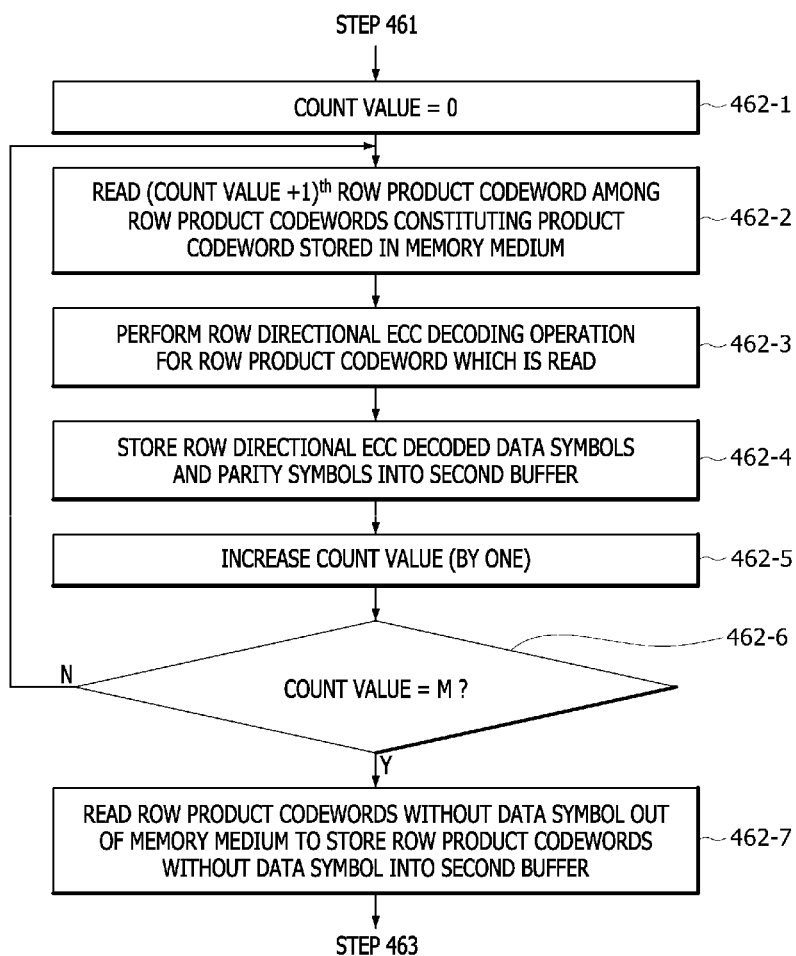
FIG. 37 is an example of a flowchart illustrating a step 462 of FIG. 36.
Figure 38:
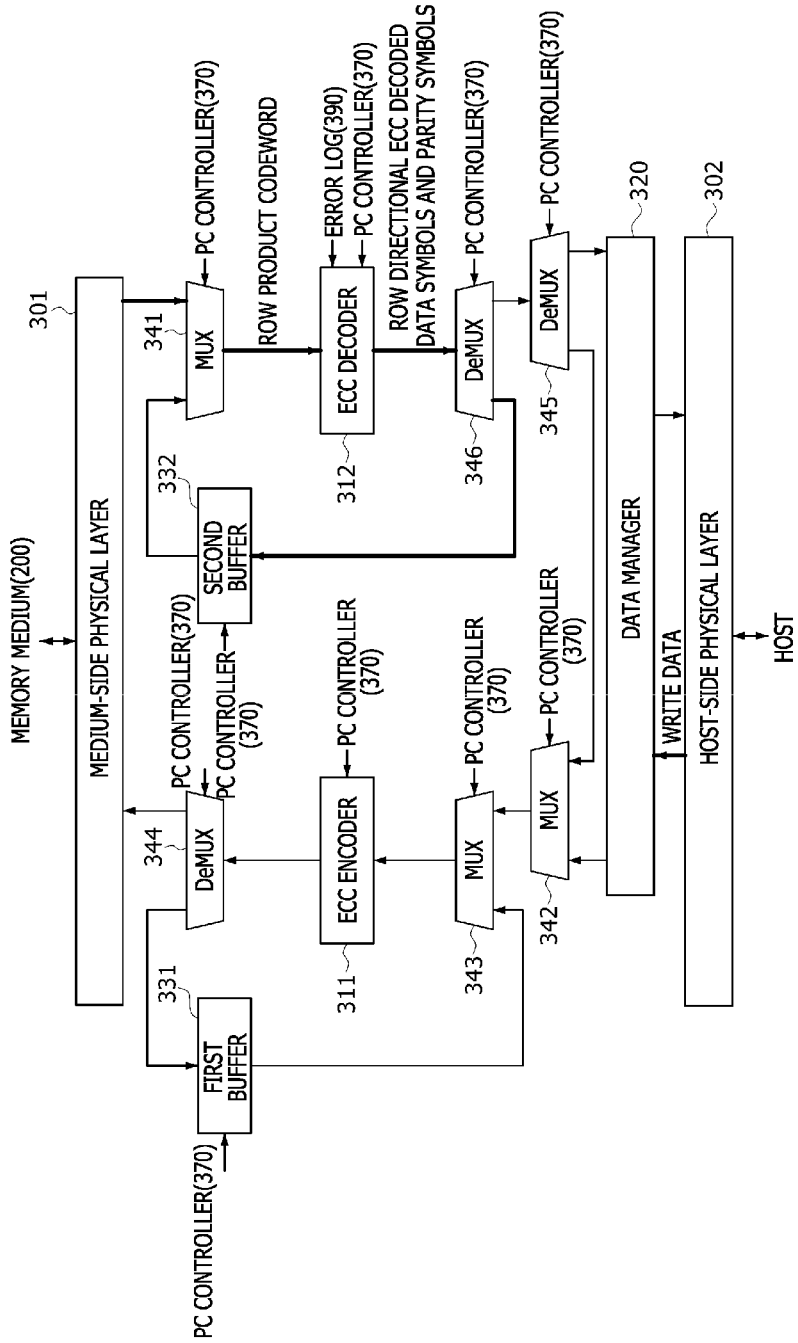
FIG. 38 illustrates exemplary data exchange paths in a memory controller of a memory system while steps 462-2 to 462-6 of FIG. 37 are performed.
Figure 39:
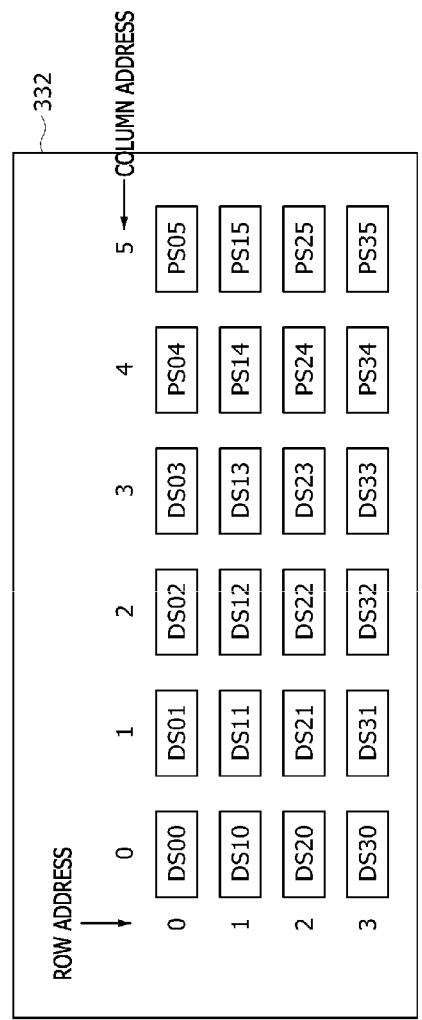
FIG. 39 illustrates an example of data symbols and parity symbols stored in a second buffer included in a memory system after steps 462-2 to 462-6 of FIG. 37 are performed.
Figure 40:
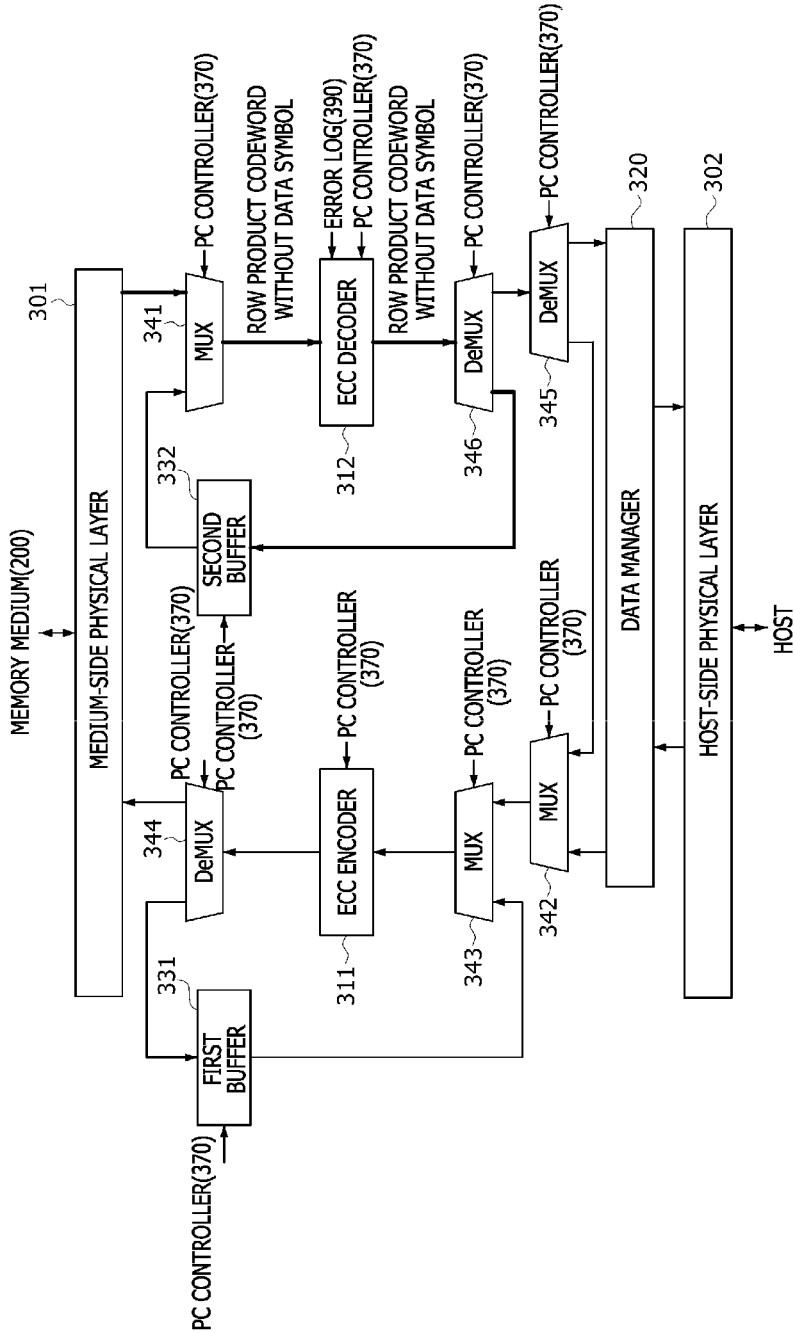
FIG. 40 illustrates exemplary data exchange paths in a memory controller of a memory system while a step 462-7 of FIG. 37 is performed.
Figure 41:
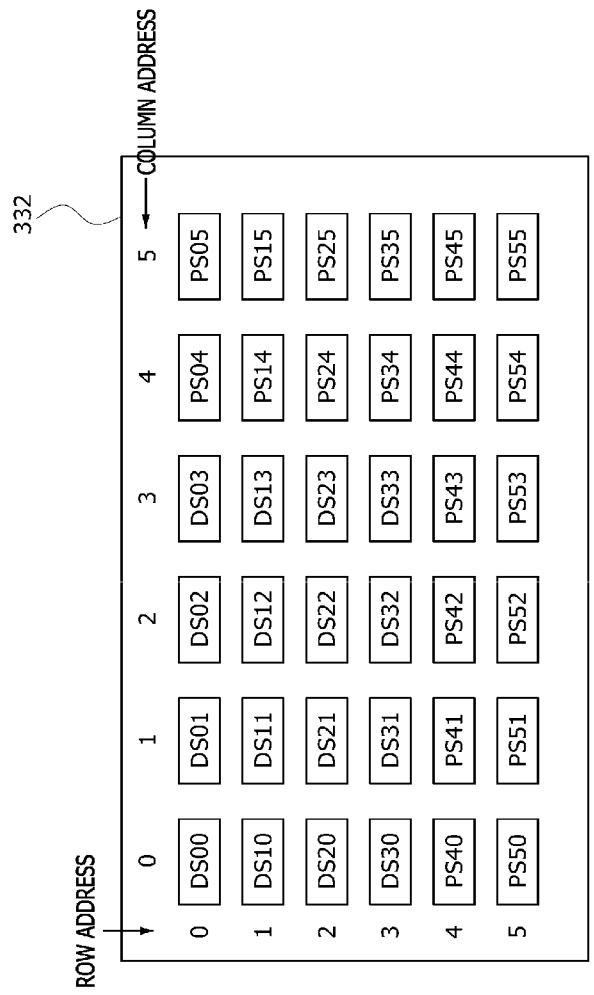
FIG. 41 illustrates an example of data symbols and parity symbols stored in a second buffer included in a memory system after a step 462-7 of FIG. 37 is performed.

FIG. 37 is an example of a flowchart illustrating a process of performing a first row directional ECC decoding operation during a write operation of FIG. 36. FIG. 38 illustrates data exchange paths in the memory controller 300 of the memory system 100 shown in FIG. 1 while steps 462-2 to 462-6 of FIG. 37 are performed. FIG. 39 illustrates an example of data symbols and parity symbols stored in the second buffer 332 included in the memory system 100 of FIG. 1 after the steps 462-2 to 462-6 of FIG. 37 are performed. FIG. 40 illustrates data exchange paths in the memory controller 300 of the memory system 100 shown in FIG. 1 while a step 462-7 of FIG. 37 is performed. FIG. 41 illustrates an example of data symbols and parity symbols stored in the second buffer 332 included in the memory system 100 of FIG. 1 after the step 462-7 of FIG. 37 is performed. In FIGS. 38 and 40, the data exchange paths are denoted by bold arrows. As an example, for the descriptions below, it may be assumed that the write command received at step 461 is a command for data symbols having a row address of '1' among data symbols included in the product codeword.

Referring to FIGS. 37 to 39, the count value may be reset to be zero '0' (see a step 462-1). The memory controller 300 may read a (count value+1)$^{th}$ row product codeword (i.e., a first row product codeword PCWR1) among the row product codewords included in the product codeword stored in the memory medium 200 (see a step 462-2). As illustrated in FIG. 38, the write data outputted from the host may be temporarily stored in the data manager 320 through the host-side physical layer 302. The first row product codeword PCWR1 read out from the memory medium 200 may be inputted to the ECC decoder 312 through the medium-side physical layer 301 and the first multiplexer 341. The ECC decoder 312 may perform a row directional ECC decoding operation for the first row product codeword PCWR1 (see a step 462-3). If the row directional ECC decoding operation is performed at the step 462-3, data symbols DS00 to DS03 and parity symbols PS04 and PS05 having a row address of '0' may be outputted from the ECC decoder 312. The data symbols DS00 to DS03 and the parity symbols PS04 and PS05 outputted from the ECC decoder 312 may be stored into the second buffer 332 through the third demultiplexer 346 (see a step 462-4).

Subsequently, the count value may be increased by one (see a step 462-5). Therefore, the count value may be changed from zero into one. Next, whether the count value is equal to a number 'M' may be determined (see a step 462-6). The number 'M' may be defined as the number of the row product codewords including the data symbol among the row product codewords included in the product codeword. In the present embodiment, the number 'M' may be four. Since the count value is not equal to four, i.e., the count value is not equal to 'M,', the process may return to the step 462-2. Since the count value is one, the steps 462-2 to 462-6 for the second row product codeword PCWR2 may be sequentially performed. Similarly, the steps 462-2 to 462-6 for each of the third and fourth row product codewords PCWR3 and PCWR4 may also be performed.

After the steps 462-2 to 462-6 for all of the first to fourth row product codewords PCWR1 to PCWR4 including the data symbol are performed, the data symbols DS00 to DS03 and the parity symbols PS04 and PS05 having a row address of '0', the data symbols DS10 to DS13 and the parity symbols PS14 and PS15 having a row address of '1', the data symbols DS20 to DS23 and the parity symbols PS24 and PS25 having a row address of '2', and the data symbols DS30 to DS33 and the parity symbols PS34 and PS35 having a row address of '3' may be stored in the second buffer 332 as illustrated in FIG. 39.

If it is determined at the step 462-6 that the count value is equal to four a, it indicates that that all of the row product codewords including at least one data symbol have been decoded by the row directional ECC decoding operation. In such a case, the row product codewords without the data symbol (i.e., the row product codewords including only the parity symbols) may be read out from the memory medium 200 and may be stored into the second buffer 332 (see a step 462-7). For example, as illustrated in FIG. 40, the fifth row product codeword PCWR5 including only the parity symbols PS40 to PS45 may be read out from the memory medium 200 through the medium-side physical layer 301 and the first multiplexer 341 and may be inputted to the ECC decoder 312. The ECC decoder 312 may not perform an ECC decoding operation for the fifth row product codeword PCWR5 and may output the fifth row product codeword PCWR5 to the third demultiplexer 346. In order to prevent the ECC decoder 312 from performing the ECC decoding operation, the PC controller 370 may output a control signal for disabling the ECC decoding operation of the ECC decoder 312 to the ECC decoder 312. The third demultiplexer 346 may transmit the fifth row product codeword PCWR5 to the second buffer 332, and the fifth row product codeword PCWR5 may be stored into the second buffer 332. The sixth row product codeword PCWR6 in the memory medium 200 may be stored into the second buffer 332 in the same way as described in conjunction with the fifth row product codeword PCWR5. As a result, after the step 462-7 of FIG. 17 is performed, the parity symbols PS40 to PS45 having a row address of '4' and the parity symbols PS50 to PS55 having a row address of '5' may be stored into the second buffer 332 as illustrated in FIG. 41.

Figure 42:
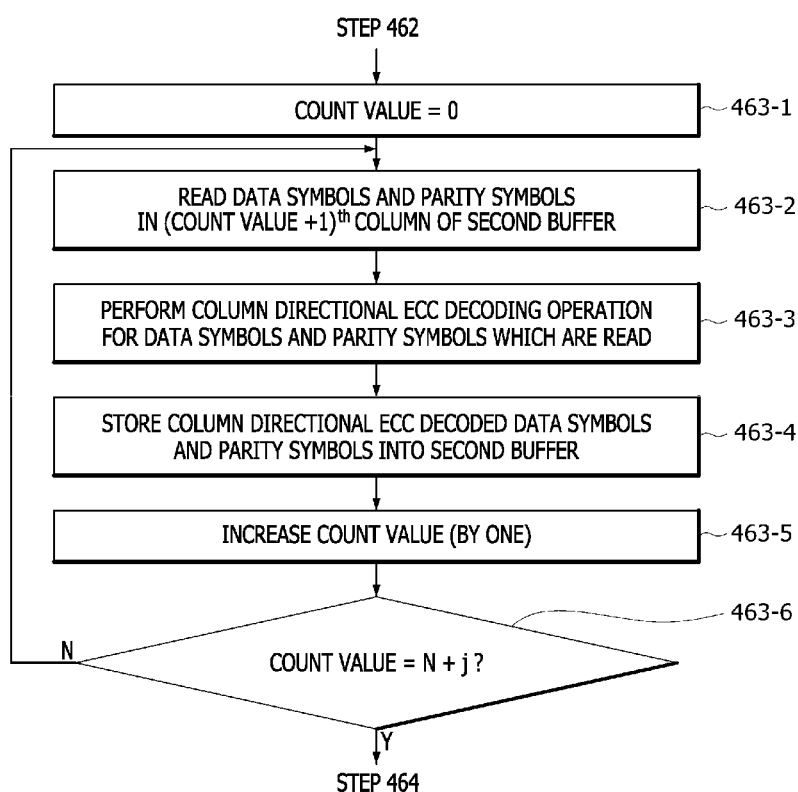
FIG. 42 is an example of a flowchart illustrating a step 463 of FIG. 36.
Figure 43:
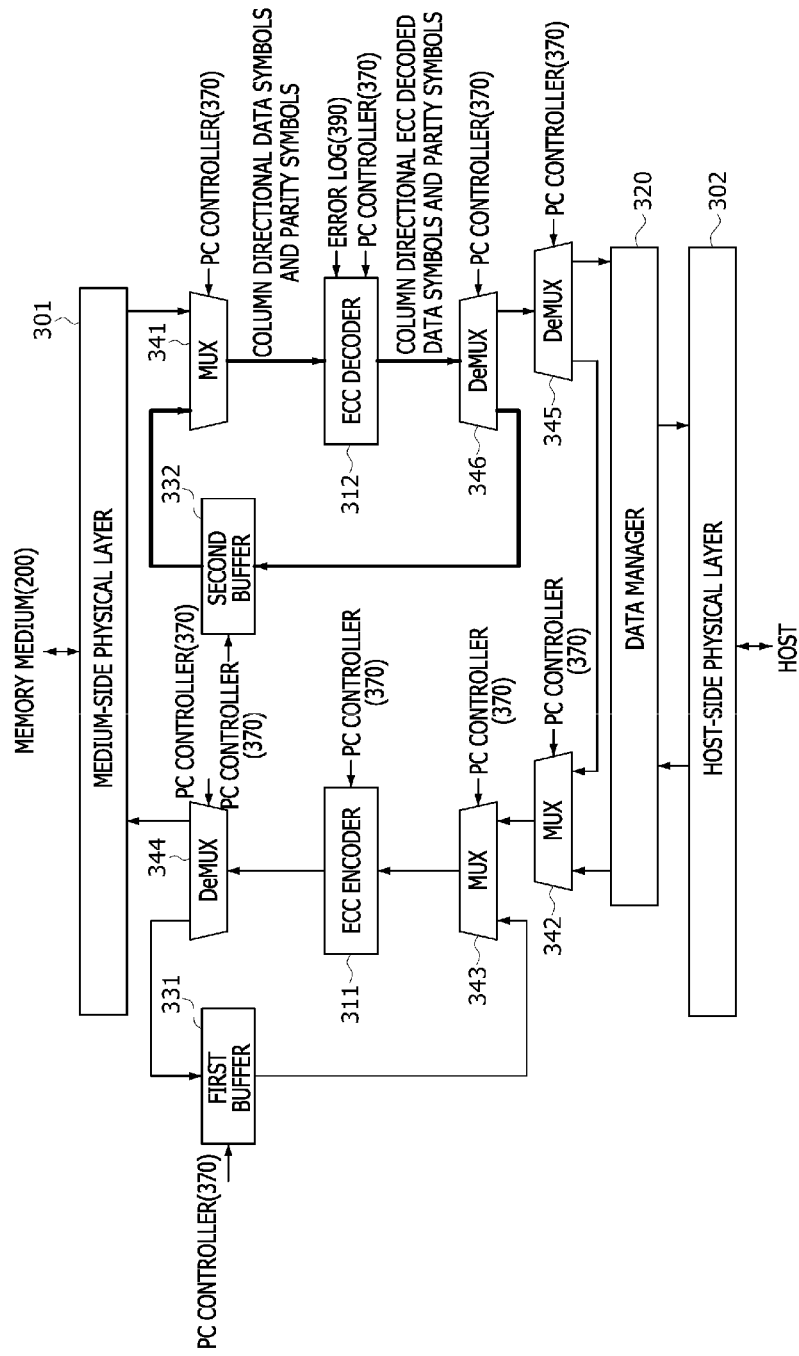
FIGS. 43 and 44 illustrate exemplary data exchange paths in a memory controller of a memory system while steps 463-2 to 463-6 of FIG. 42 are performed.
Figure 44:
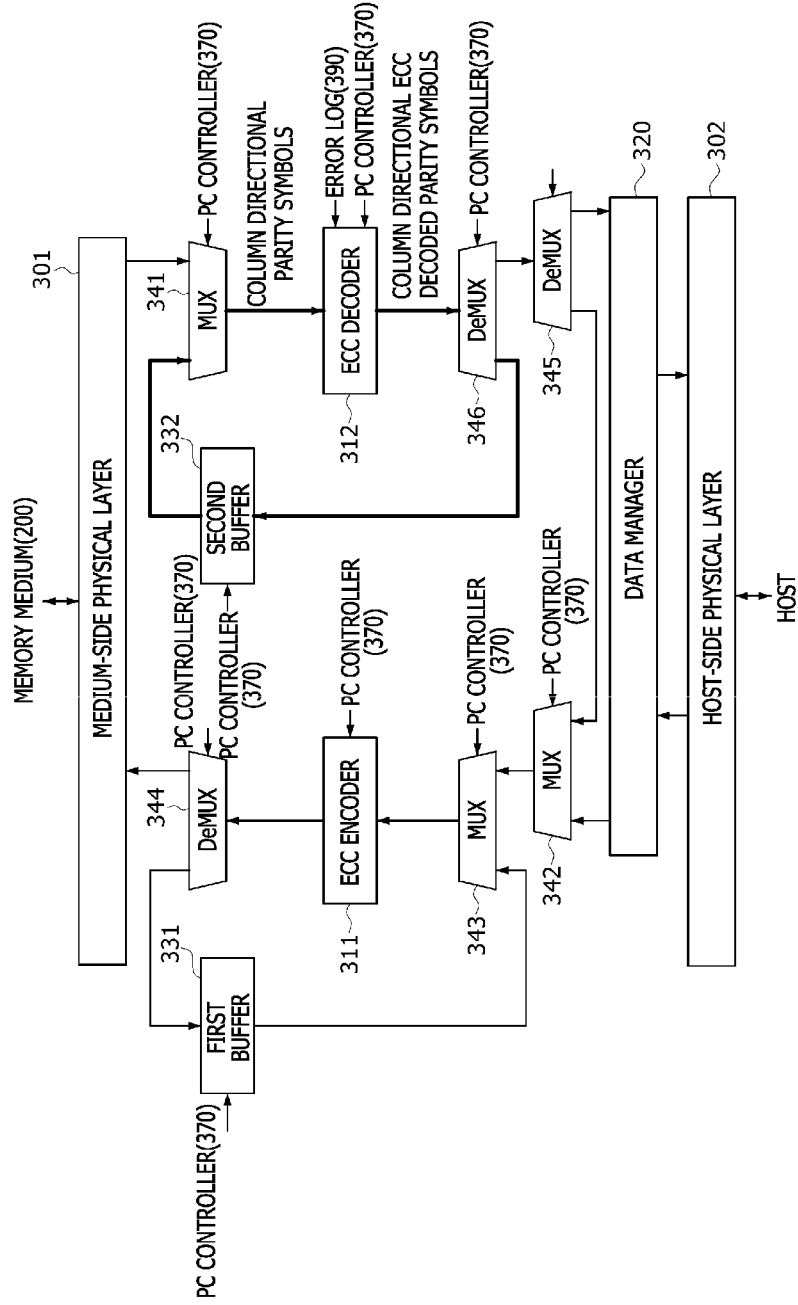
Figure 45:
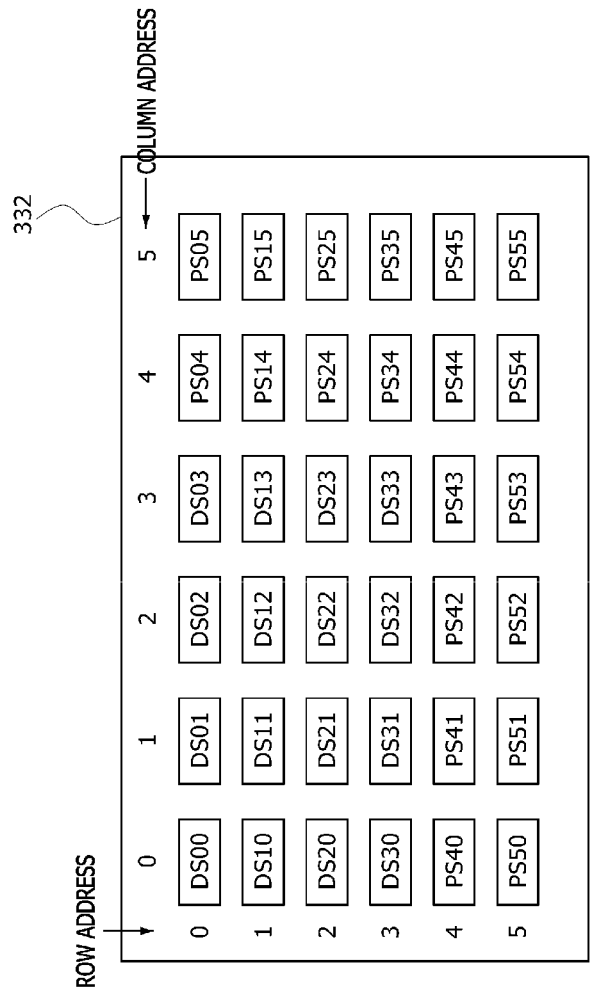
FIG. 45 illustrates an example of data symbols and parity symbols stored in a second buffer included in a memory system after steps 462-2 to 462-6 of FIG. 37 are performed.

FIG. 42 is an example of a flowchart illustrating the step 463 of performing the column directional ECC decoding operation for the column product codewords during the write operation of FIG. 36. FIGS. 43 and 44 illustrate data exchange paths in the memory controller 300 of the memory system 100 shown in FIG. 1 while steps 463-2 to 463-6 of FIG. 42 are performed. FIG. 45 illustrates an example of data symbols and parity symbols stored in the second buffer 332 included in the memory system 100 of FIG. 1 after the steps 462-2 to 462-6 of FIG. 37 are performed. In FIGS. 43 and 44, the data exchange paths are denoted by bold arrows. Referring to FIGS. 42 to 45, after the step 462 of FIG. 36 is performed, the count value may be reset to be zero (see a step 463-1). The memory controller 300 may read the data symbols DS00 to DS30 and the parity symbols PS40 and PS50 of the first column product codeword stored in the second buffer 332 (see a step 463-2).

As illustrated in FIG. 43, the data symbols DS00 to DS30 and the parity symbols PS40 and PS50, which are read out from the second buffer 332, may be inputted to the ECC decoder 312 through the first multiplexer 341. The ECC decoder 312 may perform a column directional ECC decoding operation for the data symbols DS00 to DS30 and the parity symbols PS40 and PS50 to output column directional ECC decoded data symbols and parity symbols (see a step 463-3). The column directional ECC decoded data symbols and parity symbols outputted from the ECC decoder 312 may be stored into the second buffer 332 through the third demultiplexer 346 (see a step 463-4). Subsequently, the count value may be increased by one (see a step 463-5). Therefore, the count value may be changed from zero into one. Next, whether the count value is equal to a number 'N+j' may be determined (see a step 463-6). The number 'N+j' may be defined as the number of all of the column product codewords included in the product codeword stored in the memory medium 200. Thus, the number 'N+j' may be equal to the number of columns of the product codeword stored in the memory medium 200. In the specific example, the number 'N+j' may be set to be six. Since it is determined at the step 463-6 that the count value (i.e., one) is not equal to six, the process returns to the step 463-2. After returning to the step 463-2, the count value becomes one, and thus the steps 463-2 to 463-6 may be performed for the data symbols DS01 to DS31 and the parity symbols PS41 and PS51 in the second column. The steps 463-2 to 463-6 may be repeated until the count value is equal to six. Thus, the steps 463-2 to 463-6 may be repeated until the parity symbols PS05 to PS55 in the sixth column are decoded by the column directional ECC decoding operation and the column directional ECC decoded data symbols and parity symbols are stored in the second buffer 332.

Data in the fifth column may include only the parity symbols PS04 to PS54, and data in the sixth column may include only the parity symbols PS05 to PS55. As illustrated in FIG. 44, only the column directional parity symbols may be transmitted from the second buffer 332 to the ECC decoder 312 through the first multiplexer 341 while the steps 463-2 to 463-6 for each of the fifth column and the sixth column are performed. The ECC decoder 312 may perform a column directional ECC decoding operation for the parity symbols PS04 to PS54 to output column directional ECC decoded parity symbols. The column directional ECC decoded parity symbols outputted from the ECC decoder 312 may be stored into the second buffer 332 through the third demultiplexer 346. As illustrated in FIG. 45, all of the column directional ECC decoded data symbols and parity symbols may be stored into the second buffer 332. For example, the column directional ECC decoded data symbols DS00 to DS30 and parity symbols PS40 and PS50 may be stored in the first column of the second buffer 332, the column directional ECC decoded data symbols DS01 to DS31 and parity symbols PS41 and PS51 may be stored in the second column of the second buffer 332, the column directional ECC decoded data symbols DS02 to DS32 and parity symbols PS42 and PS52 may be stored in the third column of the second buffer 332, the column directional ECC decoded data symbols DS03 to DS33 and parity symbols PS43 and PS53 may be stored in the fourth column of the second buffer 332, the column directional ECC decoded parity symbols PS04 to PS54 may be stored in the fifth column of the second buffer 332, and the column directional ECC decoded parity symbols PS05 to PS55 may be stored in the sixth column of the second buffer 332. After the steps 463-2 to 463-5 for the sixth parity symbols PS05 and PS55 in the sixth column are performed, the count value may be equal to six. In such a case, the process proceeds to the step 464 of FIG. 36 and the step 464 may then be performed.

Figure 46:
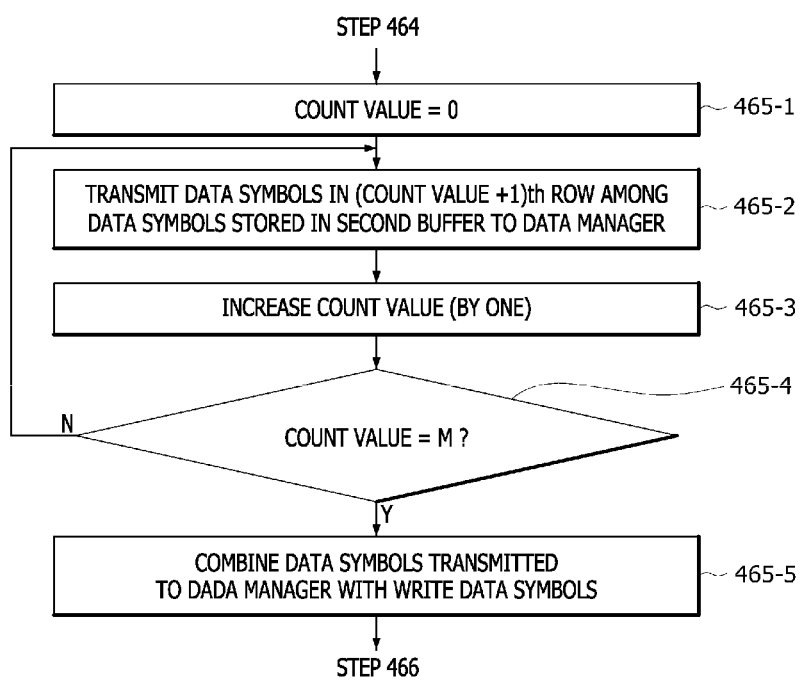
FIG. 46 is an example of a flowchart illustrating a step 465 of FIG. 36.
Figure 47:
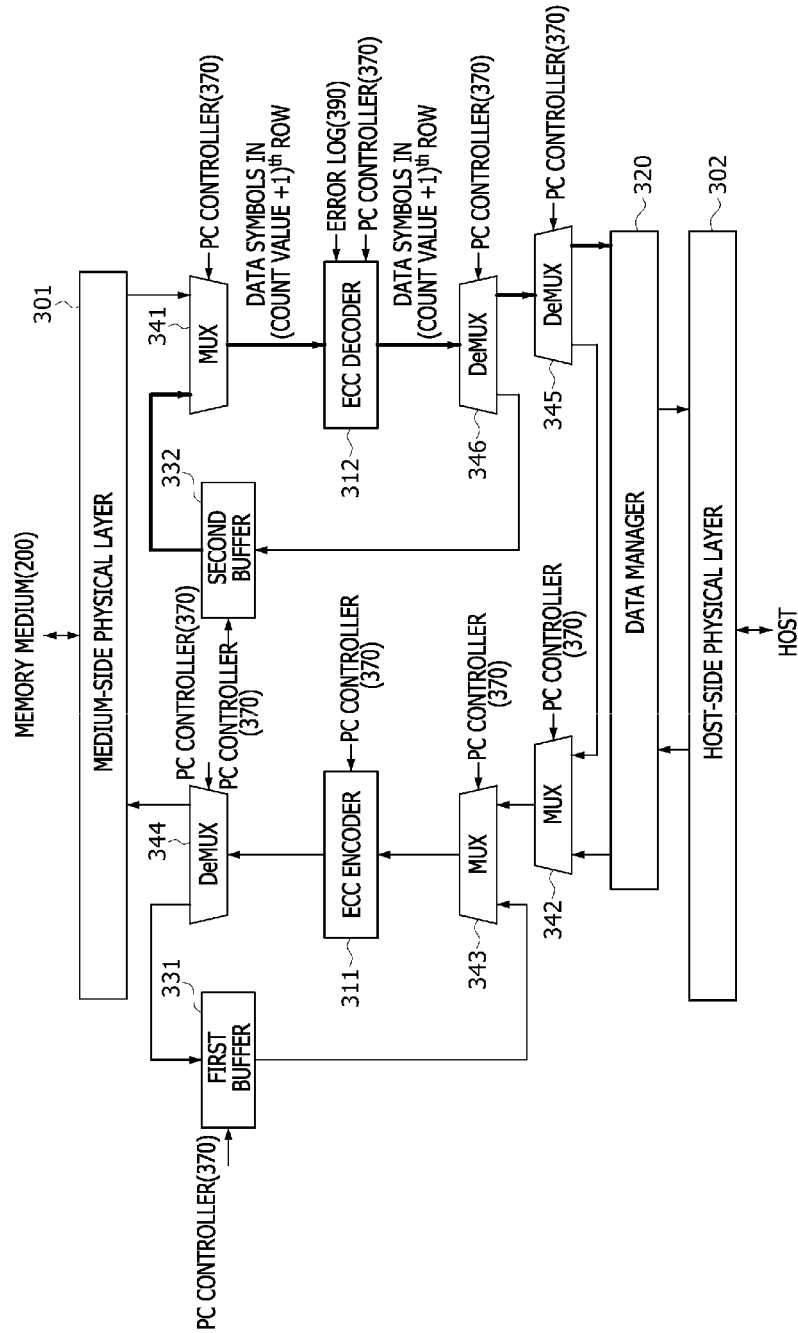
FIG. 47 illustrates exemplary data exchange paths in a memory controller of a memory system while steps 465-2 to 465-4 of FIG. 46 are performed.
Figure 48:
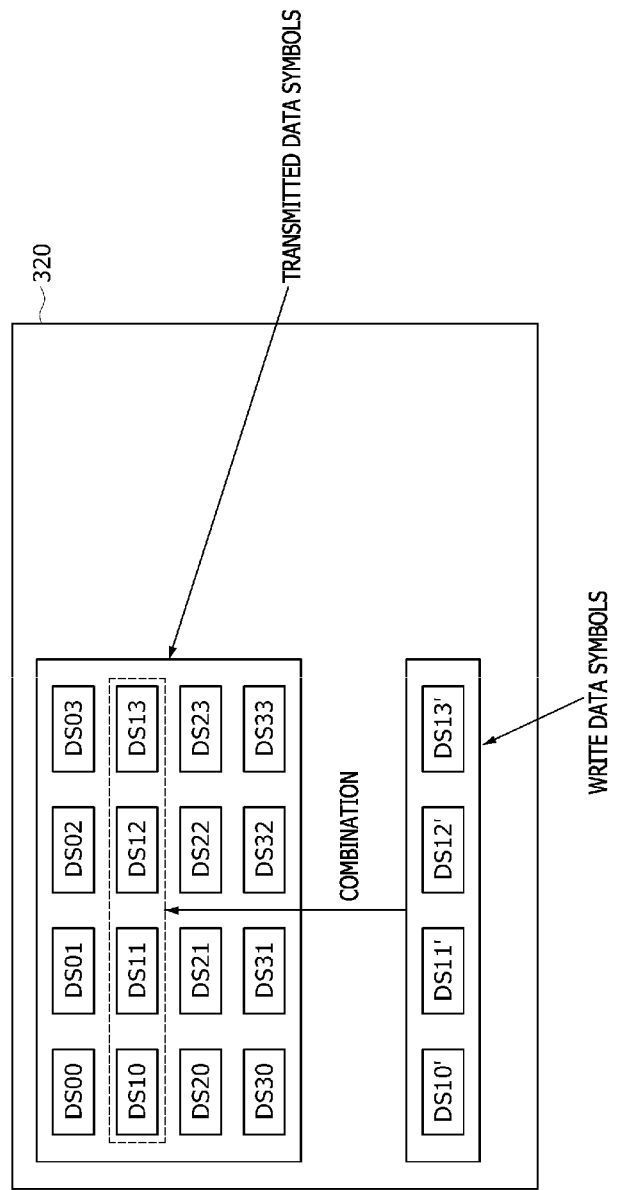
FIG. 48 illustrates an example of data temporarily stored in a data manager included in a memory system before a step 465-5 of FIG. 46 is performed.
Figure 49:
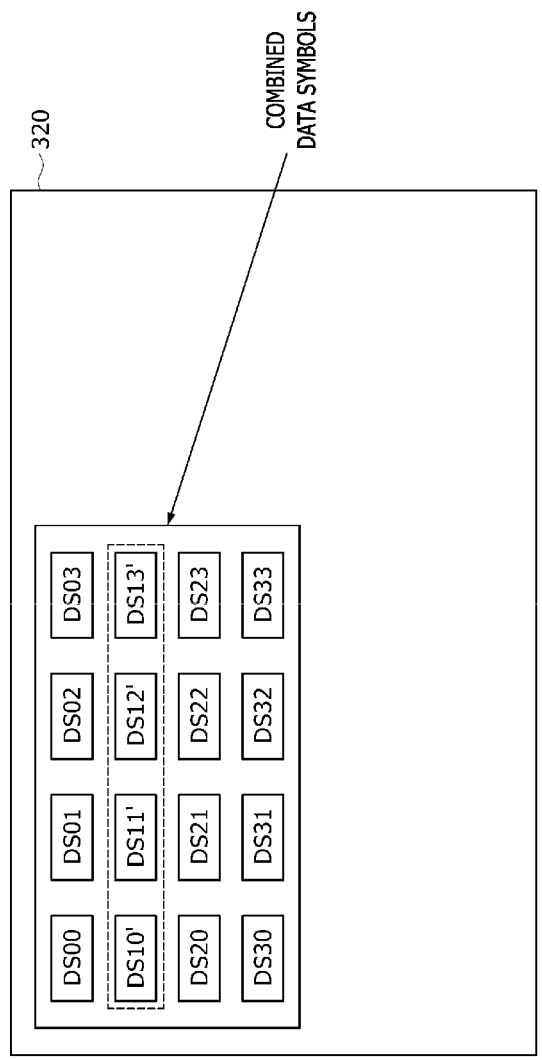
FIG. 49 illustrates an example of data stored in a data manager included in a memory system after the step 465-5 of FIG. 46 is performed.

FIG. 46 is an example of a flowchart illustrating the step 465 of combining write data during the write operation of FIG. 36. FIG. 47 illustrates data exchange paths in the memory controller 300 of the memory system 100 shown in FIG. 1 while steps 465-2 to 465-4 of FIG. 46 are performed. FIG. 48 illustrates an example of data temporarily stored in the data manager 320 included in the memory system 100 of FIG. 1 before a step 465-5 of FIG. 46 is performed. FIG. 49 illustrates an example of data stored in the data manager 320 included in the memory system 100 of FIG. 1 after the step 465-5 of FIG. 46 is performed. In FIG. 47, the data exchange paths are denoted by bold arrows. Referring to FIGS. 46 to 49, the count value may be reset to be zero (see a step 465-1). In this case, the (count value+1)$^{th}$ row becomes the first row. Thus, data symbols DS00 to DS03 in the first row may be transmitted to the data manager 320 (see a step 465-2). As illustrated in FIG. 47, the data symbols DS00 to DS03 in the first row of the second buffer 332 may be transmitted to the data manager 320 through the first multiplexer 341, the ECC decoder 312, the third demultiplexer 346 and the second demultiplexer 345. In such a case, the ECC decoder 312 may output the data symbols DS00 to DS03 in the first row without performing an ECC decoding operation for the data symbols DS00 to DS03, in response to a control signal outputted from the PC controller 370.

Subsequently, the count value may be increased by one (see a step 465-3). Therefore, the count value may be changed from zero into one. Next, whether the count value is equal to a number 'M' may be determined (see a step 465-4). The number 'M' may be defined as the number of rows including the data symbol among rows of the second buffer 332. The number 'M' may be equal to the number of the row product codes including the data symbol and the number of the row product codewords including the data symbol among the row product codewords. In the specific example, the number 'M' may be set to be four. In this case, since it is determined at the step 465-4 that the count value (i.e., one) is not equal to four, the process returns to the step 465-2. In such a case, the count value becomes one, and the (count value+1)$^{th}$ row becomes two. Thus, the steps 465-2 to 465-4 may be performed for the data symbols DS10 to DS13 in the second row. Thereafter, the steps 465-2 to 465-4 may also be performed until the number 'M' is equal to four.

If it is determined at the step 465-4 of FIG. 46 that the number 'M' is equal to four, the data symbols transmitted to the data manager 320 may be combined with write data symbols (see a step 465-5). As illustrated in FIG. 48, data symbols DS00 to DS03, DS10 to DS13, DS20 to DS23 and DS30 to DS33, which are outputted from the second buffer 332 may be temporarily stored in the data manager 320. Write data symbols DS10' to DS13' outputted from the host may be temporarily stored in the data manager 320. The data manager 320 may combine the data symbols transmitted from the second buffer 332 with the write data symbols DS10' to DS13'. The data combination may be achieved by replacing the data symbols DS10 to DS13 in the second row with the write data symbols DS10' to DS13'. Thus, as illustrated in FIG. 49, the data manager 320 may generate the combined data symbols including the data symbols DS00 to DS03, DS10' to DS13', DS20 to DS23 and DS30 to DS33.

Figure 50:
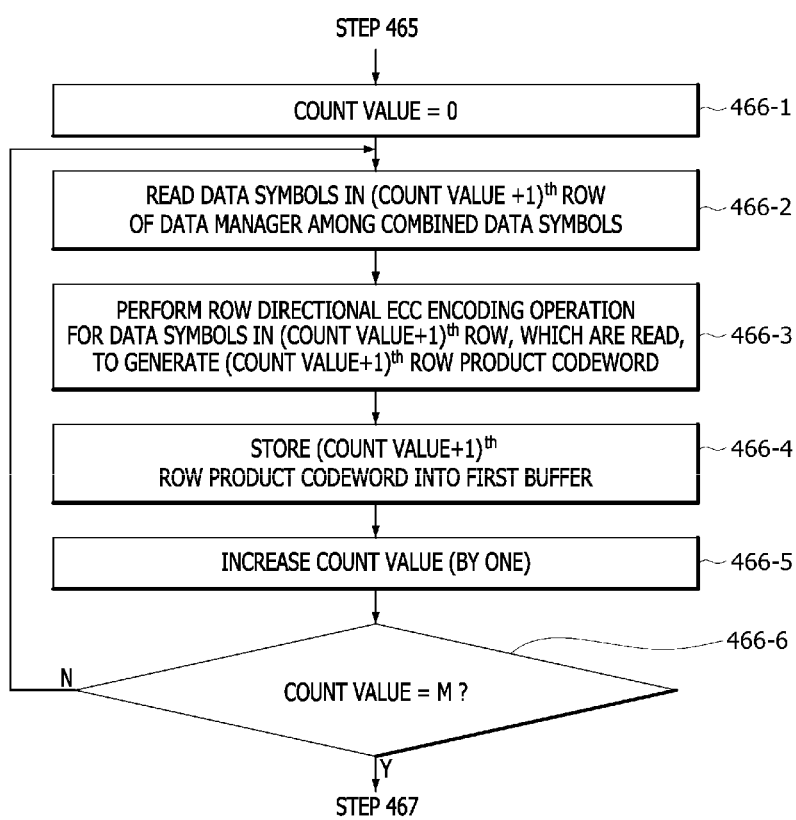
FIG. 50 is an example of a flowchart illustrating a step 466 of FIG. 36.
Figure 51:
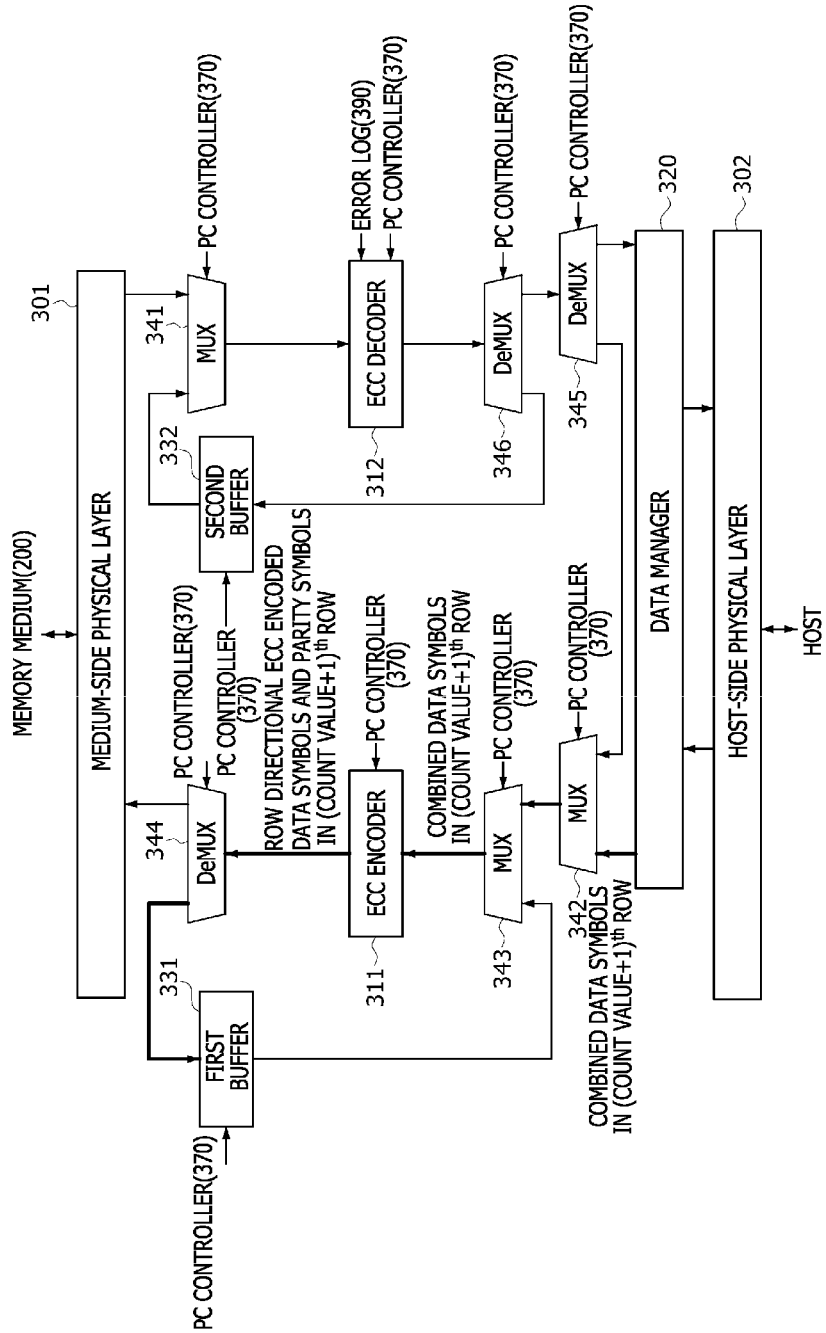
FIG. 51 illustrates exemplary data exchange paths in a memory controller of the memory system shown in FIG. 1 while steps 466-2 to 466-6 of FIG. 50 are performed.
Figure 52:
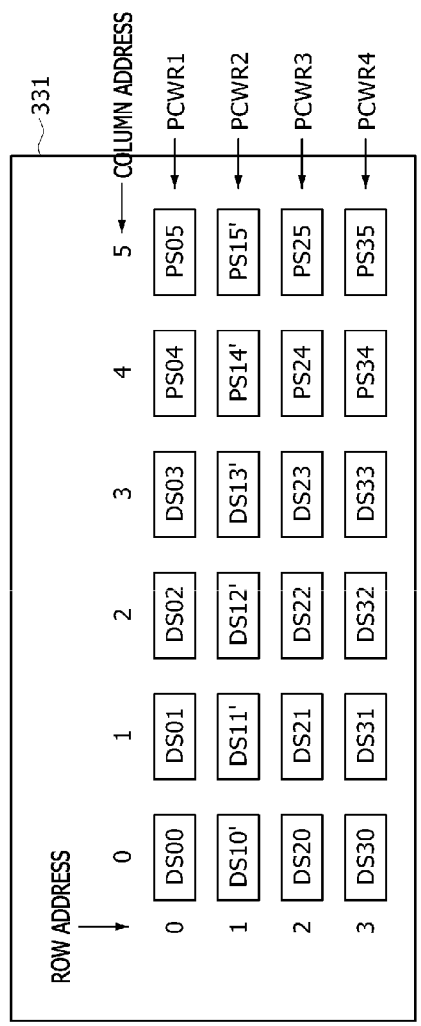
FIG. 52 illustrates an example of data stored in a first buffer included in a memory system after a step 466 of FIG. 36 is performed.

FIG. 50 is an example of a flowchart illustrating the step 466 of performing the row directional ECC encoding operation for the combined data symbols during the write operation of FIG. 36. FIG. 51 illustrates data exchange paths in the memory system 100 shown in FIG. 1 while steps 466-2 to 466-6 of FIG. 50 are performed. FIG. 52 illustrates an example of data stored in the first buffer 331 included in the memory system 100 of FIG. 1 after the step 466 of performing the row directional ECC encoding operation for the combined data symbols during the write operation of FIG. 36 is performed. In FIG. 51, the data exchange paths are denoted by bold arrows. Referring to FIGS. 50, 51 and 52, after the step 465 of FIG. 36 is performed, the count value may be reset to be zero (see a step 466-1). The (count value+1)$^{th}$ row becomes the first row. The memory controller 300 may read the data symbols DS00 to DS03 in the first row from the data manager 320 (see a step 466-2). The memory controller 300 may perform a row directional ECC encoding operation for the data symbols DS00 to DS03, which are read out from the data manager 320, to generate a first row product codeword PCWR1 (see a step 466-3). As illustrated in FIG. 51, the data symbols DS00 to DS03 in the first row among the data symbols stored in the data manager 200 may be inputted to the ECC encoder 311 through the second and third multiplexers 342 and 343. The ECC encoder 311 may perform a row directional ECC encoding operation for the data symbols DS00 to DS03 to generate and output a first row product codeword PCWR1 including the data symbols DS00 to DS03 and the parity symbols PS04 and PS05. The first row product codeword PCWR1 outputted from the ECC encoder 311 may be stored into the first buffer 331 through the first demultiplexer 344 (see a step 466-4).

After the step 466-4 is performed, the count value may be increased by one (see a step 466-5). Therefore, the count value may be changed from zero into one. Next, whether the count value is equal to a number 'M' may be determined (see a step 466-6). The number 'M' may be defined as the number of the rows including the data symbol among the rows included in the product codeword. The number 'M' may be equal to the number of the row product codes including the data symbol among the row product codes and the number of the row product codewords including the data symbol among the row product codewords. In the specific example, the number 'M' may be set to be four. Since the count value isone it is determined at the step 466-6 that the count value is not equal to four, the process returns to the step 466-2. Thus, the steps 466-2 to 466-6 may be repeated for each of the third row including the data symbols DS20 to DS23 and the fourth row including the data symbols DS30 to DS33 until the number 'M' is equal to four. As a result, as illustrated in FIG. 52, the first row product codeword PCWR1 including the data symbols DS00 to DS03 and the parity symbols PS04 and PS05, the second row product codeword PCWR2 including the data symbols DS10' to DS13' and the parity symbols PS14' and PS15', the third row product codeword PCWR3 including the data symbols DS20 to DS23 and the parity symbols PS24 and PS25, and the fourth row product codeword PCWR4 including the data symbols DS30 to DS33 and the parity symbols PS34 and PS35 may be stored in the first buffer 331.

Figure 53:
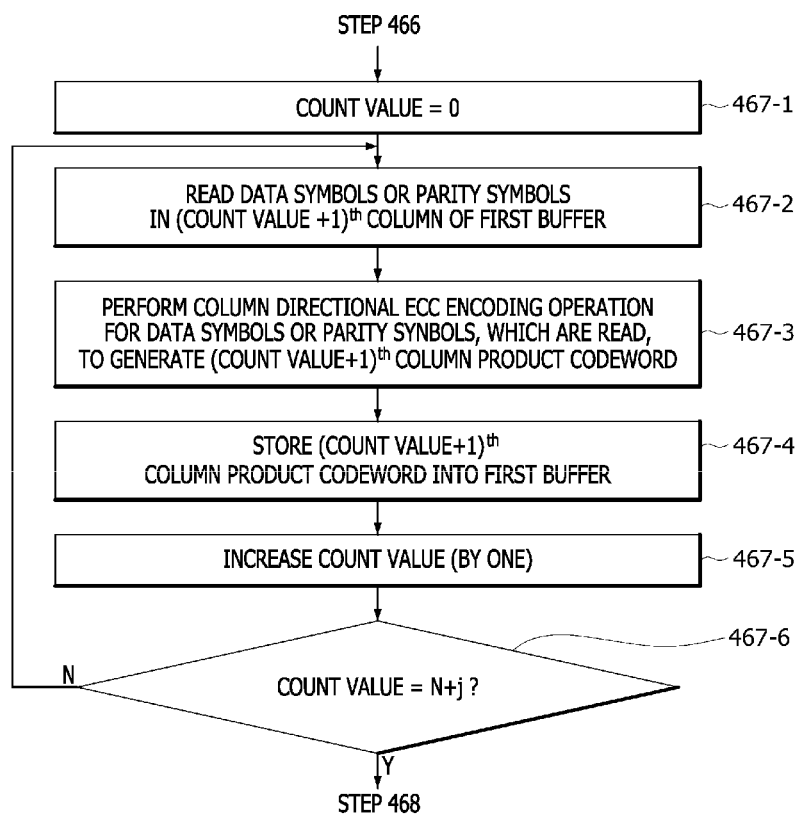
FIG. 53 is an example of a flowchart illustrating a step 467 of FIG. 36.
Figure 54:
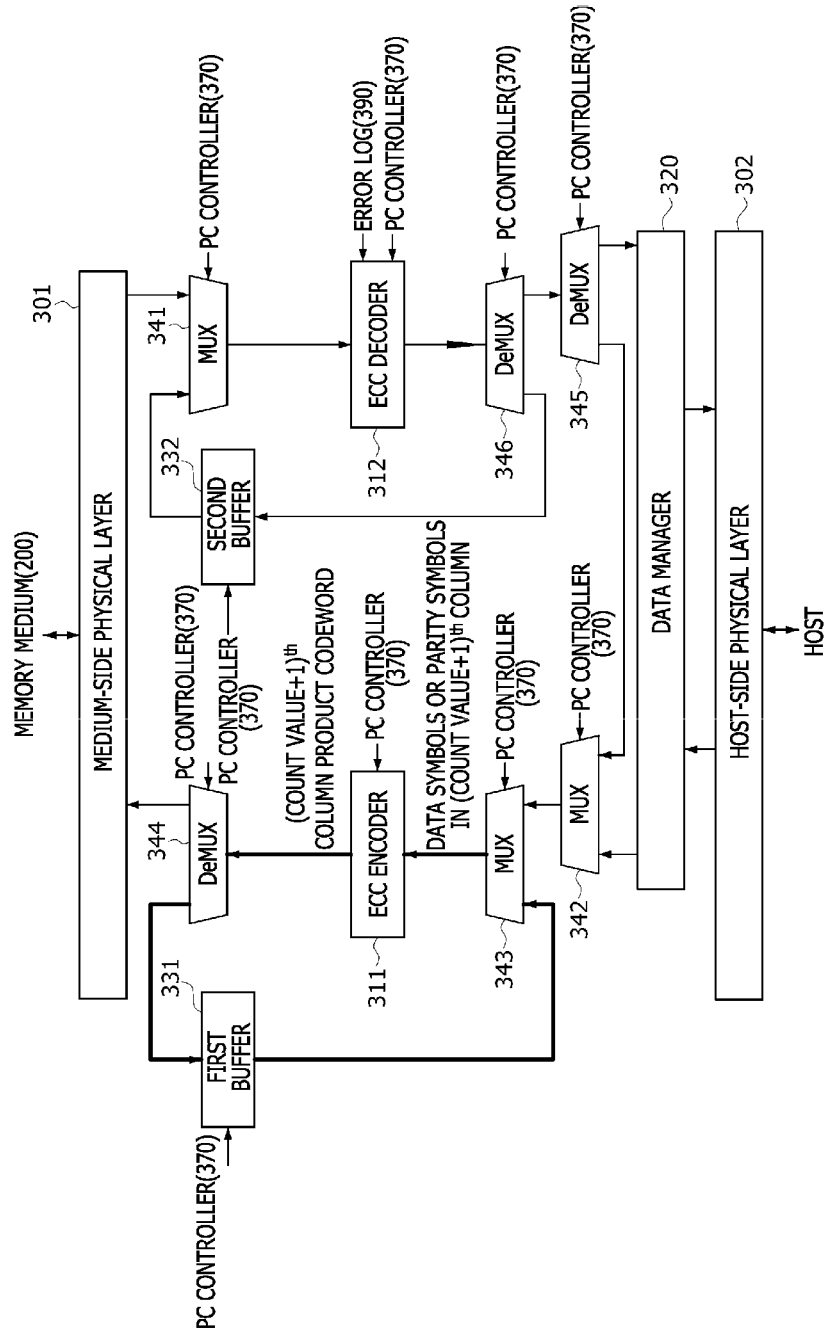
FIG. 54 illustrates exemplary data exchange paths in a memory controller of a memory system while steps 467-2 to 467-6 of FIG. 53 are performed.
Figure 55:
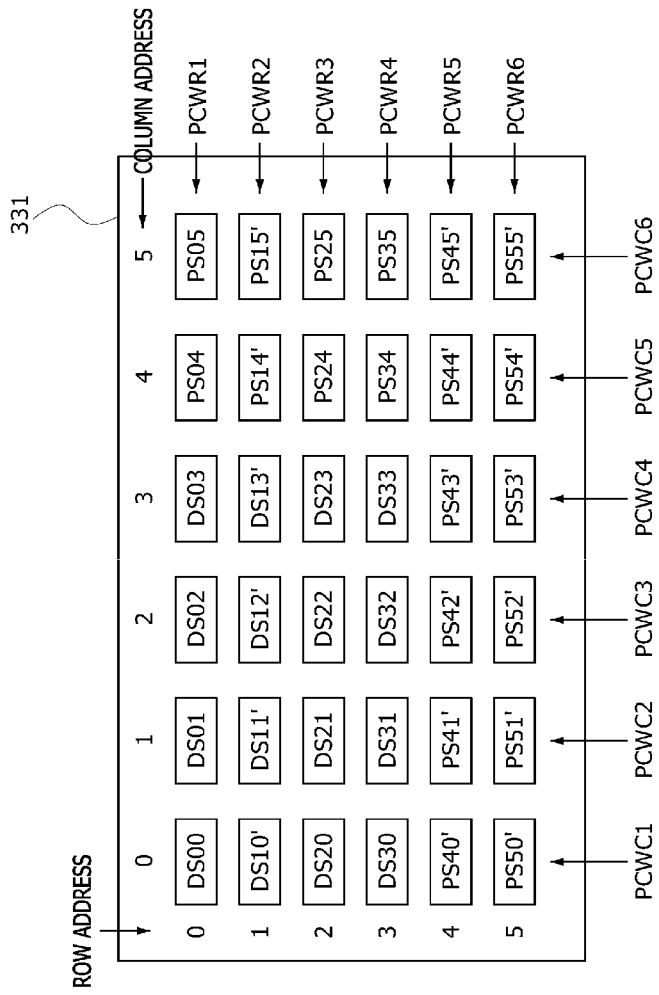
FIG. 55 illustrates an example of data stored in a first buffer included in a memory system.

FIG. 53 is an example of a flowchart illustrating the step 467 of performing the column directional ECC encoding operation during the write operation of FIG. 36. FIG. 54 illustrates data exchange paths in the memory system 100 shown in FIG. 1 while steps 467-2 to 467-6 of FIG. 53 are performed. FIG. 55 illustrates an example of data stored in the first buffer 331 included in the memory system 100 of FIG. 1 after the step 467 of FIG. 36 is performed. In FIG. 54, the data exchange paths are denoted by bold arrows. Referring to FIGS. 53, 54 and 55, if it is determined at the step 466-6 of FIG. 50 that the count value is equal to four corresponding to the number 'M' of the rows, a column directional ECC encoding operation may be performed. In order to perform the column directional ECC encoding operation, the count value may be reset to be zero (see a step 467-1). In this case, a (count value+1)$^{th}$ column becomes the first row. Thus, the memory controller 300 may read the data symbols DS00, DS10', DS20 and DS30 in the first column from the first buffer 331 (see a step 467-2). The memory controller 300 may perform a column directional ECC encoding operation for the data symbols DS00, DS10', DS20 and DS30, which are read out from the first buffer 331, to generate a first column product codeword PCWC1 (see a step 467-3). The first column product codeword PCWC1 may be stored into the first buffer 331 (see a step 467-4). As illustrated in FIG. 54, the data symbols DS00, DS10', DS20 and DS30, which are read out from the buffer 331, may be inputted to the ECC encoder 311 through the third multiplexer 343. The ECC encoder 311 may perform a column directional ECC encoding operation for the data symbols DS00, DS10', DS20 and DS30 to generate and output the first column product codeword PCWC1 including the data symbols DS00, DS10', DS20 and DS30 and parity symbols PS40' and PS50'. The first column product codeword PCWC1 outputted from the ECC encoder 311 may be stored into the first buffer 331 through the first demultiplexer 344.

Next, the count value may be increased by one (see a step 467-5). Therefore, the count value may be changed from zero into one. Subsequently, whether the count value is equal to a number 'N+j' may be determined (see a step 467-6). The number 'N+j' may be defined as the number of columns of data stored in the first buffer 331. The number 'N+j' may be equal to the number of all of the column product codes included in the product code and the number of all of the column product codewords included in the product codeword. In the specific example, the number 'N+j' may be set to be six. Since it is determined at the step 467-6 that the count value (i.e., one) is not equal to six corresponding to the number 'N+j,' the process returns to step 467-2. Thus, the steps 467-2 to 467-6 may be repeated for each of the second column including the data symbols DS01, DS11', DS21 and DS31, the third column including the data symbols DS02, DS12', DS22 and DS32, the fourth column including the data symbols DS03, DS13', DS23 and DS33, the fifth column including the data symbols DS04, DS14', DS24 and DS34, and the sixth column including the data symbols DS05, DS15', DS25 and DS35 until the number 'N+j' is equal to six.

If the steps 467-2 to 467-6 are iteratively performed until the number 'N+j' is equal to six, the first column product codeword PCWC1 including the data symbols DS00, DS10', DS20 and DS30 and the parity symbols PS40' and PS50', a second column product codeword PCWC2 including the data symbols DS01, DS11', DS21 and DS31 and parity symbols PS41' and PS51', a third column product codeword PCWC3 including the data symbols DS02, DS12', DS22 and DS32 and parity symbols PS42' and PS52', a fourth product codeword PCWC4 including the data symbols DS03, DS13', DS23 and DS33 and parity symbols PS43' and PS53', a fifth column product codeword PCWC5 including the data symbols DS04, DS14', DS24 and DS34 and parity symbols PS44' and PS54', and a sixth column product codeword PCWC6 including the data symbols DS05, DS15', DS25 and DS35 and parity symbols PS45' and PS55' may be stored into the first buffer 331, as illustrated in FIG. 55.

Figure 56:
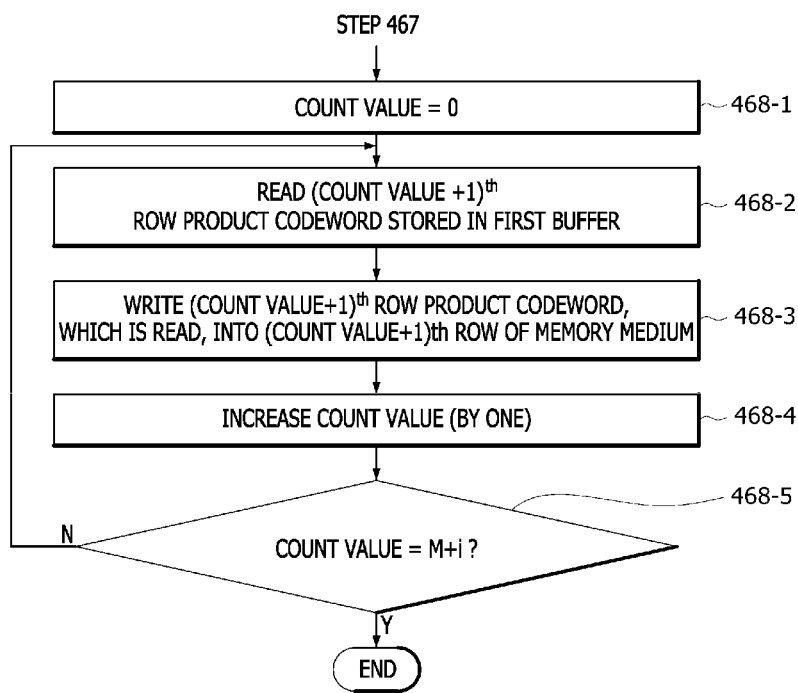
FIG. 56 is an example of a flowchart illustrating a step 468 of FIG. 36.
Figure 57:
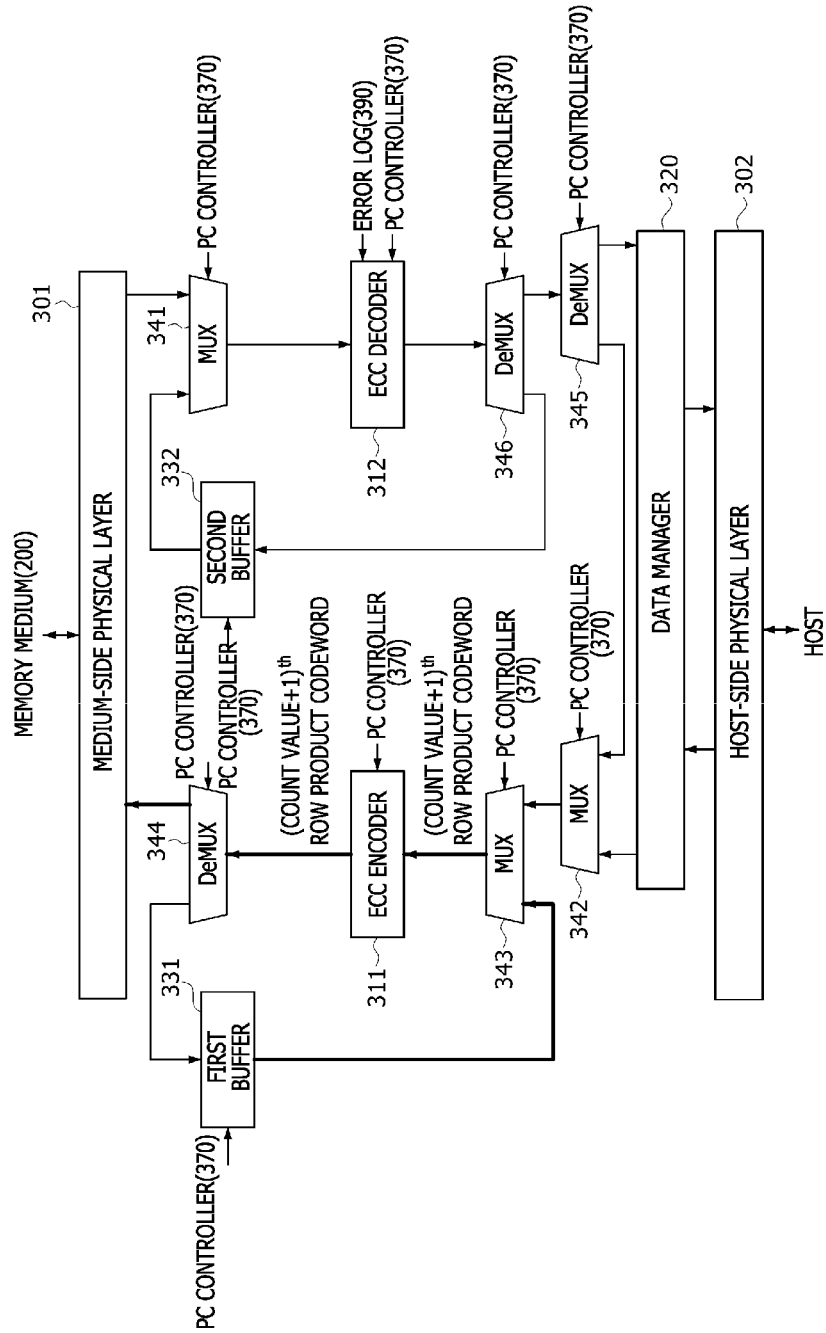
FIG. 57 illustrates exemplary data exchange paths transmitted in a memory controller of a memory system while steps 468-2 to 468-5 of FIG. 56 are performed.
Figure 58:
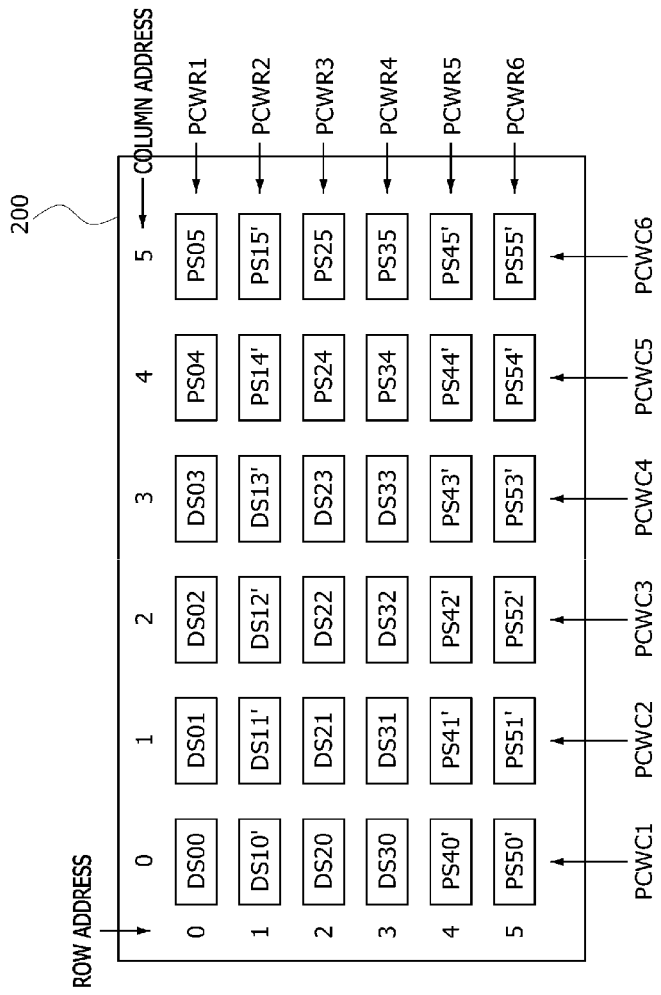
FIG. 58 illustrates an example of data stored in a memory medium included in a memory system after a step 468 of FIG. 36 is performed.

FIG. 56 is an example of a flowchart illustrating the step 468 of writing column directional ECC encoded data symbols and parity symbols into the memory medium 200 during the write operation of FIG. 36. FIG. 57 illustrates data exchange paths in the memory system 100 shown in FIG. 1 while steps 468-2 to 468-5 of FIG. 56 are performed. FIG. 58 illustrates an example of data stored in the memory medium 200 included in the memory system 100 of FIG. 1 after the step 468 of FIG. 36 is performed. In FIG. 57, the data exchange paths are denoted by bold arrows. Referring to FIGS. 56, 57 and 58, if it is determined at the step 467-7 that the count value is equal to six, the write operation may be performed to write data stored in the first buffer 331 into the memory medium 200. In some implementations, after the step 467 of FIG. 36 is performed, the count value may be reset to be zero (see a step 468-1). The memory controller 300 may read the first row product codeword PCWR1 stored in the first buffer 331 (see a step 468-2). Next, the first row product codeword PCWR1, which is read out from the first buffer 331, may be written into a first row of the memory medium 200 (see a step 468-3). As illustrated in FIG. 57, the first row product codeword PCWR1, which is read out from the first buffer 331, may be inputted to the ECC encoder 311 through the third multiplexer 343. The PC controller 370 may apply a control signal for disabling an operation of the ECC encoder 311 and letting the ECC encoder 311 act as a transfer gate for the first row product codeword PCWR1 to the ECC encoder 311. The first row product codeword PCWR1 outputted from the ECC encoder 311 may be written into a storage region corresponding to the first row of the memory medium 200 through the first demultiplexer 344 and the medium-side physical layer 301.

Subsequently, the count value may be increased by one (see a step 468-4). Therefore, the count value may be changed from zero into one. Next, whether the count value is equal to a number 'M+i' may be determined (see a step 468-5). The number 'M' may be defined as the number of the row product codewords including the data symbol, and the number 'i' may be defined as the number of the row product codewords including only the parity symbol without the data symbol. Thus, the number 'M+i' may be defined as the number of all of the row product codewords. In the present embodiment, the number 'M' may be set to be four and the number 'i' may be set to be two. As a result, the number 'M+i' may be set to be six. Since the count value is not equal to six at the step 468-5, the process returns to the step 468-2. Thus, the steps 468-2 to 468-5 may be repeated for the second row product codeword PCWR2. Similarly, the steps 468-2 to 468-5 may be repeated for each of the third to sixth row product codewords PCWR3 to PCWR6. After the steps 468-2 to 468-5 are performed for all of the first to sixth row product codewords PCWR1 to PCWR6 included in the product codeword, the count value may be equal to six. As a result, a product codeword having the same form as the product codeword stored in the first buffer 331 may be stored into the memory medium 200, as illustrated in FIG. 58.

Figure 59:
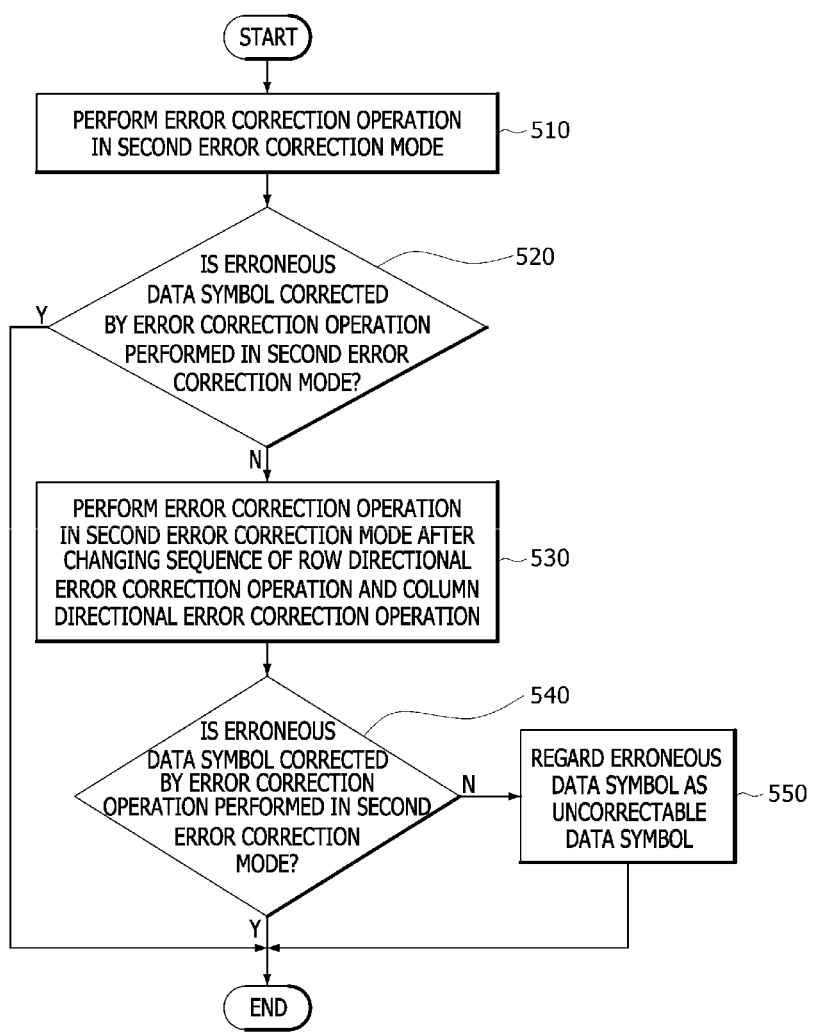
FIG. 59 is an example of a flowchart illustrating another example of an error correction operation performed in a second error correction mode.
Figure 60:
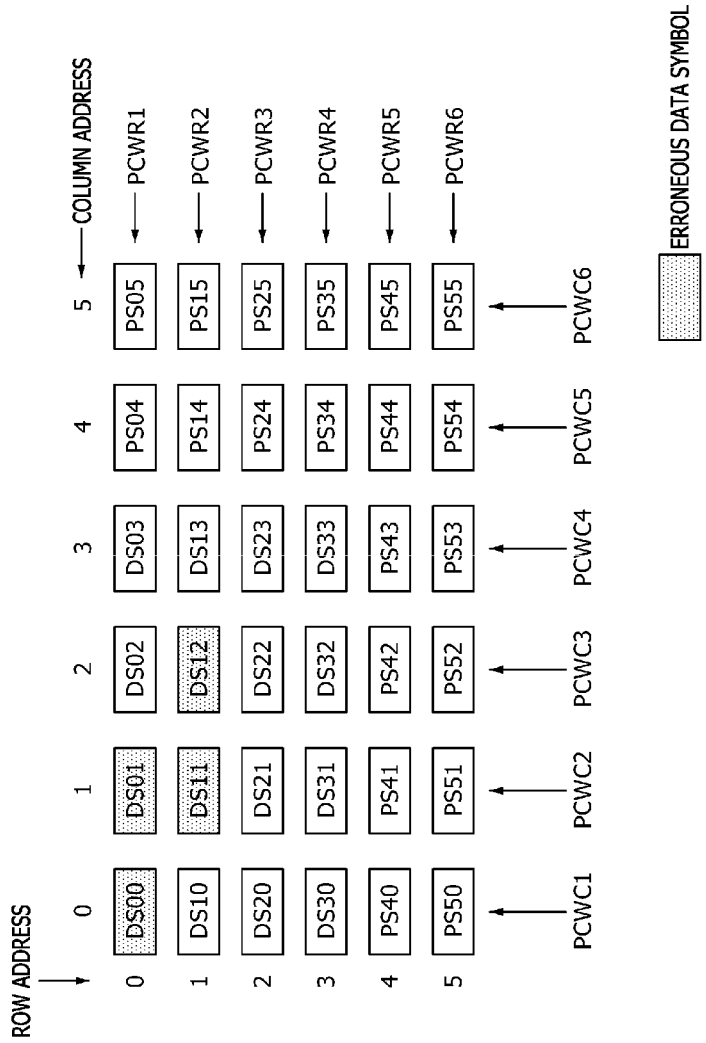
FIGS. 60 to 62 are schematic views illustrating an error correction operation shown in FIG. 59.
Figure 61:
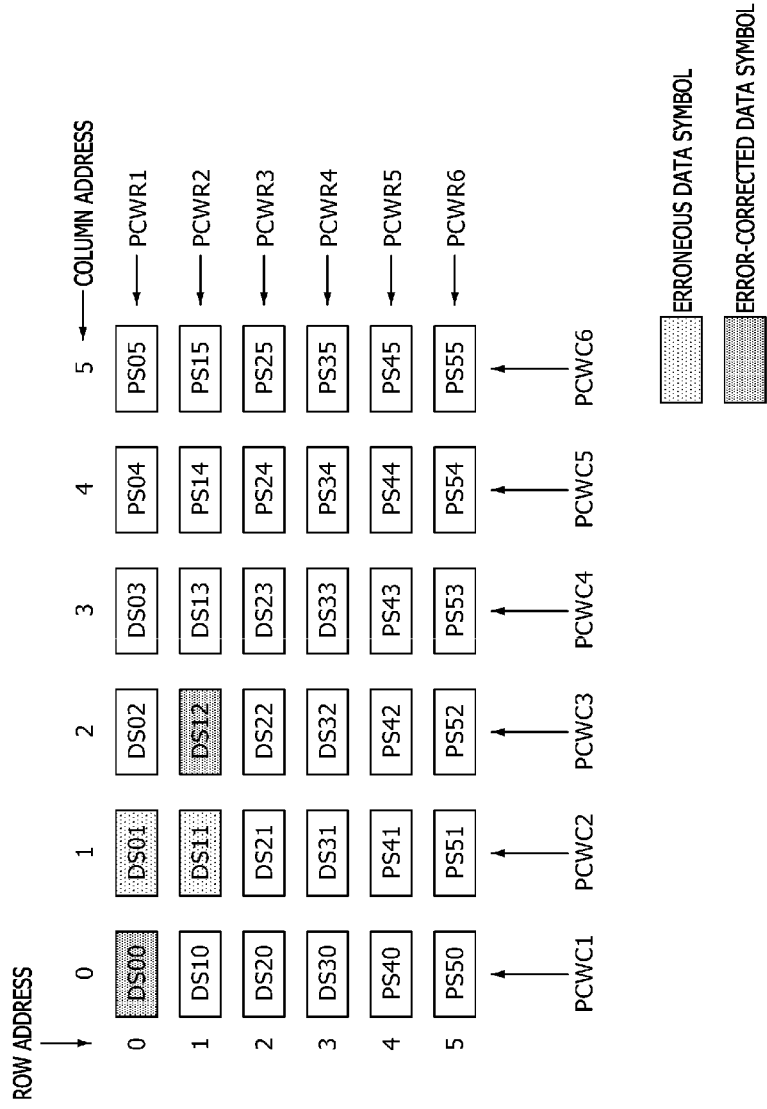
Figure 62:
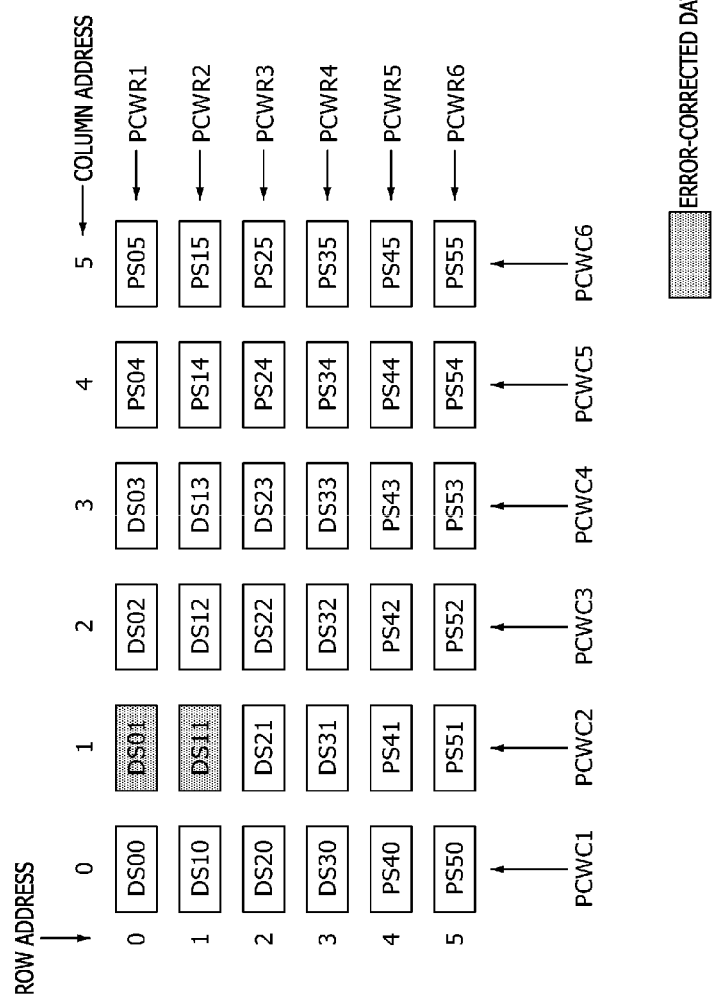

FIG. 59 is an example of a flowchart illustrating another example of an error correction operation performed in the second error correction mode of the memory system 100 shown in FIG. 1. FIGS. 60 to 62 are schematic views illustrating the error correction operation shown in FIG. 59. In the present embodiment, it may be assumed that an error correction capability of the ECC encoder 311 and the ECC decoder 312 is one such that the maximum number of erroneous data symbols which are correctable is one. Referring to FIGS. 59 to 62, the error correction operation may be performed in the second error correction mode (see a step 510). The step 510 corresponds to the step 440 in FIG. 3, which proceeds after the steps 410 to 430. Whether erroneous data symbols are corrected by the error correction operation performed in the second error correction mode may be determined (see a step 520). If it is determined at the step 520 that at least one of the erroneous data symbols is not corrected by the error correction operation performed in the second error correction mode, the error correction operation may be performed in the second error correction mode after changing a sequence of a row directional error correction operation and a column directional error correction operation (see a step 530). FIG. 60 illustrates an example of product codewords when the row directional ECC decoding operation is performed before the column directional ECC decoding operation. As illustrated in FIG. 60, it may be assumed that the first data symbol DS00 and the second data symbol DS01 in the first row product codeword PCWR1 are erroneous data symbols and the second data symbol DS11 and the third data symbol DS12 in the second row product codeword PCWR2 are erroneous data symbols. In such a case, even if a row directional ECC decoding operation for the first row product codeword PCWR1 is performed, the erroneous data symbols, i.e., the first data symbol DS00 and the second data symbol DS01, cannot be corrected since the number of the erroneous data symbols are greater than the error correction capability that is one in this specific example. Similarly, even if a row directional ECC decoding operation for the second row product codeword PCWR2 is performed, the erroneous data symbols, i.e., the second data symbol DS11 and the third data symbol DS12, cannot be corrected. Next, the first data symbol DS00 in the first row product codeword PCWR1 may be corrected by performing a column directional ECC decoding operation for the first column product codeword PCWC1. Similarly, the third data symbol DS12 in the second row product codeword PCWR2 may be corrected by performing a column directional ECC decoding operation for the third column product codeword PCWC3. However, the data symbols DS01 and DS11 in the second column product codeword PCWC2 cannot be still corrected even though a column directional ECC decoding operation for the second column product codeword PCWC2 is performed.

FIG. 61 illustrates an example of product codewords when the column directional ECC decoding operation is performed before the row directional ECC decoding operation. As illustrated in FIG. 61, the column directional ECC decoding operations may be firstly performed, and the row directional ECC decoding operations may then be performed. Thus, a column directional ECC decoding operation for the first column product codeword PCWC1 may be performed. As a result, the erroneous data symbol DS00 may be successfully corrected by the column directional ECC decoding operation for the first column product codeword PCWC1. Next, a column directional ECC decoding operation for the second column product codeword PCWC2 may be performed. In such a case, the erroneous data symbols DS01 and DS11 cannot be corrected by the column directional ECC decoding operation for the second column product codeword PCWC2. Subsequently, a column directional ECC decoding operation for the third column product codeword PCWC3 may be performed. As a result, the erroneous data symbol DS12 may be successfully corrected by the column directional ECC decoding operation for the third column product codeword PCWC3. Thereafter, a column directional ECC decoding operation for the fourth column product codeword PCWC4 may also be performed.

Next, as illustrated in FIG. 62, row directional ECC decoding operations for the first to sixth row product codewords PCWR1 to PCWR6 may be performed. At first, a row directional ECC decoding operation for the first row product codeword PCWR1 may be performed. As a result, the erroneous data symbol DS01 may be successfully corrected by the row directional ECC decoding operation for the first row product codeword PCWR1. Subsequently, a row directional ECC decoding operation for the second row product codeword PCWR2 may be performed. As a result, the erroneous data symbol DS11 may also be successfully corrected by the row directional ECC decoding operation for the second row product codeword PCWR2. Next, the row directional ECC decoding operations for the remaining row product codewords, for example, the third to sixth row product codewords PCWR3 to PCWR6 may be performed. As described above, if the column directional ECC decoding operations are firstly performed and the row directional ECC decoding operations are performed after the column directional ECC decoding operations, all of the erroneous data symbols DS00, DS01, DS11 and DS12 may be successfully corrected. Subsequently, it is determined at a step 540 whether all of the erroneous data symbols are corrected by the error correction operation. If at least one of the erroneous data symbols is not corrected by the error correction operation performed in the second error correction mode at the step 540, the erroneous data symbol may be regarded as an uncorrectable erroneous data symbol and the error correction operation according to the present embodiment may be terminated (see a step 550).

Figure 63:
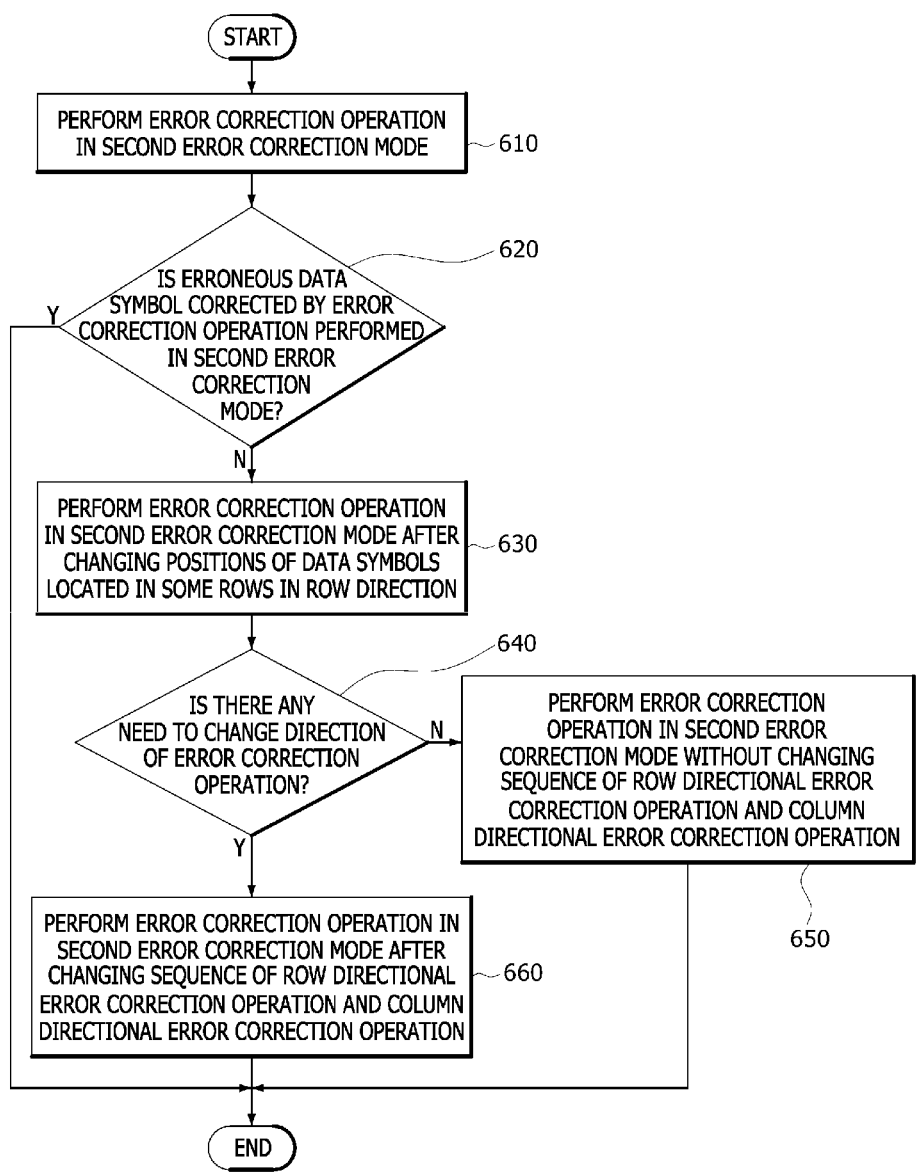
FIG. 63 is a flowchart illustrating another example of an error correction operation performed in a second error correction mode.
Figure 64:
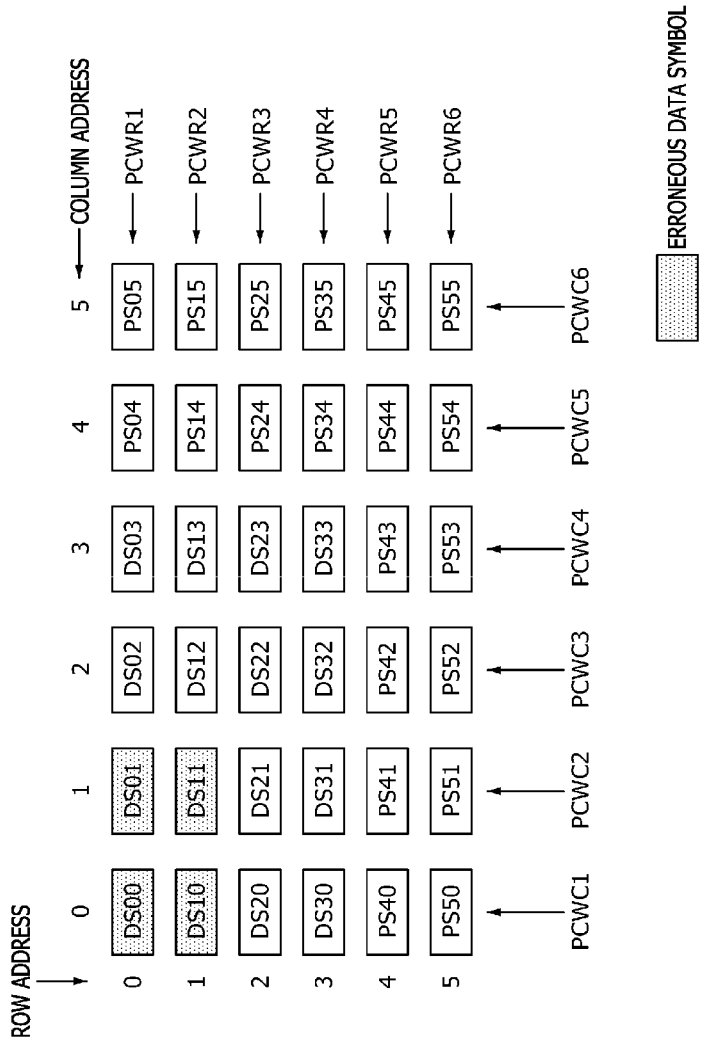
FIGS. 64 and 65 are schematic views illustrating an error correction operation shown in FIG. 63.
Figure 65:
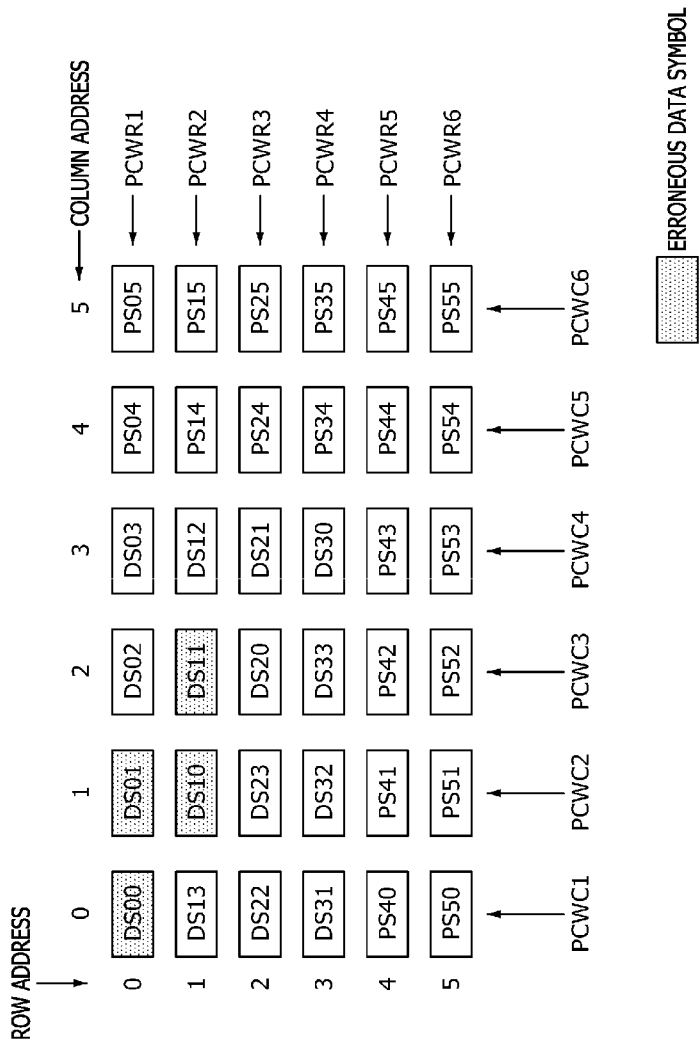

FIG. 63 is a flowchart illustrating another example of an error correction operation performed in the second error correction mode of the memory system 100 shown in FIG. 1. FIGS. 64 and 65 are schematic views illustrating the error correction operation shown in FIG. 63. In the present embodiment, it may be assumed that an error correction capability of the ECC encoder 311 and the ECC decoder 312 is one such that the maximum number of erroneous data symbols which are correctable is one. Referring to FIGS. 63 to 65, the error correction operation may be performed in the second error correction mode (see a step 610). The step 610 corresponds to the step 440 in FIG. 3, which proceeds after the steps 410 to 430. Whether erroneous data symbols are corrected by the error correction operation performed in the second error correction mode may be determined at a step 620. If at least one of the erroneous data symbols is not corrected by the error correction operation performed in the second error correction mode at the step 620, the error correction operation may be performed in the second error correction mode after changing the positions of the data symbols located in some rows (see a step 630). For example, as illustrated in FIG. 64, it may be assumed that the first data symbol DS00 and the second data symbol DS01 in the first row product codeword PCWR1 are erroneous data symbols and the first data symbol DS10 and the second data symbol DS11 in the second row product codeword PCWR2 are erroneous data symbols. In such a case, even if a row directional ECC decoding operation for the first row product codeword PCWR1 is performed, the erroneous data symbols, i.e., the first data symbol DS00 and the second data symbol DS01, cannot be corrected. Similarly, even if a row directional ECC decoding operation for the second row product codeword PCWR2 is performed, the erroneous data symbols, i.e., the first data symbol DS10 and the second data symbol DS11, cannot be corrected. Next, even if a column directional ECC decoding operation for the first column product codeword PCWC1 is performed, the data symbols DS00 and DS10 corresponding to erroneous data symbols cannot be corrected. Similarly, even if a column directional ECC decoding operation for the second column product codeword PCWC2 is performed, the data symbols DS01 and DS11 corresponding to erroneous data symbols cannot be corrected.

For example, as illustrated in FIG. 65, positions of the data symbols in the second to fourth rows may be changed in a row direction. For example, for the second row product codeword PCWR2, the data symbol DS10 located in the first column may be shifted into the second column, the data symbol DS11 located in the second column may be shifted into the third column, the data symbol DS12 located in the third column may be shifted into the fourth column, and the data symbol DS13 located in the fourth column may be moved into the first column. The data symbols DS10 to DS13 change their positions along the row direction such that the row address of the changed positions of the data symbols DS10 to DS13 maintains after the change of the positions. As a result, the erroneous data symbol DS10 may be located at the second row (having a row address of '1') and the second column (having a column address of '1'), and the erroneous data symbol DS11 may be located at the second row (having a row address of '1') and the third column (having a column address of '2').

In case of the third row product codeword PCWR3, the data symbol DS20 located in the first column may be moved into the third column, the data symbol DS21 located in the second column may be moved into the fourth column, the data symbol DS22 located in the third column may be moved into the first column, and the data symbol DS23 located in the fourth column may be moved into the second column. The data symbols DS20 to DS23 change their positions along the row direction such that the row address of the changed positions of the data symbols DS20 to DS23 maintains after the change of the positions. Similarly, for the fourth row product codeword PCWR4, the data symbol DS30 located in the first column may be moved into the fourth column, the data symbol DS31 located in the second column may be moved into the first column, the data symbol DS32 located in the third column may be moved into the second column, and the data symbol DS33 located in the fourth column may be moved into the third column. Thus, the data symbols DS30 to DS33 change their positions along the row direction. After the positions of the data symbols included in the second to fourth row product codewords PCWR2 to PCWR4 are changed, an address mapping operation may be performed such that column addresses of the data symbols, positions of which are changed, are properly mapped.

After the positions of some of the data symbols are changed, it is determined at a step 640 whether an order of performing a row directional ECC decoding operation and a column directional ECC decoding operation needs to be changed. If it is determined at the step 640 that there is no need to change the order of the error correction operation, the row directional ECC decoding operation and the column directional ECC decoding operation may be sequentially performed during the second error correction mode, as described with reference to 1 to 58. If it is determined at the step 640 that there is a need to change the order of the error correction operation, the column directional ECC decoding operation and the row directional ECC decoding operation may be sequentially performed in the second error correction mode, as described with reference to 61 and 62.

The embodiments of the disclosed technology have been disclosed above for illustrative purposes. Those of ordinary skill in the art will appreciate that various modifications, additions, and substitutions are possible. While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A memory system comprising:
   a memory medium configured to include data symbols and parity symbols that are respectively disposed at cross points of a plurality rows and a plurality of column, each of the data symbols and the parity symbols having a column address and a row address; and
   a memory controller configured to communicate with the memory medium and configured to include an error correction code (ECC) engine performing an error correction operation at a fixed error correction level, the error correction operation correcting an erroneous data symbol generated during the communication with the memory medium,
   wherein the memory controller is further configured to generate row product codes and column product codes, each row product code including the data symbol and the parity symbol that have a same row address, and each column product code including the data symbols and the parity symbols that have a same column address, and
   wherein the memory controller is further configured to perform the error correction operation on the row product code and on the column product code to enable the error correction operation at an other error correction level, wherein the number of errors that can be corrected in the other error correction level is greater than the number of errors that can be corrected in the fixed error correction level,
   wherein if a read command for reading the data symbols of an Lth row product codeword is generated (where, 'L' denotes a natural number), the memory controller performs a row directional ECC decoding operation for each of the row product codewords, performs a column directional ECC decoding operation for each of the column product codewords to generate a column directional ECC decoded codewords, performs a row directional ECC decoding operation for the Lth row product codeword in the column directional ECC decoded codewords to generate a row directional ECC decoded codeword, and transmit the row directional ECC decoded codeword for the Lth row product codeword to a host.

2. The memory system of claim 1,
   wherein the plurality of rows includes some rows including data symbols and parity symbols and other rows including only parity symbols without any data symbol, and
   wherein of the plurality of columns includes some columns including data symbols and parity symbols; and other columns including only parity symbols without any data symbol.

3. The memory system of claim 1,
   wherein the memory controller performs the error correction operation in the fixed error correction mode if the number of erroneous data symbols is less than a predetermined value; and
   wherein the memory controller performs the error correction operation at the higher error correction level if the number of erroneous data symbols is equal to or greater than the predetermined value.

4. The memory system of claim 3, wherein the predetermined value is set to be equal to or less than an error correction capability which is defined by the number of errors that can be corrected in the fixed error correction level.

5. The memory system of claim 1, wherein the ECC engine includes:
   an ECC encoder configured to perform, during a write operation, an ECC encoding operation for write data symbols to be written and output a codeword including the write data symbols and the parity symbols; and
   an ECC decoder configured to perform, during a read operation, an ECC decoding operation for the codeword and output read data symbols.

6. The memory system of claim 5, wherein the ECC decoder is structured to correct an error included in the codeword to output the read data symbols and the number of the data symbols correctable during the ECC decoding operation is determined by the fixed error correction level.

7. The memory system of claim 1,
   wherein the memory controller performs the error correction operation at the fixed error correction to generate codewords, each codeword including at least one of the data symbols and the parity symbols that are arranged in a same row.

8. The memory system of claim 1,
   wherein the number of row product codes and the number of column product codes that are generated by the memory controller are 'M+i' and 'N+j,' respectively (where, 'M', 'N', 'i' and 'j' denote natural numbers);
   wherein 'M' is the number of row product codes including data symbols and parity symbols that share one row address;
   wherein 'i' is the number of row product codes including parity symbols that share one row address;
   wherein 'N' is the number of column product codes including data symbols and parity symbols that share one column address; and
   wherein 'j' is the number of column product codes including parity symbols that share one column address.

9. The memory system of claim 8, wherein the memory controller performs a row directional ECC decoding operation and a row directional ECC encoding operation for each of the row product codes to generate row product codewords.

10. The memory system of claim 9, wherein the memory controller performs a column directional ECC encoding operation for the data symbols in each of the columns including any data symbol and the parity symbols in each of the columns without any data symbol to generate column product codewords and an additional row product codeword.

11. The memory system of claim 10, wherein the memory controller stores the additional row product codewords and the column product codewords in the memory medium.

12. The memory system of claim 11, wherein the memory controller stores row product codewords in the memory medium.

13. The memory system of claim 10, wherein the memory controller sequentially performs the row directional error correction operation and the column directional error correction operations.

14. The memory system of claim 1, wherein the memory controller performs the error correction operation on the row product code after changing a column address of a particular data symbol.

15. The memory system of claim 1,
wherein if a write command for storing write data symbols in an $L^{th}$ row product codeword is generated (where, 'L' denotes a natural number), the memory controller performs a first row directional ECC decoding operation for each of the row product codewords, performs a column directional ECC decoding operation for each of the column product codewords, performs a second row directional ECC decoding operation for each of the row product codewords, combines data symbols in an $L^{th}$ row of the second row directional ECC decoded data symbols with the write data symbols.

16. The memory system of claim 1, wherein the memory controller includes:
a data manager configured to temporarily store read data and write data while the memory controller accesses to the memory medium;
an ECC encoder configured to perform, during a write operation, an ECC encoding operation for write data symbols to be written and output a codeword including the write data symbols and parity symbols;
an ECC decoder configured to perform, during a read operation, an ECC decoding operation for the codeword and output read data symbols;
an error log configured to receive and store error information;
a microcontroller in communication with the error log and configured to analyze the error information stored in the error log to determine to perform the error correction operation at an error correction level between the fixed error correction level and at the other error correction level; and
a product code controller in communication with the microcontroller and configured to generate control signals for the error correction operation performed at the other error correction level;
a first buffer configured to store data outputted from the ECC encoder in the second error correction mode; and
a second buffer configured to store data outputted from the ECC decoder in the second error correction mode.

17. The memory system of claim 16, wherein
each of the first buffer and the second buffer is configured to be accessible to data in both of a row direction and a column direction.

18. The memory system of claim 16, further comprising:
a first multiplexer configured to transmit data outputted from the memory medium or data outputted from the second buffer to the ECC decoder in response to any one of the control signals generated by the product code controller;
a first demultiplexer configured to transmit data outputted from the ECC encoder to the first buffer or the memory medium in response to any one of the control signals generated by the product code controller;
a second demultiplexer configured to transmit data outputted from the ECC decoder to the second buffer through a first output line or to output the data outputted from the ECC decoder through a second output line, in response to any one of the control signals generated by the product code controller;
a third demultiplexer configured to transmit data outputted through the second output line of the second demultiplexer to the data manager through a first output line or to output the data outputted through the second output line of the second demultiplexer through a second output line, in response to any one of the control signals generated by the product code controller;
a second multiplexer configured to output data outputted through the second output line of the third demultiplexer or data outputted from the data manager, in response to any one of the control signals generated by the product code controller; and
a third multiplexer configured to transmit data outputted from the second multiplexer or data outputted to the first buffer to the ECC encoder, in response to any one of the control signals generated by the product code controller.

19. The memory system of claim 17,
wherein the ECC encoder is configured to output data inputted to the ECC encoder without executing the ECC encoding operation in response to an encoding disable control signal corresponding to one of the control signals outputted from the product code controller; and
wherein the ECC decoder is configured to output data inputted to the ECC decoder without executing the ECC decoding operation in response to a decoding disable control signal corresponding to another one of the control signals outputted from the product code controller.

20. A memory system comprising:
a memory medium configured to include data symbols and parity symbols, each of the data symbols and the parity symbols having a row address and a column address; and
a memory controller configured to include an error correction code (ECC) engine that is designed to execute an error correction operation at a fixed error correction level in a first error correction mode while the memory controller accesses the memory medium,
wherein if the number of errors in the data symbols is greater than an error correction capability by the error correction operation performed in the first error correction mode, the memory controller changes the first error correction mode into a second error correction mode to generate a product codeword, the product codeword including 'M+i'-number of row product codewords and 'N+j'-number of column product codewords and to perform the error correction operation for the product codeword using the ECC engine (where, 'M', 'N', 'i' and 'j' denote natural numbers),
wherein each of the 'M'-number of row product codewords includes data symbols and parity symbols that share one row address, each of the 'i'-number of row product codewords includes parity symbols that share one row address, each of the 'N'-number of column product codewords includes data symbols and parity symbols that share one column address, and each of the 'j'-number of column product codewords includes parity symbols that share one column address, and wherein if a write command for storing write data symbols in an Lth row product codeword is generated (where, 'L' denotes a natural number), the memory controller performs a first row directional ECC decoding operation for each of the 'M'-number of row product codewords, performs a column directional ECC decoding operation for each of the 'N'-number of column product codewords, performs a second row directional ECC decoding operation for each of the 'M'-number of row product codewords, combines data symbols in an Lth row of the second row directional ECC decoded data symbols with the write data symbols.

21. The memory system of claim 20, wherein the memory controller performs a row directional ECC encoding operation for each of row product codes including at least of one data symbol to generate the 'M'-number of row product codewords;

wherein the memory controller performs a column directional ECC encoding operation for each of the 'N+j'-number of column product codes to generate the 'N+j'-number of column product codewords; and wherein the memory controller writes the product codeword including the row product codewords and the column product codewords into the memory medium.

22. The memory system of claim 20, wherein if a write command for storing write data symbols in an $L^{th}$ row product codeword is generated (where, 'L' denotes a natural number which is equal to or less than the natural number 'M'), the memory controller performs a first row directional ECC decoding operation for each of the 'M'-number of row product codewords, performs a column directional ECC decoding operation for each of the 'N+j'-number of column product codewords, performs a second row directional ECC decoding operation for each of the 'M'-number of row product codewords, and replaces data symbols in an $L^{th}$ row of the second row directional ECC decoded data symbols with the write data symbols.

* * * * *